US011978726B2

(12) United States Patent
Yamakawa et al.

(10) Patent No.: US 11,978,726 B2
(45) Date of Patent: May 7, 2024

(54) WHITE LIGHT SOURCE SYSTEM

(71) Applicant: SEOUL SEMICONDUCTOR CO., LTD., Ansan-si (KR)

(72) Inventors: Masahiko Yamakawa, Yokohama (JP); Noriaki Yagi, Yokohama (JP); Kumpei Kobayashi, Yokohama (JP)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 18/215,841

(22) Filed: Jun. 29, 2023

(65) Prior Publication Data
US 2023/0343758 A1    Oct. 26, 2023

Related U.S. Application Data

(63) Continuation of application No. 17/897,230, filed on Aug. 29, 2022, now Pat. No. 11,721,675, which is a
(Continued)

(51) Int. Cl.
*H01L 33/50* (2010.01)
*F21S 2/00* (2016.01)
(Continued)

(52) U.S. Cl.
CPC ............ *H01L 25/0753* (2013.01); *F21S 2/00* (2013.01); *H01L 33/00* (2013.01); *H01L 33/50* (2013.01);
(Continued)

(58) Field of Classification Search
CPC ..... H01L 25/0753; H01L 33/00; H01L 33/50; H01L 33/504; H01L 33/507; H01L 33/54;
(Continued)

(56) References Cited

U.S. PATENT DOCUMENTS 8,104,908 B2    1/2012  Harbers et al.
9,109,762 B2    8/2015  Yamakawa et al.
(Continued)

FOREIGN PATENT DOCUMENTS

EP    1 160 883 A2    12/2001
EP    1630220          3/2006
(Continued)

OTHER PUBLICATIONS

International Search Report and Written Opinion (Application No. PCT/JP2016/068714) dated Aug. 30, 2016.
(Continued)

*Primary Examiner* — Minh D A
(74) *Attorney, Agent, or Firm* — Oblon, McClelland, Maier & Neustadt, L.L.P.

(57) ABSTRACT

A light emitting device including a substrate, a first light emitter to emit light having a first color temperature, and a second light emitter to emit light having a second color temperature, in which the first light emitter has a first converter including first phosphors and a first resin, each first phosphor having different half-value widths, the second light emitter has a second converter including second phosphors and a second resin, each second phosphor having different peak wavelengths, at least one phosphor of the first converter has a half-value width of 33 nm to 110 nm, a distance between peak wavelengths of at least two phosphors of the second converter is 150 nm or less, and at least one phosphor of the first converter has a particle size of 5 um to 50 um.

20 Claims, 22 Drawing Sheets

Related U.S. Application Data continuation of application No. 17/234,035, filed on Apr. 19, 2021, now Pat. No. 11,430,771, which is a continuation of application No. 16/853,847, filed on Apr. 21, 2020, now Pat. No. 11,094,679, which is a continuation of application No. 16/444,243, filed on Jun. 18, 2019, now Pat. No. 10,674,577, which is a continuation of application No. 16/251,468, filed on Jan. 18, 2019, now Pat. No. 10,375,786, which is a continuation of application No. 15/850,399, filed on Dec. 21, 2017, now Pat. No. 10,231,305.

(51) Int. Cl.
| | | |
|---|---|---|
| *H01L 25/075* | (2006.01) | |
| *H01L 33/00* | (2010.01) | |
| *H01L 33/54* | (2010.01) | |
| *H01L 33/56* | (2010.01) | |
| *H05B 45/20* | (2020.01) | |
| *H05B 47/10* | (2020.01) | |
| *H05B 47/16* | (2020.01) | |
| *F21W 131/405* | (2006.01) | |
| *F21Y 113/13* | (2016.01) | |
| *F21Y 115/10* | (2016.01) | |

(52) U.S. Cl.
CPC .......... *H01L 33/504* (2013.01); *H01L 33/507* (2013.01); *H01L 33/54* (2013.01); *H01L 33/56* (2013.01); *H05B 45/20* (2020.01); *H05B 47/10* (2020.01); *H05B 47/16* (2020.01); *F21W 2131/405* (2013.01); *F21Y 2113/13* (2016.08); *F21Y 2115/10* (2016.08)

(58) Field of Classification Search
CPC ..... H01L 33/56; H01L 27/156; H01L 33/505; F21S 2/00; H05B 45/20; H05B 47/10; H05B 47/16; H05B 45/10; F21W 2131/405; F21Y 2113/13; F21Y 2115/10; Y02B 20/00; Y02B 20/40
IPC ....................... H01L 33/50; H05B 45/20,47/10
See application file for complete search history.

(56) References Cited

U.S. PATENT DOCUMENTS

| | | | |
|---|---|---|---|
| 9,551,467 B2 | 1/2017 | Yamakawa et al. | |
| 9,605,815 B2 | 3/2017 | Yamakawa et al. | |
| 10,231,305 B2 | 3/2019 | Yamakawa et al. | |
| 10,375,786 B2 | 8/2019 | Yamakawa et al. | |
| 10,674,577 B2 | 6/2020 | Yamakawa et al. | |
| 11,094,679 B2 | 8/2021 | Yamakawa et al. | |
| 11,721,675 B2 * | 8/2023 | Yamakawa ........... H01L 33/504 315/294 |
| 2007/0052342 A1 | 3/2007 | Masuda et al. | |
| 2008/0309255 A1 | 12/2008 | Myers et al. | |
| 2009/0160363 A1 | 6/2009 | Negley et al. | |
| 2009/0207583 A1 | 8/2009 | Takano et al. | |
| 2009/0251057 A1 | 10/2009 | Son et al. | |
| 2009/0296384 A1 | 12/2009 | Van De Ven et al. | |
| 2010/0070064 A1 | 3/2010 | Tseng et al. | |
| 2010/0295464 A1 | 11/2010 | Kasukura et al. | |
| 2011/0031894 A1 | 2/2011 | Van De Den et al. | |
| 2011/0216522 A1 | 9/2011 | Harbers et al. | |
| 2011/0222277 A1 | 9/2011 | Negley et al. | |
| 2012/0001555 A1 | 1/2012 | Tu et al. | |
| 2012/0141771 A1 * | 6/2012 | Pan ..................... C04B 35/6268 428/312.8 |
| 2012/0326627 A1 * | 12/2012 | McDaniel, Jr. ........ H05B 45/20 315/294 |
| 2013/0240915 A1 | 9/2013 | Nakagawa et al. | |
| 2013/0257266 A1 | 10/2013 | Ishizaki et al. | |
| 2013/0271029 A1 | 10/2013 | Liao et al. | |
| 2013/0307419 A1 | 11/2013 | Simonian et al. | |
| 2014/0036499 A1 | 2/2014 | Yamakawa et al. | |
| 2014/0284636 A1 | 9/2014 | Yamakawa et al. | |
| 2014/0293577 A1 | 10/2014 | Yamakawa et al. | |
| 2014/0307417 A1 | 10/2014 | Yamakawa et al. | |
| 2015/0380460 A1 | 12/2015 | Horie et al. | |

FOREIGN PATENT DOCUMENTS

| | | |
|---|---|---|
| EP | 2211083 | 7/2010 |
| EP | 2 432 037 A1 | 3/2012 |
| EP | 2672532 | 12/2013 |
| EP | 2772952 | 9/2014 |
| EP | 3 214 359 A1 | 9/2017 |
| EP | 3214659 | 9/2017 |
| JP | 2005093985 | 4/2005 |
| JP | 2009123429 | 6/2009 |
| JP | 2009-540599 | 11/2009 |
| JP | 2009260319 | 11/2009 |
| JP | 2011023339 | 2/2011 |
| JP | 2011529621 | 12/2011 |
| JP | 2012113959 | 6/2012 |
| JP | 2012-195420 | 10/2012 |
| JP | 2013-521617 | 6/2013 |
| JP | 2014-134771 | 7/2014 |
| JP | 2014170843 | 9/2014 |
| JP | 2015133455 | 7/2015 |
| WO | 2010013893 | 2/2010 |
| WO | 201111134 | 9/2011 |
| WO | 2011109150 | 9/2011 |
| WO | WO 2011/111334 A1 | 9/2011 |
| WO | 2012077448 | 6/2012 |
| WO | 2012144087 | 10/2012 |
| WO | 2013061942 | 5/2013 |
| WO | 2013061943 | 5/2013 |
| WO | 2013069435 | 5/2013 |
| WO | 2014136748 | 9/2014 |
| WO | 2015066099 | 5/2015 |

OTHER PUBLICATIONS

Partial Supplementary European Search Report (Application No. 16814452.5) dated Feb. 6, 2019.
European Office Action (Application No. 16841152.5) dated May 29, 2020.
Japanese Office Action (Application No. 2019-234487) dated Nov. 17, 2020.
Non-Final Office Action dated Oct. 25, 2021, issued to U.S. Appl. No. 17/234,035.
Notice of Allowance dated Apr. 25, 2022, issued to U.S. Appl. No. 17/234,035.
Notice of Allowance dated Jun. 16, 2022, issued to U.S. Appl. No. 17/234,035.
Notice of Allowance dated Mar. 27, 2023, in U.S. Appl. No. 17/897,230.
European Search Report dated Jul. 23, 2020 in European Application 20166868, 2 pages.

* cited by examiner

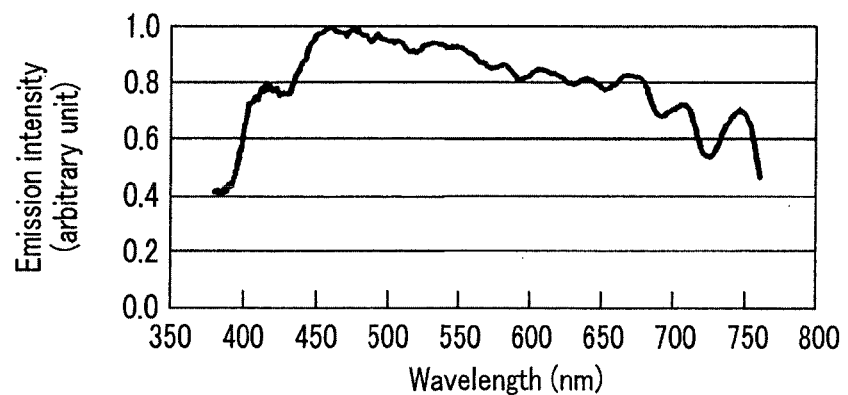
F I G. 1
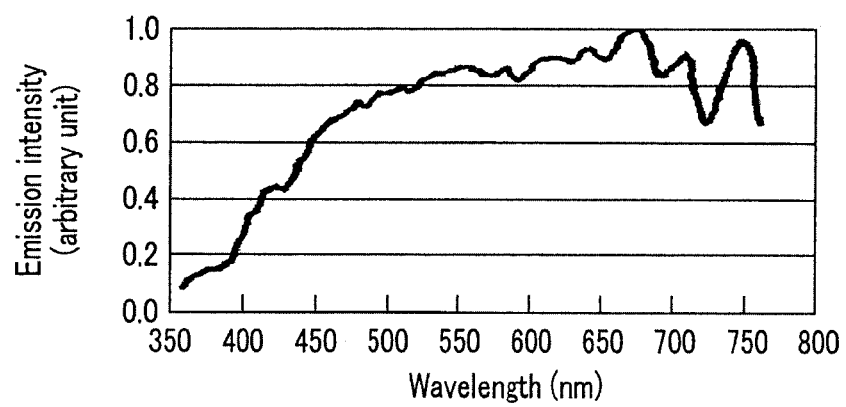
F I G. 2

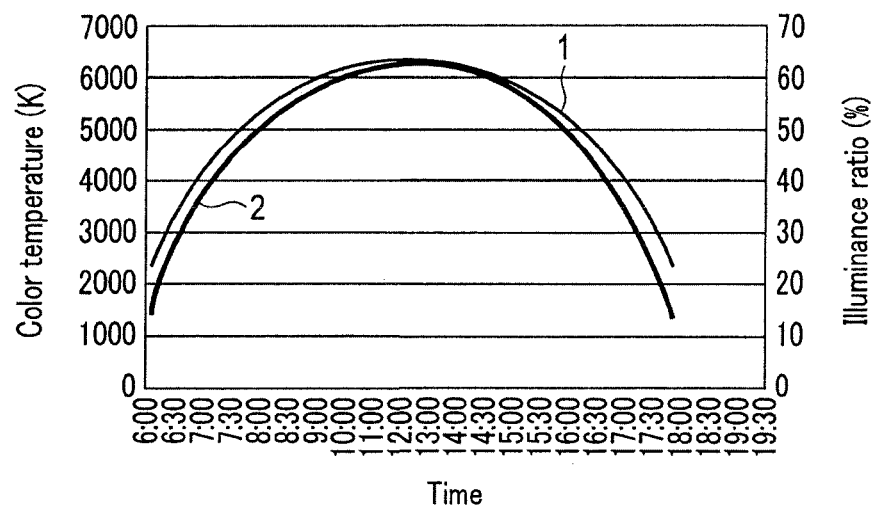
F I G. 4
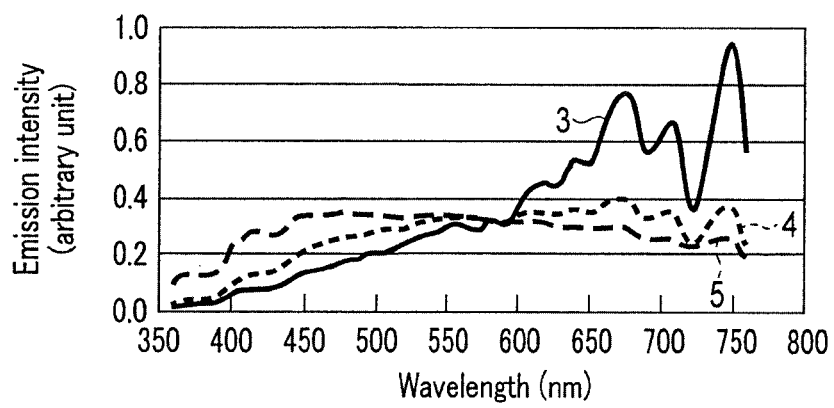
F I G. 5

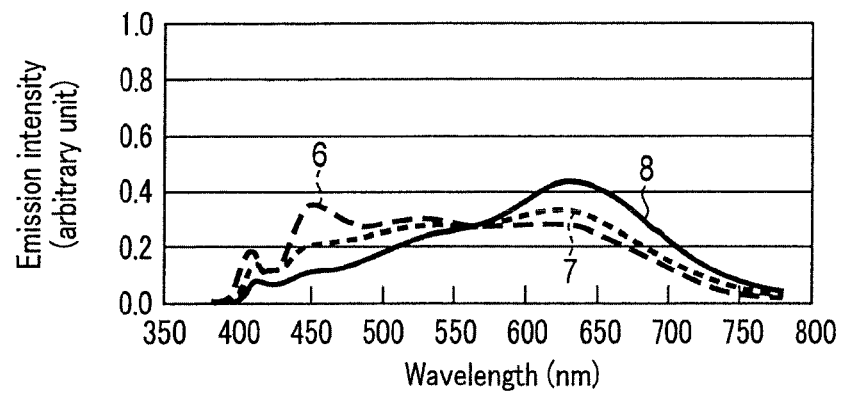
F I G. 6
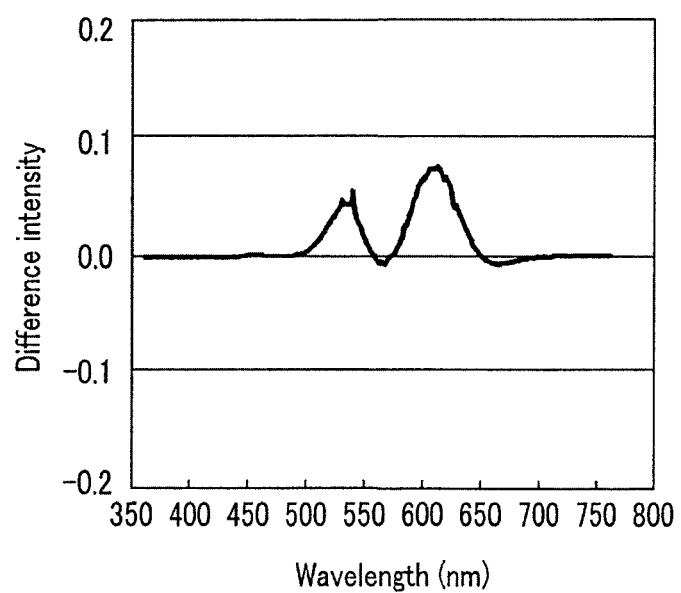
F I G. 7

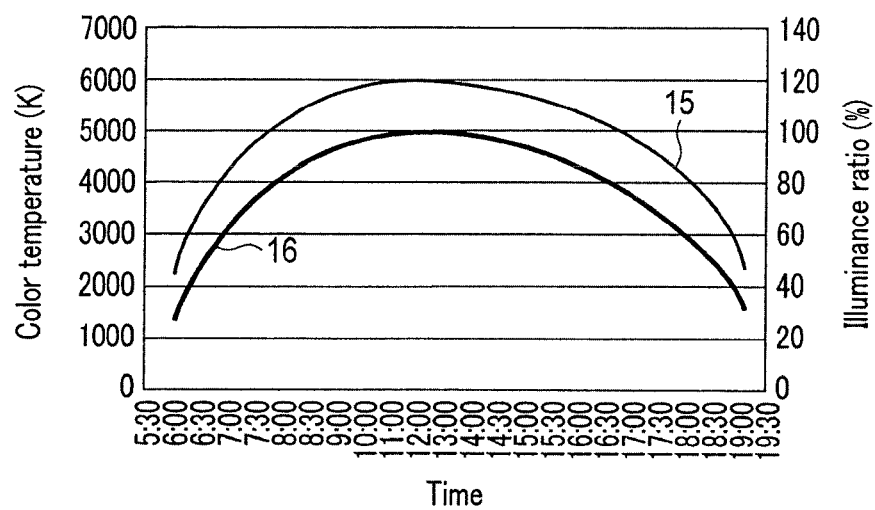
F I G. 13
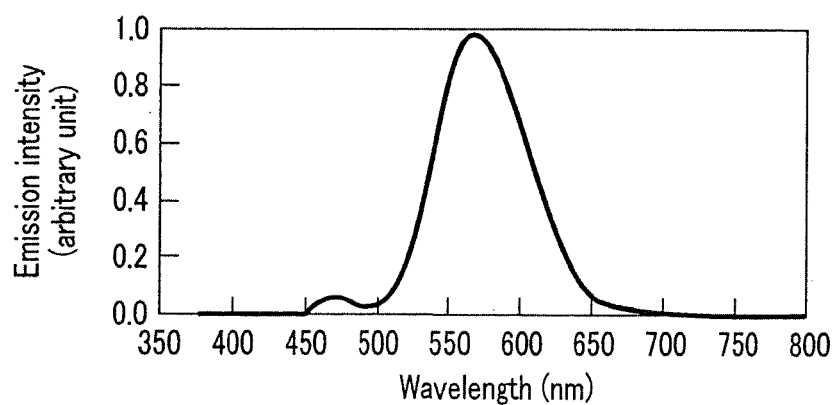
F I G. 14

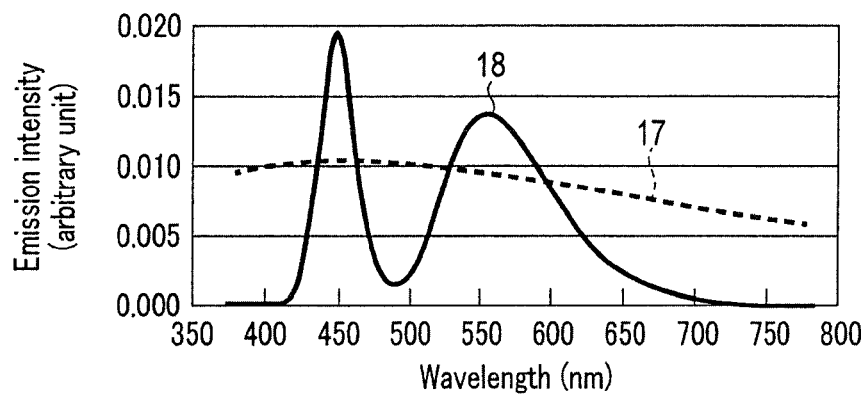
F I G. 17
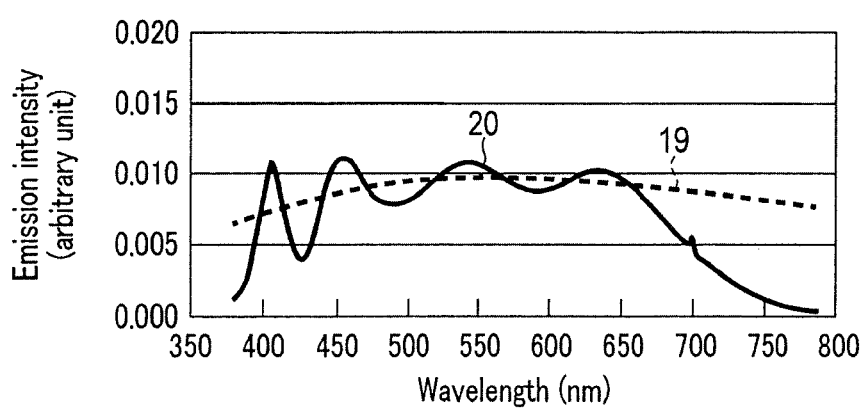
F I G. 18

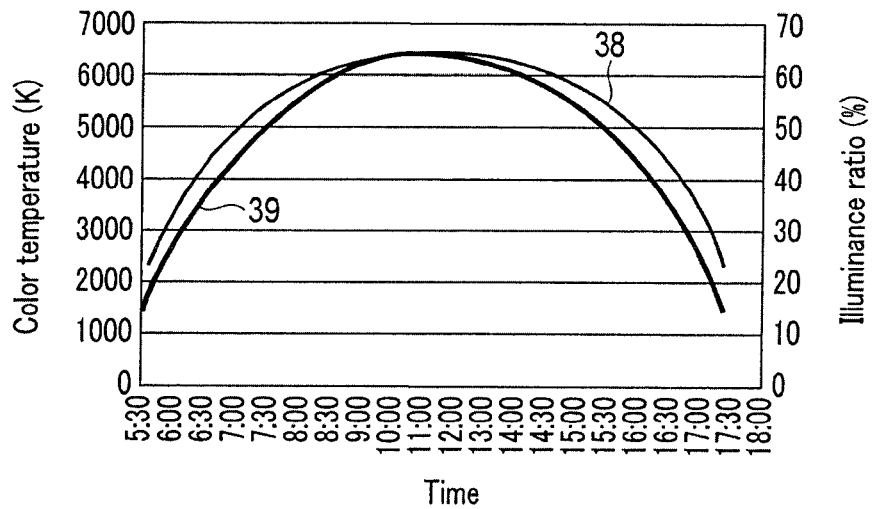
F I G. 22
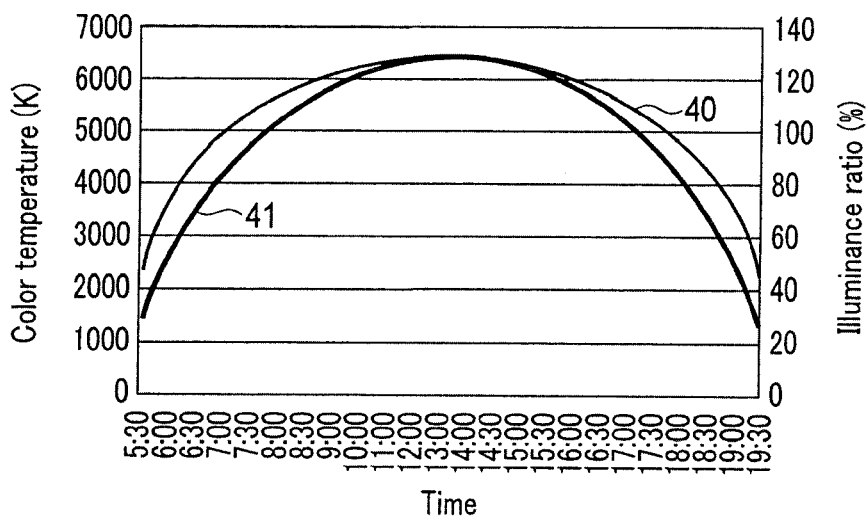
F I G. 23

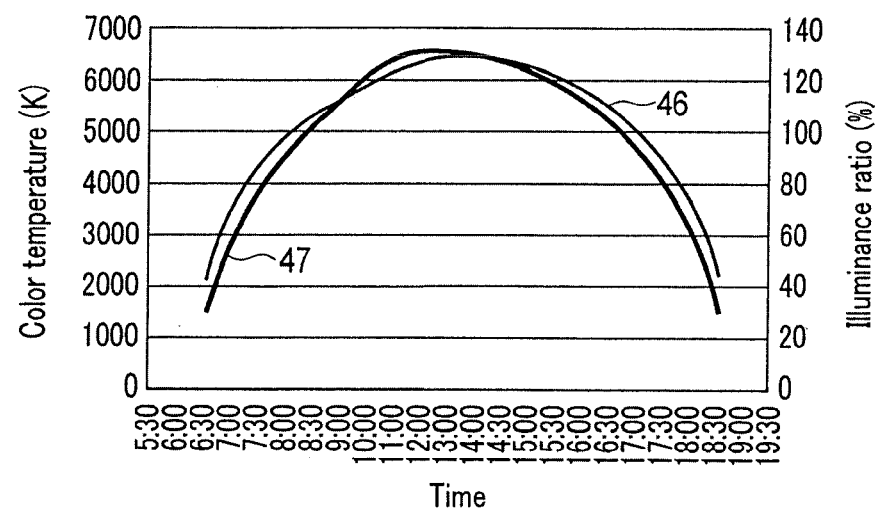
F I G. 26

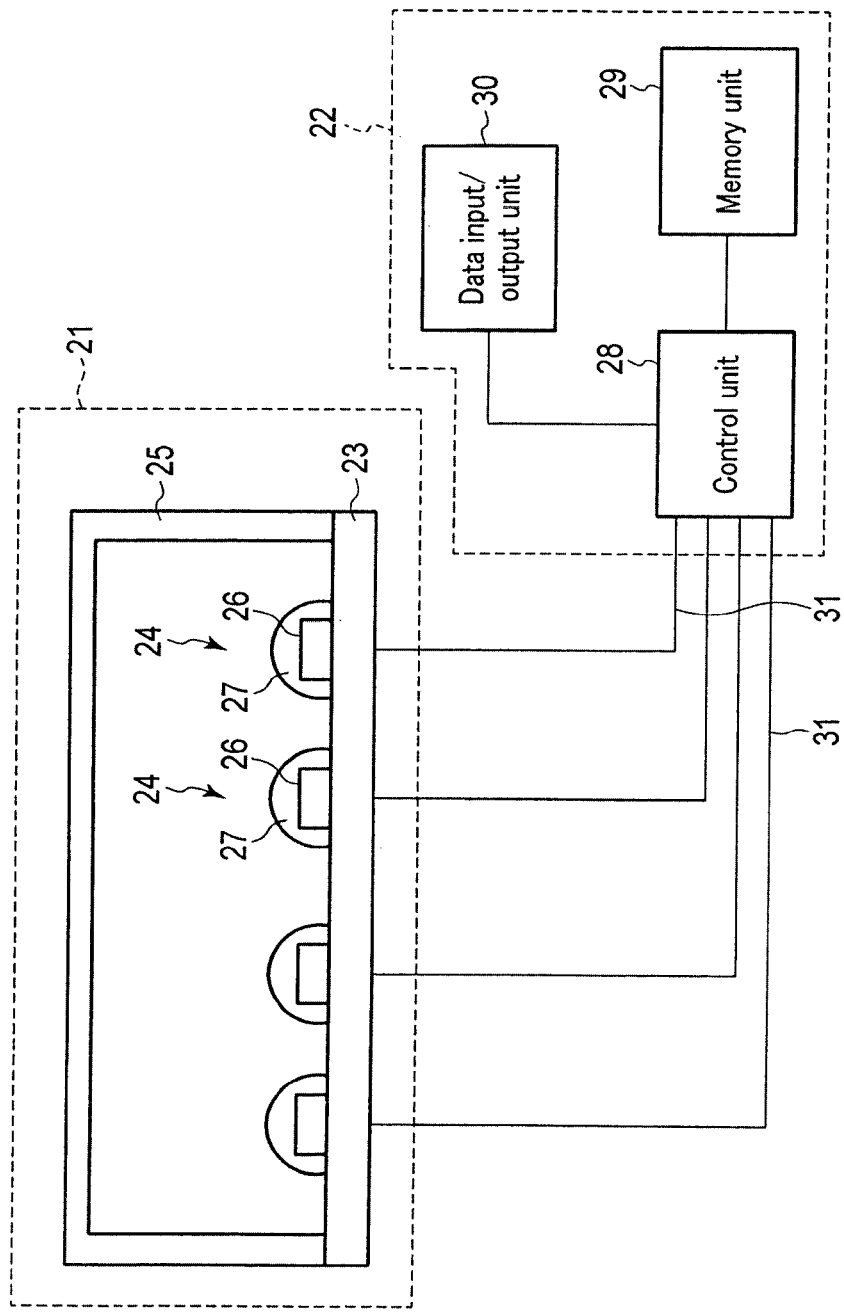
F I G. 27

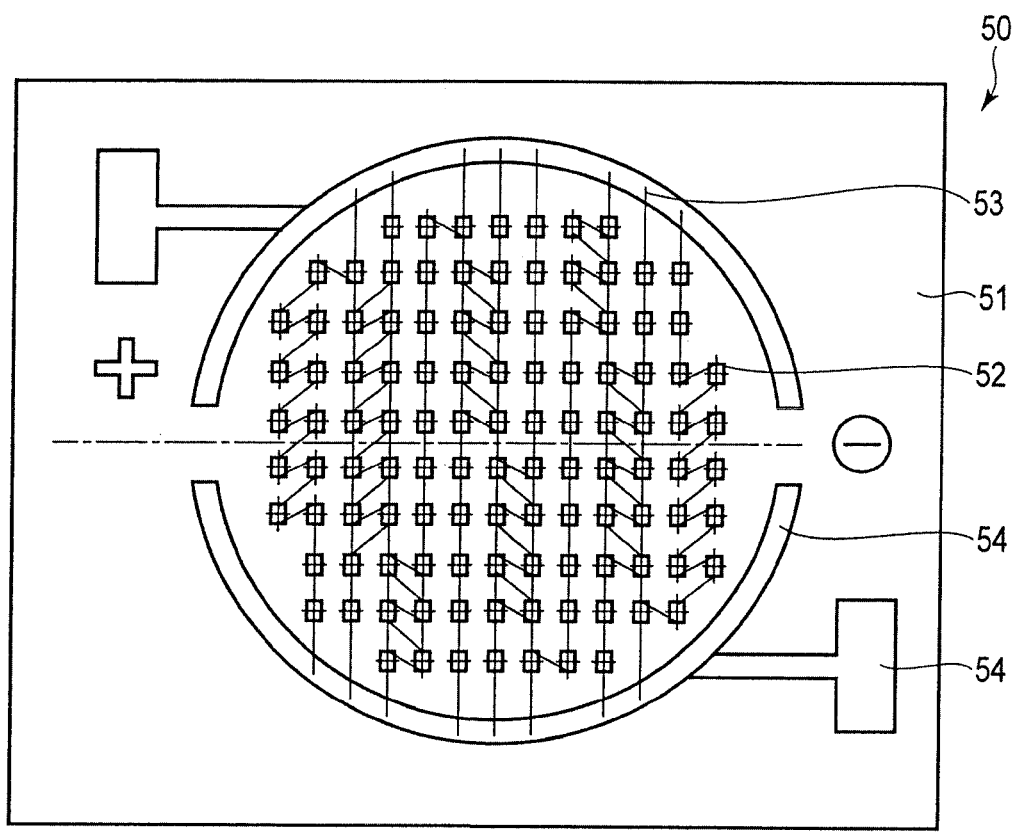
F I G. 28
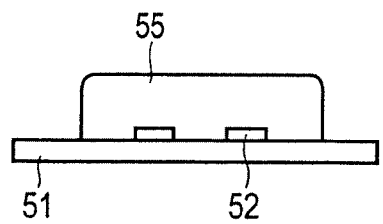
F I G. 29
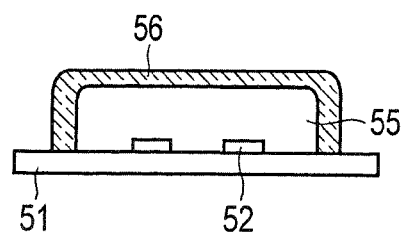
F I G. 30

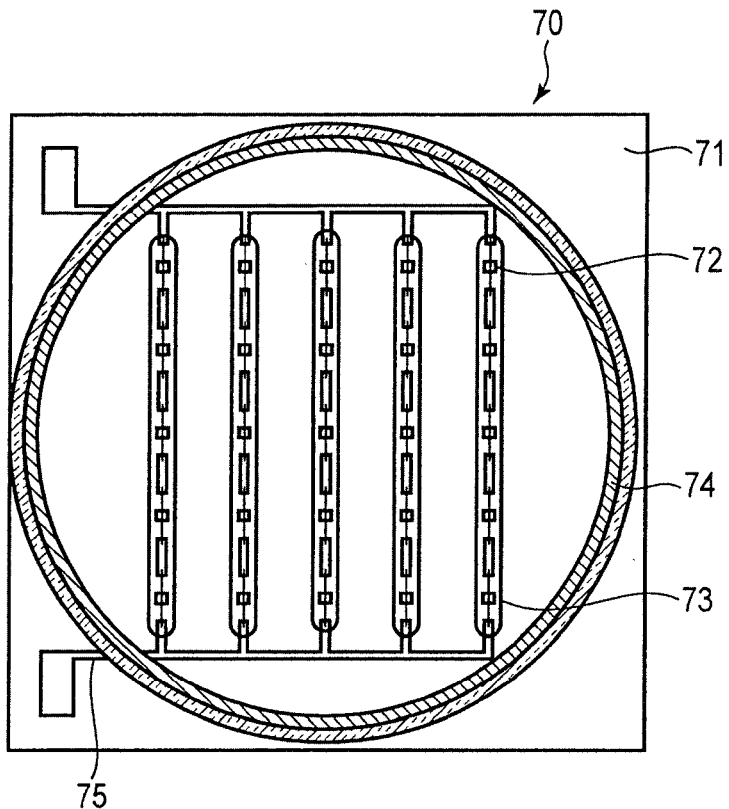
F I G. 38
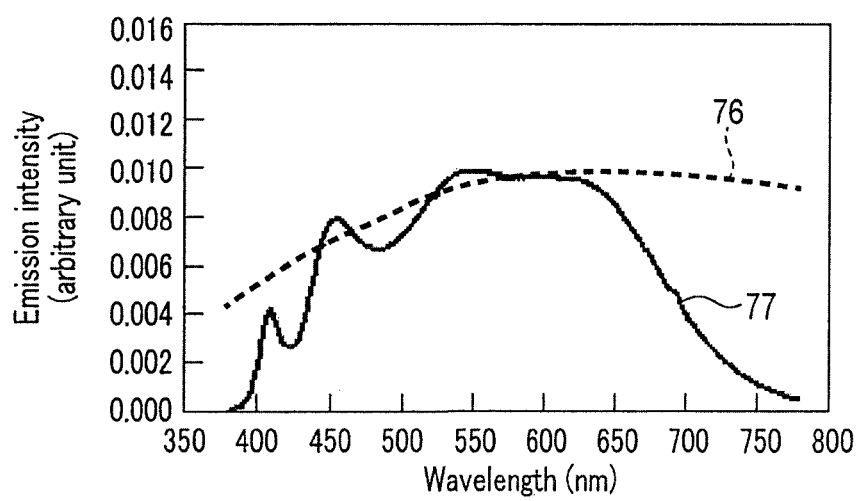
F I G. 39

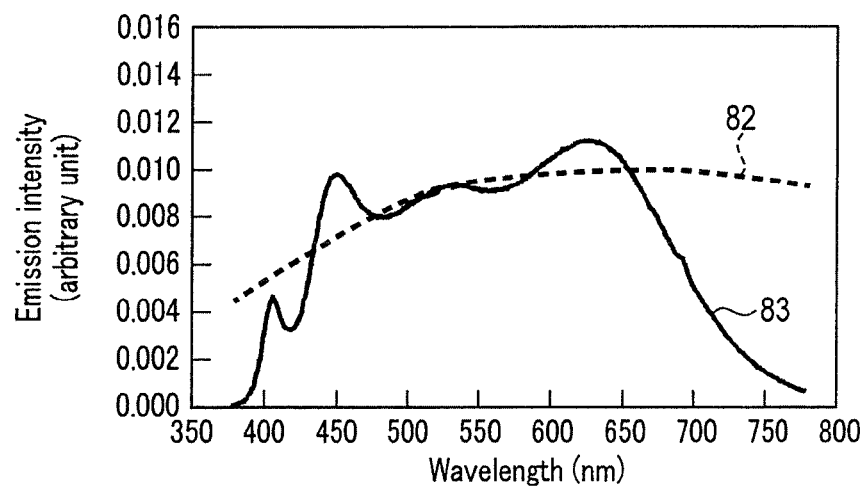
F I G. 42
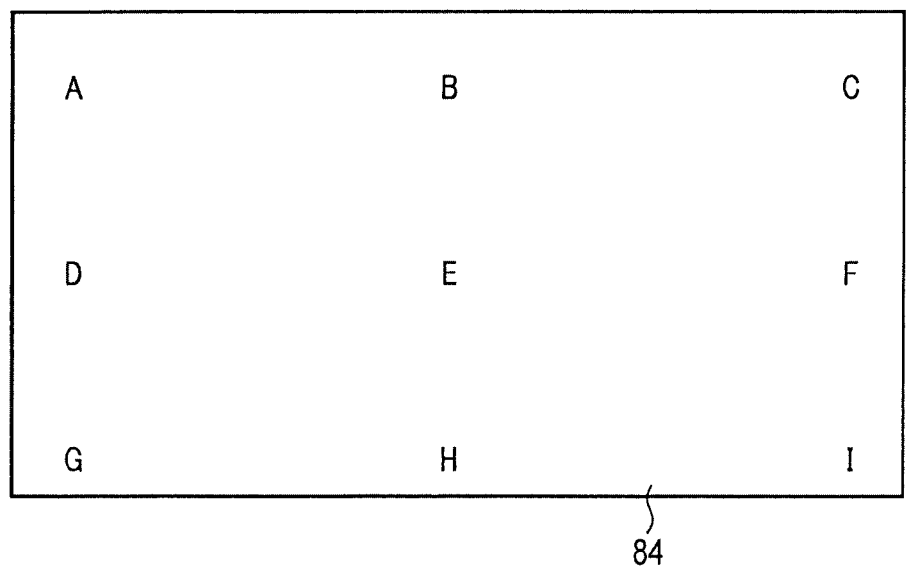
F I G. 43

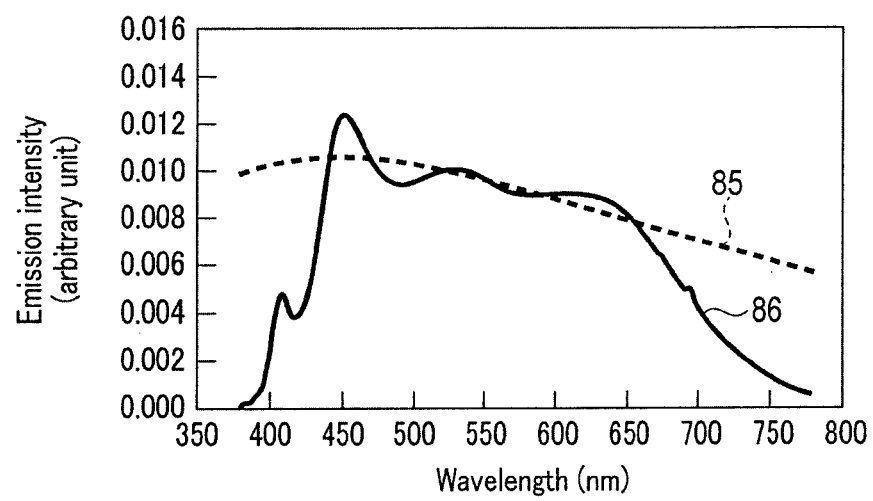
F I G. 44

WHITE LIGHT SOURCE SYSTEM

CROSS-REFERENCE TO RELATED APPLICATIONS

This application is a continuation of U.S. application Ser. No. 17/897,230, filed on Aug. 29, 2022, which is a continuation of U.S. application Ser. No. 17/234,035, filed on Apr. 19, 2021, now issued as U.S. Pat. No. 11,430,771, which is a continuation of U.S. application Ser. No. 16/853,847, filed on Apr. 21, 2020, now issued as U.S. Pat. No. 11,094,679, which is a continuation of U.S. application Ser. No. 16/444,243, filed on Jun. 18, 2019, now issued as U.S. Pat. No. 10,674,577, which is a continuation of U.S. application Ser. No. 16/251,468, filed on Jan. 18, 2019, now issued as U.S. Pat. No. 10,375,786, which is a continuation of U.S. application Ser. No. 15/850,399, filed on Dec. 21, 2017, now issued as U.S. Pat. No. 10,231,305, which is a continuation of International Application No. PCT/JP2016/068714, filed Jun. 23, 2016, which designated the United States, and claims the benefit of Japanese Patent Application No. 2015-126776, filed on Jun. 24, 2015, and Japanese Application No. 2016-082968, filed on Apr. 18, 2016, the entireties of which are incorporated herein by reference.

FIELD

The present invention relates to a white light source and a white light source system for use in illumination in which natural light equivalent to sunlight is required, for example, illumination for articles on exhibition in an art museum or the like, illumination for patients who are forced to stay for long periods in a hospital or the like, and illumination in houses and offices where high color rendering is required.

BACKGROUND

In works of art and craft, the colors that the works have are one of the most important characteristics. For example, a painting or a pot itself does not emit light. Thus, in an art museum or the like, the illumination at a time of appreciating an article on exhibition is as important in meaning as the article itself. The reason for this is that a person who appreciates the article on exhibition observes that portion of the visible light radiated from an illumination light source that is reflected by the surface of the article. Even if an artist expresses very beautiful colors, unless the light from the light source that is irradiated on the article on exhibition includes emission light components corresponding to specific colors, the person appreciating the article can only observe the article with tonality which is dark and poor in color sensation.

The most desirable light source for this purpose of illumination is sunlight. As sunlight is composed of consecutive wavelength components of light, the sunlight includes, substantially equally, all light components of visible light wavelengths from 400 nm to 780 nm, and can reproduce all colors existing in nature as original colors inherent to substances in nature. However, no matter how excellent the sunlight is as the light source, precious works of art, such as paintings, are not appreciated in an outdoor bright space, while such works of art are directly exposed to sunlight. The reason why the works of art are stored in a specific place such as an art museum and are appreciated is, in part, because it is necessary to protect them from accidents such as by the weather and sealing. However, a more important reason is that it is necessary to protect the works of art from a great quantity of irradiation.

This is because sunlight includes the visible light of all wavelengths, and also includes emission light components other than visible light, such as ultraviolet and infrared. In particular, since ultraviolet is stronger in energy than visible light, direct exposure to sunlight promotes fading and embrittlement of historic paintings, etc. Thus, an artificial light source is needed. However, the artificial light source is required to be able to reproduce sunlight as correctly as possible, in addition to having such convenient features of artificial light that the amount of light is adjustable and the amount of ultraviolet is reduced as much as possible.

On the other hand, in recent years, as an artificial light source, attention has been paid to a light source using an LED (light-emitting diode) from the standpoint of energy saving and reduction in emission of carbon dioxide. Compared to a conventional incandescent bulb using a tungsten filament, the LED has a long lifetime and can achieve energy saving. Because of the convenience of the LED, LED illumination is rapidly gaining in popularity in the market. In many types of LED illumination in the early stage, white light was obtained by combining a blue light emitting LED and a yellow light emitting phosphor, and only unnatural white which lacks in warmth could be reproduced. However, with remarkable enhancement in performance in step with the increasing popularity of LED products in the market, various improvements have been made to combinations of LEDs and phosphors. As a result, some white light sources that can reproduce sunlight have been developed.

Patent document 1 discloses an invention relating to a white light source having the same light emission spectrum as sunlight. Sunlights with different color temperatures are reproduced with blackbody radiation spectra of the same color temperatures. In this invention, a white light source can be obtained which reproduces light close to sunlight of various color temperatures which vary with time, not only with respect to apparent white light but also with respect to the spectrum shape. Patent document 2 discloses an invention relating to an illumination system using a white light source, and relates to office illumination or the like, with the object of illumination being mainly a human or the like. This system can adjust color temperature or illuminance of indoor light, while detecting a variation of outdoor light. White light illumination corresponding to variations due to physiological phenomena of humans and seasons can be obtained. In addition, patent document 3 discloses an invention relating to an artificial sunlight system in which a plural of light-emitting diode modules with different color temperatures are combined. This system can reproduce variations of color temperatures of sunlight which is radiated on places of different latitudes and longitudes on the earth.

CITATION LIST

Patent Literature

Patent document 1: PCT International Publication No. 2012/144087
Patent document 2: Jpn. Pat. Appln. KOKAI Publication No. 2011-23339
Patent document 3: Jpn. PCT National Publication No. 2009-540599

BRIEF DESCRIPTION OF THE DRAWINGS

FIG. 1 is a graph showing a light emission spectrum of sunlight in the daytime in winter in Milan, Italy.

FIG. 2 is a graph showing a light emission spectrum of sunlight in the evening in spring in Tokyo, Japan.

FIG. 4 is a graph showing variations of a color temperature and illuminance of sunlight in a day in spring in Tokyo, Japan.

FIG. 5 is a graph showing light emission spectra of sunlight in the morning, daytime, and evening in spring in Yokohama, Japan.

FIG. 6 is a graph showing light emission spectra of the white light source of the present invention, the light emission spectra being a reproduction of light emission spectra of sunlight in the morning, daytime, and evening in spring in Yokohama, Japan.

FIG. 7 is a graph showing a difference spectrum between a light emission spectrum of a light source A and a blackbody radiation spectrum having the same color temperature.

FIG. 13 is a graph showing variations of a color temperature and illuminance of sunlight in a day in spring in Yokohama, Japan.

FIG. 14 is a graph showing a light emission spectral characteristic of a white light source of Comparative Example 1, $(P(\lambda) \times V(\lambda)/(P(\lambda \text{ max } 1) \times V(\lambda \text{ max } 1)))$.

FIG. 17 is a graph comparing spectral intensities of $P(\lambda)V(\lambda)$ of the white light source of Comparative Example 1 and $B(\lambda)V(\lambda)$ of blackbody radiation having the same color temperature.

FIG. 18 is a graph comparing spectral intensities of $P(\lambda)V(\lambda)$ of a white light source (5) of Example 2 and $B(\lambda)V(\lambda)$ of blackbody radiation having the same color temperature.

FIG. 22 is a graph showing variations of a color temperature and illuminance of sunlight in a day in spring in Wakkanai (Hokkaido), Japan.

FIG. 23 is a graph showing variations of a color temperature and illuminance of sunlight in a day in summer in Taipei, Taiwan.

FIG. 26 is a graph showing variations of a color temperature and illuminance of sunlight in a day in winter in Naha (Okinawa), Japan.

FIG. 27 is a schematic view illustrating an example of a white light source system of an embodiment.

FIG. 28 is a schematic view illustrating a second example of the white light source system of the embodiment.

FIG. 29 is a cross-sectional view illustrating a first example of an LED module used in the white light source system.

FIG. 30 is a cross-sectional view illustrating a second example of the LED module used in the white light source system.

FIG. 38 is a schematic view illustrating an LED module of the white light source system of Example A.

FIG. 39 is a graph comparing spectral intensities of $P(\lambda)V(\lambda)$ of a white light source 7 of Example A and $B(\lambda)V(\lambda)$ of blackbody radiation having the same color temperature.

FIG. 42 is a graph comparing spectral intensities of $P(\lambda)V(\lambda)$ of a white light source 10 of Example A and $B(\lambda)V(\lambda)$ of blackbody radiation having the same color temperature.

FIG. 43 is a plan view illustrating a phosphor layer in a white light source system of Example C.

FIG. 44 is a graph comparing spectral intensities of P(λ)V(λ) of a white light source 11 of Example A and B(λ)V(λ) of blackbody radiation having the same color temperature

DETAILED DESCRIPTION

Figure 3:
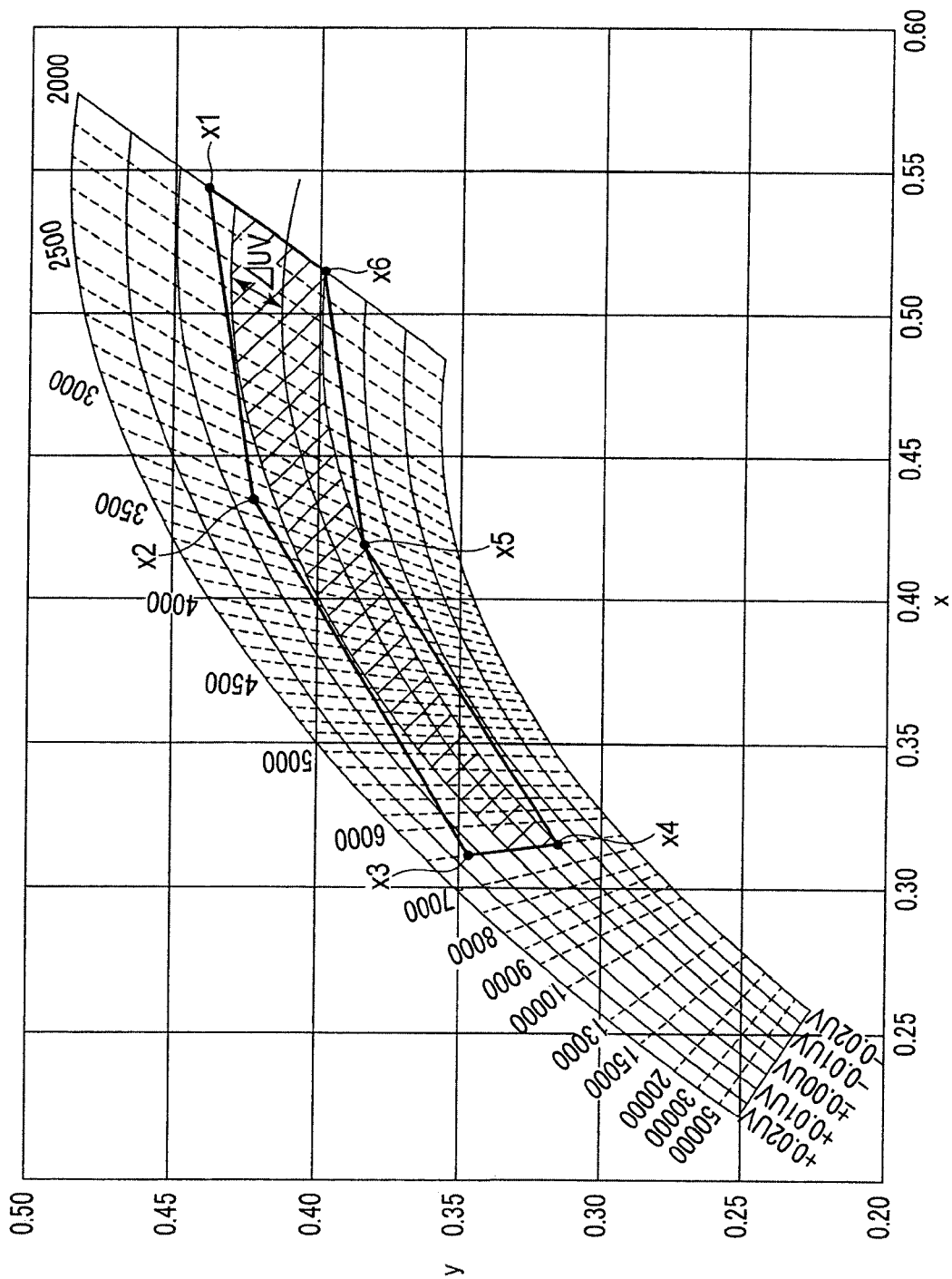
FIG. 3 is a graph showing a light emission chromaticity region which a white light source of the present invention exhibits.

The object of the present invention is to provide an artificial light source system which is usable for an object that requires the same natural illumination as sunlight, such as an article on exhibition in an art museum or the like, or an inpatient staying for a long time, the system being an illumination system which can reproduce light as close as possible to sunlight, and can successively reproduce even fine differences of sunlight varying from time to time and from place to place.

In recent years, as shown in patent documents 1 to 3, some patent documents have proposed artificial light sources which can reproduce sunlight. Aside from these, many products, whose main attraction is reproduction of sunlight, are on the market. Most of these illumination products aim at providing light sources which emit light close to sunlight of a certain time instant, or aim at providing, even when a variation in sunlight is captured, light close to sunlight by paying attention to an apparent color temperature variation of sunlight. Like patent document 3 among others, there is a concept of controlling the color temperatures and optical characteristic variation data of sunlight due to differences in time and place. In the case of patent document 3, however, as regards optical characteristic variations other than color temperatures, no concrete description is given, nor is any improvement made.

However, the variation of sunlight is not limited to the variation due to the color temperature. For example, sunlight also varies due to a radiation rate, purity and turbidity. Subtle variations including these elements in addition to the color temperature are major factors which affect different climates in different regions. For example, assuming that Japan is divided into a Japan Sea side and a Pacific side, there are many cloudy, rainy and snowy days in the Japan Sea-side region. Since the atmosphere contains much floating matter such as moisture vapor and dust, the sunlight becomes gloomy, and the colors of things look turbid. On the other hand, in the Pacific-side region, since there is less moisture vapor, the purity of the atmosphere is high, and things appear in clear colors. Hence, there occur differences in taste of colors among regions, and there is a tendency that the people living on the Japan Sea side favor turbid colors while the people living on the Pacific side favor clear colors.

Works of art, such as paintings, are creations by humans. Accordingly, although the works of art are original works by individuals, it is inevitable that the color expressions, which the works have, are influenced by environments. In the case of a realistic painting, this is a matter of course. Even in the case of an abstract painting, it is possible that the selection itself, such as emphasis on red, emphasis on blue, a liking for clear colors, or a liking for turbid colors, is already influenced by climates, etc. Even if such selection is purely based on personal sensitivity, the influence is inevitable as long as the color expression of the created work is discerned by reflected light from a light source. Specifically, even if the creator deliberately emphasized red, it is natural that the degree of emphasis is influenced by the amount of the red component of the same wavelength included in the light of the light source.

Accordingly, in art appreciation or the like, in order to understand the real value of the work of art, it is very important to reproduce not only the natural light of the sun, but also the same photoenvironment as when the work was created. In other words, when a work of art is appreciated under the same light as the creator experienced, for example, in the country or region where the work was created, or the season, time, age, weather, etc., in which the work was created, it should first become possible that the work is understandable in the same position as the creator.

The white light source of the present invention basically reproduces sunlight of various color temperatures. Specifically, when sunlight of a specific color temperature is reproduced, a blackbody radiation spectrum having the same color temperature as sunlight is regarded as a spectrum by rays of sunlight. In addition, the shape of the spectrum, too, is approximated. The sun can be thought to be a kind of blackbody. There is a good agreement between a radiation spectral curve of a blackbody and a light emission spectrum curve of sunlight, and it is considered that the spectral distribution of the actual rays of the sun is close to a blackbody radiation spectrum of 5800 K.

However, the actual light emission spectrum of sunlight reaching the earth deviates slightly from the blackbody radiation spectrum. The reason for this is that even if white light radiated from the sun is close to the spectrum of blackbody radiation, the white light passes through a layer of air, moisture vapor and dust before reaching the earth, and light of a specific wavelength is scattered. A macroscopic variation due to scattering of blue light, etc. can be coped with as a variation in color temperature, but it is difficult to artificially reproduce fine irregular waveforms occurring in a specific wavelength region of the light emission spectrum.

However, such fine differences are factors which make differences in climate between regions. The present invention is devised so as to cope with even such fine differences. Specifically, as regards a difference between the spectrum of sunlight reaching the earth and the blackbody radiation spectrum of the same color temperature as the sunlight, the degree of this difference is converted to a deviation from a blackbody locus, and white light of a correlated color temperature having a predetermined deviation is reproduced.

The white light source of the present invention reproduces fine color variations due to differences between regions as described above, and also successively reproduces even the color temperature variations of sunlight which varies from time to time, thus providing very natural sunlight by an artificial light source. In addition, the white light source of this invention greatly reduces, compared to conventional artificial light sources, light emission components of ultraviolet and blue light, which are regarded as being harmful to paintings and human bodies.

The merits of sunlight are adopted in all senses, and natural white light is provided.

According to the embodiments, the following inventions can be provided.

[1] A white light source satisfying an expression:

$$-0.2 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq \pm 0.2,$$

where $P(\lambda)$ is a light emission spectrum of the white light source having a correlated color temperature with a deviation duv from a blackbody radiation locus being ±0.005 or less; $B(\lambda)$ is a light emission spectrum of blackbody radiation of a color temperature correspond to the color temperature of the white light; $V(\lambda)$ is a spectrum of a spectral luminous efficiency; λ max 1 is a wavelength at which P(λ)×V(λ) is largest; and λ max 2 is a wavelength at which B(λ)×V(λ) is largest.

[2] The white light source of [1], wherein the white light source has correlated color temperatures in a range of 2600 to 6500 K.

[3] A white light source system including LED modules which are each composed of the white light source of [1] or [2] and are configured to emit white light having at least two chromaticity points having a plus deviation from a blackbody locus and at least two chromaticity points having a minus deviation from the blackbody locus within a region surrounded by four kinds of chromaticity points with a deviation duv from white lights of two arbitrary kinds of color temperatures being ±0.005 or less, and a controller configured to control light emission intensities of the LED modules, the white light source system being configured to be capable of obtaining white light in which emission lights from at least four kinds of LED modules controlled to have arbitrary intensities are mixed.

[4] The white light source system of [3] including a database storing spectra of sunlight varying in accordance with variations with time in major regions at home and abroad, wherein light emission intensities of the plural of LED modules are controlled based on desired sunlight spectrum data in the database, and sunlight corresponding to a desired time of year in a desired region can be reproduced.

[5] The white light source system of [3] or [4], wherein the LED module includes an LED and a phosphor layer, and the phosphor layer includes a phosphor and a resin.

[6] The white light source system of [5], wherein, in the white light source in which the LED is configured to emit primary light of ultraviolet to violet with a peak wavelength of 360 nm to 420 nm and the phosphor layer covering the LED is configured to absorb the primary light from the LED and to emit secondary light of white, an intensity of the LED primary light emitted from the white light source is 0.4 mW/lm or less.

[7] The white light source system of [3] or [6], wherein the white light source system is used as illumination for a work of art and craft exhibited in an art museum, a museum or the like.

{1} A white light source system configured to be capable of reproducing white light of a color temperature on a locus of blackbody radiation, and white light of a correlated color temperature with a deviation from the blackbody locus, wherein P(λ), B(λ) and V(λ) satisfy an equation (1) below in a wavelength range in which λ is 380 nm to 780 nm, and the P(λ) and the B(λ) satisfy an expression (2) below in a wavelength range of 400 nm to 495 nm:

$$\int_{380}^{780} P(\lambda)V(\lambda)d\lambda = \int_{380}^{780} B(\lambda)V(\lambda)d\lambda \tag{1}$$

$$P(\lambda)/B(\lambda) \leq 1.8. \tag{2}$$

$$P(\lambda)/B(\lambda) \leq 1.8. \tag{2}$$

where P(λ) is a light emission spectrum of white light emitted from the white light source system, B(λ) is a light emission spectrum of blackbody radiation of a color temperature correspond to a color temperature of the white light source system, and V(λ) is a spectrum of a spectral luminous efficiency.

{2} The white light source system of {1}, wherein the white light source system is configured to be capable of reproducing white light of a color temperature on the locus of the blackbody radiation, and white light of any one of correlated color temperatures with a deviation from the color temperature of the white light being in a range of ±0.005 duv.

{3} The white light source system of {2}, wherein the white light source system is configured to be capable of reproducing white light of a color temperature of 2000 K to 6500 K on the locus of the blackbody radiation, and white light of any one of correlated color temperatures with a deviation from the color temperature of the white light being in a range of ±0.005 duv.

{4} The white light source system of any one of {1} to {3}, which satisfies an expression (3) below:

$$-0.2 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.2. \tag{3}$$

where P(λ) is a light emission spectrum of white light emitted from the white light source system, B(λ) is a light emission spectrum of blackbody radiation of a color temperature correspond to a color temperature of the white light source system, and V(λ) is a spectrum of a spectral luminous efficiency, λ max 1 is a wavelength at which P(λ)×V(λ) is largest, and λ max 2 is a wavelength at which B(λ)×V(λ) is largest.

{5} The white light source system of {4}, which satisfies an expression (4) below:

$$-0.1 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.1. \tag{4}$$

{6} A white light source system configured to be capable of reproducing white light of a color temperature on a locus of blackbody radiation, and white light of a correlated color temperature with a deviation from the blackbody locus, wherein an average color rendering index Ra of white light emitted from the white light source system is 95 or more, and all of color rendering indexes R1 to R8 and special color rendering indexes R9 to R15 are 85 or more.

{7} The white light source system of {6}, wherein the white light source system is configured to be capable of reproducing white light of a color temperature of 2000 K to 6500 K on the locus of the blackbody radiation, and white light of any one of correlated color temperatures with a deviation from the color temperature of the white light being in a range of ±0.005 duv.

[8] The white light source system of [7], wherein the average color rendering index Ra of the white light emitted from the white light source system is 97 or more, and all of the color rendering indexes R1 to R8 and the special color rendering indexes R9 to R15 are 90 or more.

[9] The white light source system of any one of {6} to {8}, wherein P(λ), B(λ) and V(λ) satisfy an equation (1) below in a wavelength range in which λ is 380 nm to 780 nm, and the P(λ) and the B(λ) satisfy an expression (2) below in a wavelength range of 400 nm to 495 nm:

$$\int_{380}^{780} P(\lambda)V(\lambda)d\lambda = \int_{380}^{780} B(\lambda)V(\lambda)d\lambda \tag{1}$$

$$P(\lambda)/B(\lambda) \leq 1.8. \tag{2}$$

$$P(\lambda)/B(\lambda) \leq 1.8. \tag{2}$$

where P(λ) is a light emission spectrum of white light emitted from the white light source system, B(λ) is a light emission spectrum of blackbody radiation of a color temperature correspond to a color temperature of the white light source system, and V(λ) is a spectrum of a spectral luminous efficiency.

{10} A white light source system configured to be capable of reproducing white light of a color temperature on a locus of blackbody radiation, and white light of any one of correlated color temperatures with a deviation from the color temperature of the white light being in a range of ±0.005 duv, wherein the white light source system includes LED modules configured to emit white light of at least two chromaticity points on an xy chromaticity diagram having a plus deviation on a blackbody locus and white light of at least two chromaticity points on the xy chromaticity diagram having a minus deviation on the blackbody locus, and a controller configured to control light emission intensities of the LED modules, the white light source system being configured to be capable of obtaining white light by mixing emission lights from at least four kinds of LED modules controlled to have arbitrary intensities.

{11} A white light source system configured to be capable of reproducing white light of a color temperature of 2000 K to 6500 K on a locus of blackbody radiation, and white light of any one of correlated color temperatures with a deviation from the color temperature of the white light being in a range of ±0.005 duv, wherein the white light source system includes LED modules configured to emit white light of at least three chromaticity points on an xy chromaticity diagram having a plus deviation on a blackbody locus and white light of at least three chromaticity points on the xy chromaticity diagram having a minus deviation on the blackbody locus, and a controller configured to control light emission intensities of the LED modules, the white light source system being configured to be capable of obtaining white light by mixing emission lights from at least six kinds of LED modules controlled to have arbitrary intensities.

{12} The white light source system of {10} or {11}, wherein P(λ), B(λ) and V(λ) satisfy an equation (1) below in a wavelength range in which λ is 380 nm to 780 nm, and the P(λ) and the B(λ) satisfy an expression (2) below in a wavelength range of 400 nm to 495 nm:

$$\int_{380}^{780} P(\lambda)V(\lambda)d\lambda = \int_{380}^{780} B(\lambda)V(\lambda)d\lambda \quad (1)$$

$$P(\lambda)/B(\lambda) \leq 1.8. \quad (2)$$

$$P(\lambda)/B(\lambda) \leq 1.8. \quad (2)$$

where P(λ) is a light emission spectrum of white light emitted from the white light source system, B(λ) is a light emission spectrum of blackbody radiation of a color temperature correspond to a color temperature of the white light source system, and V(λ) is a spectrum of a spectral luminous efficiency.

{13} The white light source system of any one of [10] to [12], wherein the LED module includes an LED configured to emit primary light of ultraviolet to violet with a light emission peak wavelength of 360 nm to 420 nm, and a phosphor configured to absorb the primary light from the LED and to emit secondary light of white.

{14} The white light source system of [13], which includes a phosphor layer including the phosphor and a resin.

{15} The white light source system of [14], wherein the phosphor layer covers the LED, and an intensity of LED primary light emitted from the white light source is 0.4 mW/lm (lumen) or less.

{16} The white light source system of [15], which includes a powder material layer and a thin film, wherein the powder material layer includes a resin material and at least one kind of powder material selected from among zinc oxide, titanium oxide and aluminum oxide, and is formed on an outside of the phosphor layer, the thin film includes at least one kind selected from among the zinc oxide, titanium oxide and aluminum oxide, and is formed on a transparent member which constitutes a cover of the white light source system.

{17} The white light source system of [15] or [16], which includes a powder material layer and a thin film, wherein the powder material layer includes a resin material and at least one kind of powder material selected from among silicon oxide and zirconium oxide, and formed on an outside of the phosphor layer, and the powder material layer includes at least one kind selected from between the silicon oxide and the zirconium oxide, and is formed on a transparent member which constitutes a cover of the white light source system.

{18} The white light source system of any one of [13] to [17], wherein the phosphor is a mixture of at least four kinds selected from the group consisting of a blue phosphor, a green phosphor, a yellow phosphor and a red phosphor.

The white light source system of [18], wherein a blue-green phosphor is further contained in the phosphor mixture.

{20} The white light source system of [18], wherein the blue phosphor is at least one kind selected from between a europium activated strontium aluminate phosphor having a light emission peak wavelength of 480 to 500 nm, and a europium activated alkaline earth phosphate phosphor having a light emission peak wavelength of 440 to 460 nm.

The white light source system of any one of [18] to [20], wherein the green phosphor is at least one kind selected from among a europium activated orthosilicate phosphor having a light emission peak wavelength of 520 to 550 nm, a europium activated β-sialon phosphor having a light emission peak wavelength of 535 to 545 nm, and a europium activated strontium sialon phosphor having a light emission peak wavelength of 520 to 540 nm.

The white light source system of any one of [18] to [21], wherein the yellow phosphor is a europium activated orthosilicate phosphor having a light emission peak wavelength of 550 to 580 nm, or a cerium activated rare earth aluminum garnet phosphor having a light emission peak wavelength of 550 to 580 nm.

The white light source system of any one of [18] to [22], wherein the red phosphor is at least one kind selected from among a europium activated strontium sialon phosphor having a light emission peak wavelength of 600 to 630 nm, a europium activated calcium nitridoaluminosilicate phosphor having a light emission peak wavelength of 620 to 660 nm, a europium activated lanthanum oxysulfide phosphor having a light emission peak wavelength of 620 to 630 nm, and a manganese activated magnesium fluorogermanate phosphor having a light emission peak wavelength of 640 to 660 nm.

{24} The white light source system of any one of {1} to {5}, wherein the P(λ) and the B(λ) satisfy an expression (5) below in the wavelength range of 400 nm to 495 nm:

$$P(\lambda)/B(\lambda) \leq 1.5. \quad (5)$$

{25} The white light source system of any one of {9} to {12}, wherein the P(λ) and the B(λ) satisfy an expression (5) below in the wavelength range of 400 nm to 495 nm:

$$P(\lambda)/B(\lambda) \leq 1.5. \quad (5)$$

{26} The white light source system of any one of {1} to {25}, wherein sunlight, which varies in accordance with differences in latitude, longitude and inherent environment in an arbitrary place on the earth, is reproduced as white light having a correlated color temperature, and the correlated color temperature, which varies from time to time, is successively reproduced.

{27} The white light source system of {26}, further including a database storing spectra of sunlight varying in accordance with variations with time in major regions at home and abroad, wherein light emission intensities of the plural of LED modules are controlled based on desired sunlight spectrum data in the database, and sunlight corresponding to an arbitrary time of year in an arbitrary region can be reproduced.

{28} The white light source system of any one of {1} to {27}, wherein the white light source system is used as illumination for an office or a home.

{29} The white light source system of any one of {1} to {27}, wherein the white light source system is used as illumination for a work of art and craft exhibited in an art museum, a museum or the like.

A white light source system configured to be capable of reproducing white light of an arbitrary color temperature on a locus of blackbody radiation, and white light of a correlated color temperature with an arbitrary deviation from the locus of the blackbody radiation, wherein P(λ), B(λ) and V(λ) satisfy an equation (1) below in a wavelength range in which λ is 380 nm to 780 nm, the P(λ) and the B(λ) satisfy an expression (2) below in a wavelength range of 400 nm to 495 nm:

$$\int_{380}^{780} P(\lambda)V(\lambda)d\lambda = \int_{380}^{780} B(\lambda)V(\lambda)d\lambda \quad (1)$$

$$P(\lambda)/B(\lambda) \leq 1.8. \quad (2)$$

$$P(\lambda)/B(\lambda) \leq 1.8. \quad (2)$$

where P(λ) is a light emission spectrum of white light emitted from the white light source system, B(λ) is a light emission spectrum of blackbody radiation of a color temperature correspond to a color temperature of the white light source system, and V(λ) is a spectrum of a spectral luminous efficiency.

A white light source system configured to be capable of reproducing white light of a color temperature on a locus of blackbody radiation, and white light of a correlated color temperature with a deviation from the locus of the blackbody radiation, wherein an average color rendering index Ra of white light emitted from the white light source system is 95 or more, and all of color rendering indexes R1 to R8 and special color rendering indexes R9 to R15 are 85 or more.

The white light source of the present invention can reproduce a spectrum shape of blackbody radiation, and can also approximate a light emission spectrum having the same shape as sunlight reaching the earth, by taking into account a difference in time and a difference in region. Thus, if the white light source is utilized for illumination in an art museum where articles on exhibition, such as works of art, are displayed, it is possible to obtain the illumination which can be made close to the same sunlight as in the time and place in which the articles on exhibition were created, and can more accurately reproduce the creator's intention.

In addition, the white light source of this invention can successively reproduce variations of sunlight in a day, that is, color temperature variations of sunlight which is changing every moment from sunrise to sunset. Thus, when the white light source is used as illumination for works of art, etc., it is possible to enjoy, while staying in the art museum, the colors of paintings which are irradiated with various sunlights ranging from morning sunlight to evening sunlight, with natural variations of the colors. Besides, when the white light source is used as illumination in a hospital or the like, it is possible to sense, while staying in the hospital, sunlight all day, even including color temperature variations. In particular, since the state of changing is reproduced as a minute difference which is imperceptible to humans, an inpatient, for example, is unable to perceive a moment when the color temperature varies, and thus the illumination is very natural and acceptable to the inpatient. In addition, in this white light source, compared to conventional artificial white light sources, the intensity of a blue emission light component, etc. is greatly reduced, and, needless to say, the illumination is kind to human bodies, etc.

(Light Emission Characteristics of White Light Source)

A white light source of the present invention aims at more accurately reproducing light of the sun. In order to achieve accurate reproduction, it is necessary to exactly grasp light emission spectra of sunlight which varies from time to time, and varies from place to place. Of such variations, a variation due to a difference in latitude or longitude of the earth occurs because the distance of passage of sunlight traveling through the atmosphere on the surface of the earth varies depending on the difference of the incidence angle of the sunlight. Specifically, when sunlight passes through the atmospheric air, the sunlight is scattered by gas molecules, etc. floating in the air, and a difference occurs in the degree of scattering of blue light or the like due to the distance of passage. Such a variation of sunlight can be macroscopically grasped as a difference in color temperature. In this case, light emission spectra of sunlights with different color temperatures can be approximated by blackbody radiation spectra of the corresponding color temperatures. By the equation described below, various light emission spectra with different color temperatures can relatively easily be reproduced. In the equation, h denotes a Planck's constant, k denotes a Boltzmann's constant, c denotes the speed of light, and e denotes a base of natural logarithm, and these values are fixed at constant numerical values. Thus, if a color temperature T is determined, a spectral distribution B(λ) corresponding to each wavelength λ can easily be calculated.

$$B(\lambda) = \frac{2hc^2}{\lambda^5} \cdot \frac{1}{e^{hc/\lambda kT} - 1} \quad (6)$$

On the other hand, the light emission spectrum of sunlight varies, not only simply depending on the latitude and longitude, but also depending on regional differences. In this case, various factors of variations are thinkable. To begin with, as regards the influence of light scattering, the scattering relates to not only molecules of air and gas, but also fine particles such as moisture vapor, dust, etc. However, for example, the density of moisture vapor, dust, etc. varies from region to region. As a matter of course, there are large differences between a region near the sea and a region near the desert. Furthermore, the influence of reflection, as well as scattering, is not negligible. Specifically, the light, which humans perceive as sunlight, includes not only direct light falling from the sun, but also light which is reflected after reaching the earth. It is natural that there are differences of light components included in the reflected light between a region near the sea, a region near a forest, and a densely built-up urban area. In this manner, the variations of sunlight due to regional differences are a complex mixture of many factors, and there is no general regularity. It is necessary to understand that the variations of sunlight due to regional differences are based on factors inherent to regions.

In the present invention, in order to reproduce such variations of sunlight, the light emission spectra of sunlight, which vary from region to region and from time to time, are actually measured, and as much as possible data is collected, stored and utilized. Thereby, the variations of sunlight are reproduced. Concretely, the light emission spectra of sunlight are measured in major regions around the world, and one-day variations from hour to hour, and yearly variations from season to season are accumulated as data. In the present invention, the accumulated data, in principle, relates to clear days, and no consideration is given to the influences of clouds, rain, snow, etc.

FIG. 1 shows an example of a light emission spectrum of sunlight in the daytime (12:00 p.m.) in winter (December 16) in Milan, Italy. FIG. 2 shows an example of a light emission spectrum of sunlight in the evening (17:00 p.m.) in spring (May 27) in Tokyo. These light emission spectra were measured by the following method.

A light detection portion of a colorimetry device (spectral distribution measuring device), in which a diffraction grating is incorporated and has a wavelength component resolving function of light intensity, was directed to the sun. Sunlight was directly taken in the spectral distribution measuring device, and light emission spectra were measured. The wavelength range for measurement was set to 360 nm to 780 nm, which covers the visible light range. As regards the adjustment of light intensity that is taken in the spectral distribution measuring device, by an exposure time adjustment function which is incorporated in the measuring device, it was confirmed that no saturation phenomenon occurred even in a wavelength region with high light emission intensity. As regards the measurement result, light intensity for each wavelength was calculated from electronic data. Based on this result, CIE chromaticity coordinate values, correlated color temperatures and deviations were calculated. CIE is the acronym of the Commission Internationale de l'Eclairage.

Each of the light emission spectra is formed of an irregular curve. If the curves are smoothed, the curves can be approximated to the shape of a blackbody radiation spectrum of an arbitrary color temperature. If the two Figures are compared, since the positions of irregularities in the spectrum curves overlap, it is understood that the irregularities are based not on noise or the like, but on factors inherent to specific floating matter, etc. In particular, portions indicative of characteristic irregularities are present in long wavelength regions, and the degree of irregularities is large. It is thus presumed that the spectrum shape of these wavelength regions is one of factors which cause regional differences or the like. If light emission colors are calculated based on the spectral shapes of FIG. 1 and FIG. 2, it turned out that the light in FIG. 1 is white light indicative of a correlated color temperature of 5991 K+0.001 duv, and the light in FIG. 2 is white light indicative of a correlated color temperature of 4483 K−0.001 duv.

The comparison between only two places was described above. However, when the spectral data of sunlight in respective regions and at respective times were compared and evaluated, and the tendency as a whole was confirmed, it turned out that, as a matter of course, the light emission color indicates a point close to a blackbody locus on the (x, y) chromaticity diagram. Moreover, it turned out that the light emission color does not always completely agree with the point on the blackbody locus, and that almost all data fall within the range of correlated color temperatures with a deviation of ±0.005 duv on a blackbody locus having color temperatures of from 2000 K to 6500 K.

In the white light source of the present invention, all light emission colors in the above range can be reproduced. Concretely, for example, as shown in FIG. 3, light emission colors in a range surrounded by x1, x2, x3, x4, x5 and x6 in the Figure can be reproduced. Thus, the white light source of the present invention includes six kinds of white light sources corresponding to x1, x2, x3, x4, x5 and x6. Specifically, by mixing at least two or more of the six kinds of white light sources with any intensities, all light emission colors in the polygonal range can be reproduced. From FIG. 3, it is understood that the range of this shape covers all the light emission colors on the blackbody locus from 2000 K to 6500 K of color temperatures and the white light region with the deviation from the blackbody locus in the range of ±0.005 duv. Accordingly, in the white light source of the present invention, it is possible to reproduce not merely white light on the blackbody locus, but also subtle deviations of color temperatures which vary due to various environmental factors on the earth.

The color reproduction in the range of the specific polygon or the like was described above. However, needless to say, various white lights can be reproduced by setting light emission colors corresponding to the respective vertices of the polygon as white lights of various correlated color temperatures. In addition, in the above-described white light source, six kinds of white light sources were arbitrarily mixed, and the white light emission of the invention was obtained. However, needless to say, sunlights of various color temperatures can be reproduced more finely, by utilizing a greater number of kinds of basic white light sources, for example, eight kinds or ten kinds of white light sources. In particular, this is advantageous when white lights of a wider range of color temperatures are reproduced by a single white light source system. However, if the number of kinds of basic light sources is excessively large, the design of the system becomes complex. If at least four kinds of light sources are used, the advantageous effects of the present invention can, at least, be exhibited. Besides, the range of color temperatures of white light to be reproduced is 2000 K to 6500 K. By setting these values as the upper and lower limits, color temperatures between two or more kinds of arbitrary light sources can be selected as the range of reproduction.

Furthermore, in the white light source system of the present invention, not only the light emission colors of sunlight, but also the light emission spectra can be reproduced. In the white light source system including at least four kinds of white light sources, such as the above-described x1 to x6, each white light source includes all light emission components which can reproduce the light emission spectra of sunlight. Accordingly, when at least two or more kinds of white light sources of the above-described four or more kinds of white light sources are combined, and white light of any color temperature on the blackbody locus or white light of any correlated color temperature close to the blackbody locus is reproduced, the light emission spectral shape of the mixed white light will be similar to the light emission spectral shape of the blackbody radiation of the corresponding color temperatures.

Concretely, a light emission spectrum of a white light source of the present invention is characterized by satisfying the following expression (3):

$$-0.2 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.2 \quad (3)$$

where $P(\lambda)$ is the light emission spectrum of mixed white light emitted from the white light source system; $B(\lambda)$ is the light emission spectrum of blackbody radiation having the same color temperature as that of the white light source; $V(\lambda)$ is the spectrum of a spectral luminous efficiency; $\lambda$ max 1 is the wavelength at which $P(\lambda) \times V(\lambda)$ is largest; and $\lambda$ max 2 is the wavelength at which $B(\lambda) \times V(\lambda)$ is largest.

The $(P(\lambda) \times V(\lambda))$ indicates the intensity of the light emission spectrum of the white light source in a spectral luminous efficiency $V(\lambda)$ region. The $(P(\lambda) \times V(\lambda))$ is divided by $(P(\lambda \text{ max } 1) \times V(\lambda \text{ max } 1))$ that is the maximum value, whereby the upper limit thereof can be 1.0. Further, the $(B(\lambda) \times V(\lambda))$ indicates the intensity of the light emission spectrum of the blackbody radiation in the spectral luminous efficiency $V(\lambda)$ region. The $(B(\lambda) \times V(\lambda))$ is divided by $(B(\lambda \text{ max } 2) \times V(\lambda \text{ max } 2))$ that is the maximum value, whereby the upper limit thereof can be 1.0. Next, a difference $A(\lambda) = [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))]$ is obtained. If the difference $A(\lambda)$ is $-0.2 \leq A(\lambda) \leq +0.2$, the light emission spectrum of the white light source in the spectral luminous efficiency $V(\lambda)$ region is close to the light emission spectrum of the blackbody radiation, that is, the light emission spectrum of natural light. Specifically, if the difference $A(\lambda)$ is $A(\lambda) = 0$, the same light emission spectrum as that of the natural light can be reproduced.

Furthermore, in order to more precisely reproduce the light emission spectrum of blackbody radiation, it is preferable that the white light source of the present invention satisfies the following expression (4):

$$-0.1 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.1. \quad (4)$$

In this manner, in the white light source system of the present invention, at least four kinds of basic white light sources include, without excess or deficiency, the respective light emission color components which sunlight has, and each white light, in which the at least four kinds of light sources are mixed at an arbitrary ratio, also includes the light emission components which sunlight has. In other words, the white light obtained by the white light source system of the present invention has the characteristics of the blackbody radiation spectrum of each color temperature, and can reproduce fine variations of any wavelength regions.

In addition, in the white light source system of the present invention, one-day variations of sunlight can be expressed as successive variations which are very natural to human eyes. According to the result which David Lewis MacAdam derived from isochromatic experiments of the sense of sight ("Shikisai Kougaku" [Color Engineering], 2nd ed., Tokyo Denki University Press), it was found that if the standard deviation of discernment variations for a central color is expressed on the xy chromaticity diagram, this standard deviation is expressed in a range of a shape called "Mac-Adam ellipse", and the range of color temperatures which humans can discern is three times the standard deviation. According to this finding, if calculation is made with respect to white light of 5000 K, the value of 330 K (from 4850 K to 5180 K) was obtained as the threshold of discernment. Thus, for example, in the case of white light of 5000 K, a difference between color temperatures of about 330 K or less cannot be discerned by human eyes.

FIG. 4 is a graph showing a color temperature variation and an illuminance variation of sunlight from 6:00 a.m. to 6:00 p.m. in a day in spring in Tokyo at latitude 35° N. In FIG. 4, a graph denoted by reference sign 1 indicates the color temperature variation, and a graph denoted by reference sign 2 indicates the illuminance variation. The graphs were created based on the result of actual measurement for every three minutes of the variation with time of sunlight. In the Figure, the illuminance is expressed as an illuminance ratio (%) by relative comparison to a certain value as a reference. In addition, since the one-day color temperature variation of sunlight is a rate of approximately a little less than 200 K per three minutes, the difference in color temperature in every measurement unit in the invention is not perceivable to human eyes. Accordingly, even when the color temperature variation is reproduced by using the measurement data, the moment at which the color temperature of the light source changes cannot be recognized, and the variation can be accepted in a natural manner, as if the color temperature varied continuously.

(LED Module)

The feature of the white light source of the present invention is in the light emission characteristics. The white light source may employ any structural member as long as the white light source can reproduce sunlight. Thus, various light sources are applicable. In order to obtain white lights of various color temperatures, the simplest method is a method of adjusting light emission colors by using phosphors, thus a phosphor-applied product is desirable. In particular, a light source created by combining an LED (light-emitting diode) with phosphor has excellent features, not only in characteristics but also in manufacture and application, and is optimal. In this case, in order to obtain white light, any combinations of various light emission colors of LEDs and various light emission colors of phosphors can be selected.

On the other hand, in order to obtain further preferable white light, it is preferable to use a peak wavelength in a range of an ultraviolet to violet region, to be more specific, a range of 360 to 420 nm. When an LED having a light emission peak wavelength in a range exceeding 420 nm is produced, the LED exhibits a sharp light emission at a specific wavelength. Consequently, the balance between this light emission and the light emission of a phosphor having a generally broad spectral shape becomes poorer, and it may be difficult to satisfy the relations of the above expressions (3) and (4). However, if the light emission color of the LED is in a range of ultraviolet to violet, since the luminosity function is low, the influence on white light is small. In addition, the primary light is not emitted from the light emission device by cutting out the primary light from the LED. Therefore, it becomes easy to satisfy the relations of the above expressions.

In order for the light emission spectrum of the white light source to satisfy the relations of the above expressions (3) and (4), it is preferable to use three or more, or, more preferably, five or more, from among a blue phosphor, a blue-green phosphor, a green phosphor, a yellow phosphor, and a red phosphor, as phosphors to be combined in the LED. By arbitrarily mixing these phosphors in accordance with a corresponding blackbody radiation spectrum, white light emission having an arbitrary color temperature or an arbitrary deviation can be obtained. It is preferable to use a phosphor which is excited by an LED having a light emission peak wavelength of 350 to 420 nm, and exhibits a light emission peak in a range of 420 to 700 nm. In addition, it is preferable that the peak wavelengths of the respective phosphors deviate by 150 nm or less, or more preferably, by 10 to 100 nm, or still more preferably, by 10 to 50 nm. In other words, it is preferable that the distance between a certain peak wavelength and a neighboring peak wavelength is 150 nm or less, or more preferably 10 to 100 nm, or still more preferably 10 to 50 nm. It is preferable that the light emission spectra of at least two kinds of phosphors constituting the mixture of phosphors satisfy this relationship. In addition, the half-value width of the light emission spectrum of at least one kind of phosphor constituting the mixture of phosphors is as wide as 50 nm or more, and more preferably 50 to 100 nm. By using the phosphors which satisfy these conditions, the light emission spectrum of each phosphor tends to more easily overlap the light emission spectra of other phosphors. The larger the overlapping area between the light emission spectra, the easier it is to obtain the characteristics of a spectral curve of the obtained mixed white light, and the spectral curve will show less irregularity, be smoother, and be closer to the spectrum of blackbody radiation.

Besides, by using plural phosphors with overlapping light emission spectra, it is possible to suppress a variation in light emission color upon long-time continuous lighting. Among the phosphors used in the present invention, there exists a phosphor having a wide absorption band. Such a phosphor can be not only excited by ultraviolet or violet light, but can also be simultaneously excited by blue light or green light and can emit green light or red light. If a plural of such phosphors with overlapping light emission spectra are used, re-absorption or double excitation tends to more easily occur, which means that it is easier to suppress any variation in light emission color. For example, a green phosphor is not only excited by ultraviolet or violet light emitted from the LED and emits green light, but also the green phosphor absorbs light of a blue phosphor which is excited by the LED and emits blue light, and can emit green light. Specifically, the green phosphor can emit light by double excitation by the LED and blue phosphor. In general, in an artificial white light source, white light is obtained by mixing, within the device, emission lights of a plural of phosphors such as red, green and blue phosphors. When this white light source is continuously turned on, the brightness of phosphors, in usual cases, gradually decreases with time. Therefore, if the brightnesses of the respective phosphors equally vary with time, the chromaticity of the obtained white light is unchanged. However, of a plural of kinds of phosphors, if the luminance degradation rate of a certain kind of phosphor is different from the luminance degradation rates of some other phosphors, excess or deficiency of light emission of a certain component occurs in the obtained white light, and a change occurs in the obtained light emission color. However, if mutual absorption or double excitation occurs as in the present invention, the degradation rates are averaged between the phosphors, and it is possible to suppress degradation of only a certain phosphor. As a result, the chromaticity variation of the obtained white light decreases.

In the meantime, as regards a phosphor, what wavelength causes excitation of the phosphor and what wavelength causes light emission of the phosphor can easily be confirmed by measuring the excitation spectrum or light emission spectrum of the phosphor. Accordingly, if light emission spectrum characteristics are measured in advance and then a combination of phosphors to be used is selected, the chromaticity variation during continuous lighting can be reduced as much as possible. By utilizing the above advantageous effects, the white light source system of the present invention can reduce the magnitude of the chromaticity variation between the initial time of lighting of the white light source and the time after continuous lighting of 6000 hours to 0.010 or less with use of the CIE chromaticity diagram. In the method of measuring the magnitude of the chromaticity variation, chromaticity coordinates u' and v' at the initial time of lighting of the white light source and at the time after continuous lighting of 6000 hours are measured, respectively, according to JIS-Z-8518. Differences $\Delta u'$ and $\Delta v'$ between the chromaticity coordinates at this time are calculated, and the magnitude of the chromaticity variation= $[(\Delta u')2+(\Delta v')2]^{1/2}$ is calculated. In the white light source system of the present invention, the magnitude of this chromaticity variation can be decreased to as small as less than 0.010, and, furthermore, to less than 0.009. That the magnitude of chromaticity variation is less than 0.010 refers to the state in which there is no substantial change of color from the initial time of lighting even in the case of long-time use. Thus, sunlight can be reproduced for a long time.

Concrete phosphors, which are usable in the white light source system of the present invention, are as follows. Examples of the blue phosphor include a europium activated alkaline earth phosphate phosphor (a peak wavelength of 440 to 455 nm), and a europium activated barium magnesium aluminate phosphor (a peak wavelength of 450 to 460 nm). Further, examples of the blue-green phosphor include a europium activated strontium aluminate phosphor (a peak wavelength of 480 to 500 nm), and a europium and manganese activated barium magnesium aluminate phosphor (a peak wavelength of 510 to 520 nm). Examples of the green phosphor include a europium activated orthosilicate phosphor (a peak wavelength of 520 to 550 nm), a europium activated p-sialon phosphor (a peak wavelength of 535 to 545 nm), and a europium activated strontium sialon phosphor (a peak wavelength of 520 to 540 nm). Examples of the yellow phosphor include a europium activated orthosilicate phosphor (a peak wavelength of 550 to 580 nm), and a cerium activated rare earth aluminum garnet phosphor (a peak wavelength of 550 to 580 nm). Examples of the red phosphor include a europium activated strontium sialon phosphor (a peak wavelength of 600 to 630 nm), a europium activated calcium nitridoaluminosilicate phosphor (a peak wavelength of 620 to 660 nm), a europium activated lanthanum oxysulfide phosphor (a peak wavelength of 620 to 630 nm), and a manganese activated magnesium fluorogermanate phosphor (a peak wavelength of 640 to 660 nm).

Figure 34:
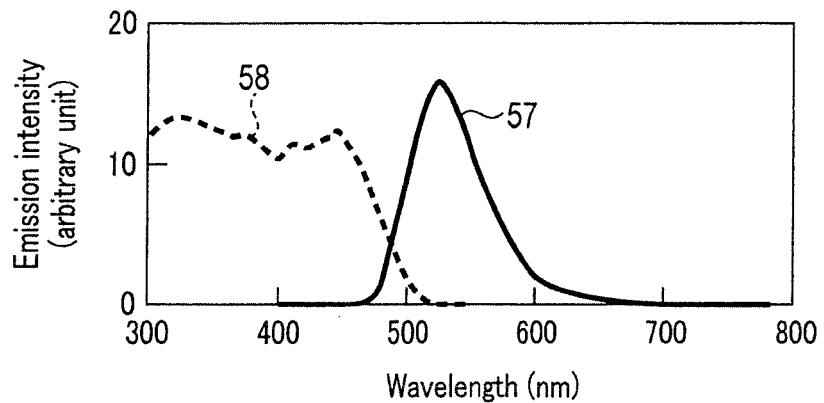
FIG. 34 is a graph showing a first example of a light emission spectrum and an excitation spectrum of a phosphor.
Figure 35:
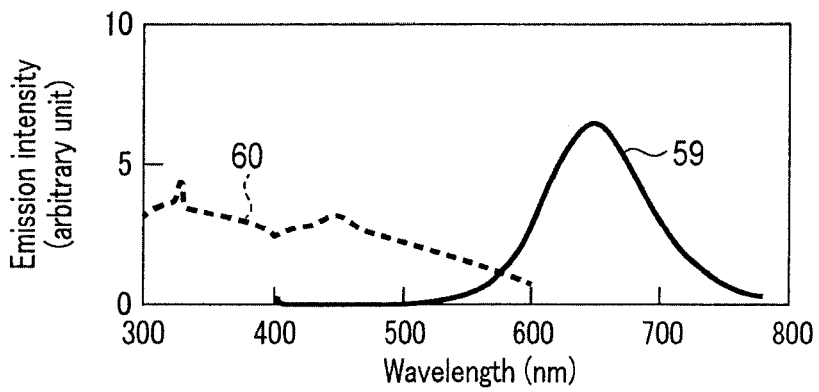
FIG. 35 is a graph showing a second example of the light emission spectrum and excitation spectrum of the phosphor.

FIG. 34 shows a light emission characteristic of the europium activated orthosilicate phosphor of green light emission, and shows a light emission spectrum 57 having a peak at 527 nm, and an excitation spectrum 58 corresponding to light emission of the peak wavelength 527 nm. As is understood from FIG. 34, a long wavelength end of the excitation spectrum 58 of this phosphor spreads to approximately 525 nm, and the phosphor is excited by ultraviolet light, violet light, blue light or blue-green light, and exhibits green light emission. Similarly, FIG. 35 shows a light emission spectrum 59 and an excitation spectrum 60 of the europium activated calcium nitridoaluminosilicate phosphor of red light emission. The excitation spectrum 60 of this phosphor spreads from an ultraviolet region to yellow region, and it is understood that the phosphor is excited by ultraviolet light, violet light, blue light or green light, and also by yellow light, and exhibits red light emission. When a light source of white light emission is constituted by combining the above two kinds of phosphors with a violet LED and a blue phosphor, the blue phosphor is excited by the LED, the green phosphor is excited by the LED and blue phosphor, the red phosphor is excited by the LED, blue phosphor and green phosphor, and re-absorption and multiple excitation occur between the phosphors. In this light source, even if a large luminance degradation occurs in the blue phosphor due to a variation with time, the luminance variation of blue light also affects the luminance of the green phosphor and red phosphor, and the luminance variation as a whole is averaged. As a result, the suppression effect of chromaticity variation of white light can be obtained.

Table 1-1 is a list of half-value widths with respect to light emission spectra of phosphors used in the present invention. The numerical values in the Table show, as representative values, the half-value widths of light emission spectra corresponding to main peaks, with respect to the light emission spectra of the respective phosphors. As is understood from Table 1-1, although there are some exceptions, the half-value widths of most of the phosphors are 50 nm or more. If phosphors to be used are properly selected, it is possible to constitute a white light source in which all phosphors with half-value widths of 50 nm or more are combined.

TABLE 1-1

| Light emission colors | Phosphor compounds | Half-width values (nm) |
|---|---|---|
| Blue | europium activated alkaline earth phosphate phosphor | 50 |
| Blue | europium activated barium magnesium aluminate phosphor | 55 |
| Blue-green | europium activated strontium aluminate phosphor | 61 |
| Blue-green | europium and manganese activated barium magnesium aluminate phosphor | 12 |
| Green | europium activated orthosilicate phosphor | 65 |
| Green | europium activated β-sialon phosphor | 58 |
| Green | europium activated strontium sialon phosphor | 60 |
| Yellow | europium activated orthosilicate phosphor | 89 |
| Yellow | cerium activated rare earth aluminum garnet phosphor | 75 |
| Red | europium activated strontium sialon phosphor | 110 |
| Red | europium activated calcium nitridoaluminosilicate phosphor | 93 |
| Red | europium activated lanthanum oxysulfide phosphor | 15 |
| Red | manganese activated magnesium fluorogermanate | 33 |

A phosphor is mixed with a resin material, and is used in the form of a phosphor film (phosphor layer). The periphery of the LED chip is directly or indirectly covered with the phosphor layer. Thereby, primary light, which is emitted from the LED, is converted to secondary light (white light) by the phosphor layer, and the secondary light is radiated to the outside.

(Light Emission Characteristics of LED Module)

By using the above-described combination of the LED and phosphors, the white light source of the present invention can exhibit a light emission spectral distribution which is substantially equal to the light emission spectral distribution of sunlight. Accordingly, when the white light source of the present invention is used for illumination, high color rendering properties, which are equal to those of sunlight, can be exhibited, and an average color rendering index Ra can be set to 95 or more. Moreover, not only the mean value, but also all of the color rendering indexes R1 to R8 and special color rendering indexes R9 to R15 can be set to 85 or more.

Furthermore, according to a more preferable white light source of the present invention, it is possible to set the average color rendering index Ra to 97 or more, and set all of the color rendering indexes R1 to R8 and special color rendering indexes R9 to R15 to 90 or more.

Besides, when the white light source of the present invention is utilized not as illumination for inorganic objects such as works of art, but as illumination for human bodies, it is possible to realize illumination which is kind to human bodies as if it were sunlight. Along with the recent popularity of LED illumination, attention has been paid to the problems of blue light hazards. In regard to such problems, there is a concern over the various hazards to human bodies. For example, since the intensity of a blue light component included in the white emission light is excessively high, use over a long time leads to eye fatigue. Moreover, excessive exposure to LED white light at night leads to a disturbance of the human circadian rhythm. As regards conventional LED white light, white light is obtained by combining a blue LED with a yellow phosphor or the like, and this is considered to be a factor related to the above hazards. A phosphor generally exhibits a broad light emission spectrum, while a blue LED has an excessively sharp spectrum shape having a peak at a specific blue wavelength. Thus, if both are combined, only an unnatural white light emission spectral distribution with a spike of a blue wavelength region can be obtained. On the other hand, as described above, the light emission spectral distribution of the white light source of the present invention does not have an unnatural spike portion in the blue wavelength region, and the light emission spectrum of sunlight, including the blue wavelength region, can be reproduced. Therefore, the white light source of the present invention can be utilized as an illumination light source kind to human bodies, which is does not cause blue light hazards, etc.

Even if blue light has a possibility of being harmful to human bodies, a blue component of a fixed intensity needs to be included in white light, in order to obtain white illumination of high color rendering. If the object is to merely obtain white light with a small blue component, it should suffice to select a white light source with a low color temperature. The reason for this is that as the color temperature becomes lower, a relative content of a red component or the like included in the white light increases and a relative content of blue light or the like decreases. However, the object of the white light source of the present invention is to reproduce sunlight of all color temperatures. Accordingly, such reproduction cannot be restricted to only reproduction of a specific color temperature in consideration of the hazardous property to human bodies. Thus, in the present invention, a $P(\lambda)/B(\lambda)$ value, which will be described below, is adopted as an index which characterizes the properties of the white light source of the present invention, the $P(\lambda)/B(\lambda)$ value serving as the criterion for satisfying, at the same time, both the color rendering property for the purpose of use as illumination and the safety to human bodies.

Assuming that the light emission spectrum of the white light source of the present invention is $P(\lambda)$, the light emission spectrum of blackbody radiation of the corresponding correlated color temperature is $B(\lambda)$, and the spectrum of the spectral luminous efficiency is $$\int_{380}^{780} P(\lambda)V(\lambda)d\lambda = \int_{380}^{780} B(\lambda)V(\lambda)d\lambda \qquad (1)$$

the light emission spectrum of the white light source of the invention can satisfy, in a wavelength range of 400 nm to 495 nm, a relational expression:

$$P(\lambda)/B(\lambda) \leq 1.8 \qquad (2)$$

Accordingly, in the wavelength range of 400 nm to 495 nm, even if there is a wavelength region in which the intensity of $P(\lambda)$ exceeds the intensity of $B(\lambda)$, the intensity ratio (($P(\lambda)/B(\lambda)$)) between both in this wavelength region never exceeds 1.8 at maximum. Incidentally, in a more preferable white light source of the present invention, when $P(\lambda)V(\lambda)$ and $B(\lambda)V(\lambda)$ satisfy the above equation, a relational expression (5):

$$P(\lambda)/B(\lambda) \leq 1.5 \qquad (5)$$

can be satisfied in the wavelength range of 400 nm to 495 nm. Accordingly, the white light source of the present invention exhibits a gentler, smoother, continuous spectrum, without an excessive spike of light emission intensity at a specific wavelength in the blue wavelength region.

The lower limit value of the above-described $P(\lambda)/B(\lambda)$ value is not particularly limited. When sunlight is reproduced, it is preferable that the $P(\lambda)/B(\lambda)$ value indicates a value close to 1. The reason for this is that if light of wavelengths of 495 nm or less is deficient, the color of an illumination target cannot be reproduced as a natural color. However, as described above, the white light source of this invention is a light source which can exhibit fixed values or more of the average color rendering index and special color rendering indexes. In addition, as indicated by the above expressions (3) and (4), the white light source of this invention has the feature that approximation is made to the light emission spectrum of blackbody radiation over the entire visible light wavelength range. Accordingly, even if the lower limit value of the $P(\lambda)/B(\lambda)$ value is not particularly set, the substantial characteristics required for the white light source of the present invention are satisfied. The $P(\lambda)/B(\lambda)$ value of the white light source indicates the ratio of a blue light component which is excessively included, compared to the light emission spectrum of blackbody radiation of the same color temperature. From the standpoint of the degree of influence on human bodies, the upper limit value of the $P(\lambda)/B(\lambda)$ value is particularly important.

In the white light source of this invention, white light emission is obtained by the combination of phosphor light emissions. It is preferable that as much energy of primary light as possible from the LED is absorbed in the phosphor. At the same time, it is necessary to prevent LED light from leaking to the outside of the light source. In particular, when ultraviolet is included in the LED light, it is possible that the body color of a work of art or the like is damaged, or a harmful effect is exerted on the skin or the like of the human body. Thus, the prevention of leakage is strongly required.

In the LED module of this invention, in order to prevent leakage of ultraviolet, a phosphor layer is formed to have a sufficient film thickness. The phosphor layer is formed as a thick film, in order to prevent LED light, which is reflected by the surface of each phosphor particle, from leaking to the outside of the light source through the phosphor layer. At this time, if the thickness of the phosphor layer is too large, the emission light itself of the phosphor cannot exit from the phosphor layer, and the light emission intensity of the phosphor layer lowers. It is generally known that the particle size of a phosphor and the optimal film thickness have a proportional relationship. In the phosphor layer of this invention, a phosphor, whose particles are as large as possible in practical use, is used, and the phosphor layer is formed as thick as possible. For this purpose, it is preferable that the phosphor used in the LED module of this invention has an average particle size in a range of 5 μm to 50 μm. A more preferable range of the average particle size is 10 μm to 40 μm. It is preferable that the thickness of the phosphor layer corresponding to this average particle size is in a range of 0.07 mm to 1.5 mm. A more preferable range is 100 μm to 1000 μm. In addition, it is preferable that the content of the phosphor in the phosphor layer is set such that the mass ratio of the phosphor in the phosphor layer is in a range of 60 mass % to 90 mass %. When the phosphor content is less than 60 mass %, there is concern that even if the phosphor layer is made thick, the phosphor content in the phosphor layer becomes deficient. If the phosphor content is deficient, part of LED light passes through a gap between phosphor particles and leaks out of the white light source. On the other hand, if the phosphor content is too large, no problem arises with respect to the leakage of LED light, but the amount of the binder, which binds phosphor particles, is too small, and a problem arises with respect to the physical strength of the phosphor layer. In the above manner, an LED module can be obtained which suppresses leakage of ultraviolet to 0.4 mW/lm or less, and which avoids a reduction in light emission of the phosphor layer to the extent possible.

In order to make it doubly sure to prevent ultraviolet leakage, an ultraviolet absorption film may be formed on the outside of the phosphor layer. In this case, as an ultraviolet absorption/reflection material, use can be made of fine particle white pigments such as zinc oxide, titanium oxide, aluminum oxide, etc. Like the phosphor layer, these fine particle pigments are dispersed in a resin, and an ultraviolet absorption film is formed directly or indirectly on the outside of the phosphor layer. Thereby, the LED module of the objective can be obtained. In the thus obtained LED module of this invention, the amount of ultraviolet leaking to the outside of the module can be reduced to 0.4 mW/lm or less.

The numerical value of the amount of ultraviolet can be calculated by the following method. Assuming that the light emission spectrum of white light emitted from the light emission device is $P(\lambda)$, and the spectrum of the spectral luminous efficiency is $V(\lambda)$, both the $P(\lambda)$ and the $V(\lambda)$ are multiplied and integrated, and the following p is calculated.

$$\phi = 683 \cdot \int P(\lambda) \cdot V(\lambda) d\lambda \qquad (7)$$

In equation (7), 683 is a constant which satisfies 1 W=683 Lm at a wavelength of 555 nm.

As regards primary light energy emitted from the LED, a spectrum $F(\lambda)$ is integrated in a range of 360 to 420 nm by the following equation, and UV below is calculated.

$$UV = \int_{360}^{420} P(\lambda) d\lambda \qquad (8)$$

The primary light energy per light flux, which is emitted from the light emission device, can be calculated by UV/φ.

As described above, the white light source of the present invention has substantially the same light emission spectrum shape as that of sunlight, and also has substantially the same intensity level of the light emission spectrum in the wavelength region of blue light as sunlight. When it is desired to more surely reduce the intensity of blue light or violet light, or to make this intensity lower than the light emission intensity of the blue component or violet component included in the sunlight, a leakage prevention film for such light emissions may be formed. In this case, as absorption materials of violet light or blue light, fine particle pigments of zirconium oxide or silicon oxide can be used. Like the phosphor layer, these fine particle pigments are dispersed in a resin, and an absorption film is formed directly or indirectly on the outside of the phosphor layer. Thereby, the LED module of the objective can be obtained. In addition, as a method having the same advantageous effect as the above-described indirect method, a measure may be taken by forming an evaporation deposition film of zirconium oxide or silicon oxide on a transparent cover of a white light source, for example, a transparent globe member of an LED bulb.

(White light source system)

FIG. 27 illustrates an example of a white light source system of an embodiment. As illustrated in the Figure, the white light source system of the embodiment includes a white light source unit 21 and a controller 22. The white light source unit 21 includes a substrate 23, a plural of white light sources 24 disposed on the substrate 23, and a light emission device cover 25 which is fixed to the substrate 23 in a manner to cover the plural white light sources. Each of the white light sources 24 is composed of an LED module. The LED module includes an LED chip 26 disposed on the substrate 23, and a phosphor layer 27 which is disposed on the substrate 23 and covers the LED chip 26. A wiring network is provided on the substrate 23, and electrodes of the LED chips 26 are electrically connected to the wiring network. In the meantime, the light emission device cover 25 may be provided with a lens (not shown) which is disposed on an outer surface of a wall portion facing the substrate 23. Besides, at least a part of the light emission device cover 25 may be formed as a transparent portion which can take out light. It is preferable that the transparent portion is formed in a wall portion on the side opposed to the substrate 23. Moreover, a reflector (not shown) can be disposed, for example, on an inner surface of the light emission device cover 25.

The controller 22 includes a control unit 28, a memory unit 29, and a data input/output unit 30. The white light sources 24, which are composed of the LED modules, are connected to electronic circuit (not shown) of the control unit 28 by wiring lines 31. The white light sources 24 emit light by being supplied with electric current flowing from the control unit 28 via the wiring lines 31. In the electronic circuit memory unit 29 of the control unit 28, one-day variation data of sunlight is stored with respect to each of places and each of seasons (times of year). In order to obtain an illumination light source of a desired pattern, a system user inputs place information, such as a city name or latitude/longitude, and time information, such as a season, to the data input/output unit 30. The obtained data is delivered to the control unit 28. The control unit 28 extracts stored data corresponding to the input data, reads data of correlated color temperatures and illuminance of sunlight with respect to which the place and season were specified, and calculates, based on these data, the mixture intensity ratio of respective white light sources. Based on the calculation result, the electronic circuit of the control unit 28 controls the value of electric current which is applied to each white light source 24, and can reproduce characteristic variations of required sunlight.

In the white light source system, the LED module including the LED and phosphor is used. The LED module includes a substrate, an LED chip disposed on the substrate, and a phosphor layer formed in a manner to cover the periphery of the LED chip.

It is preferable that a material, such as alumina, aluminum nitride, silicon nitride or glass epoxy, is used for the substrate. In particular, it is more preferable to select an alumina substrate or a glass epoxy substrate, judging comprehensively from the standpoints of heat conductivity, resistance to ultraviolet to violet light, insulation, reflectance, cost, etc. It is possible to use one kind or two or more kinds of materials which constitute the substrate.

As the material of the LED, any material may be used provided the material emits ultraviolet to violet light. For example, a GaN-based material, such as InGaN, GaN or AlGaN, can be used.

For example, as illustrated in FIG. 28, in an LED module 50, a great number of LED chips 52 are arranged linearly on a substrate 51. The number of chip lines may be one or more. A plural of chip lines can be arranged in accordance with the number of chips that are used. For example, in FIG. 28, a plural of chip lines are arranged in a matrix. It is preferable that the LED chips 52 are arranged with a highest possible density. However, if the distances between the LED chips 52 are too short, mutual absorption of LED emission light occurs between the LED chips 52, and this is undesirable. In addition, in order to promote the radiation of heat generated by the LED chips 52 at a time of continuous lighting, it is preferable to arrange the LED chips 52 at proper intervals. In the meantime, the arrangement of the chips is not limited to the linear arrangement. Also when the chips are arranged in a staggered fashion or the like, the arrangement with the same high density can be realized.

In FIG. 28, the respective LED chips 52 are connected by wires 53, and are connected to electrodes 54. The electrodes 54 have a pattern, and serve also as conductors on the substrate 51. It is preferable that at least one kind of metal selected from among Ag, Pt, Ru, Pd, and Al is used as the material of the conductors. It is also preferable that an Au film is formed on the surface of the metal in order to prevent corrosion or the like. The Au film may be formed by using any one of a printing method, an evaporation deposition method and a plating method.

Figure 31:
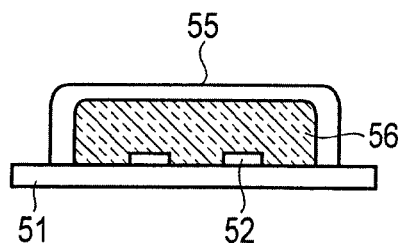
FIG. 31 is a cross-sectional view illustrating a third example of the LED module used in the white light source system.
Figure 32:
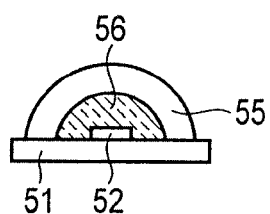
FIG. 32 is a cross-sectional view illustrating a fourth example of the LED module used in the white light source system.
Figure 33:
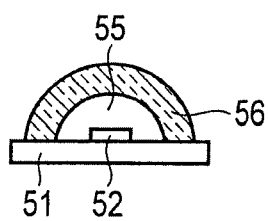
FIG. 33 is a cross-sectional view illustrating a fifth example of the LED module used in the white light source system.

The periphery of the LED chip 52 on the substrate 51 is directly or indirectly covered with a phosphor layer. FIG. 29 to FIG. 33 illustrate examples of disposition of the phosphor layer. As illustrated in FIG. 29, a phosphor layer 55 may be directly formed on the surface of the LED chip 52. As illustrated in FIG. 30, after the periphery of the LED chip 52 is covered with the phosphor layer 55, the periphery of the phosphor layer may be covered with a transparent resin layer 56. In addition, as illustrated in FIG. 31, after the surface of the LED chip 52 is covered with the transparent resin layer 56, a substantially entire surface of the transparent resin layer 56 may be covered with the phosphor layer 55. In FIG. 29 to FIG. 31, a plural of LED chips 52 are covered with a single phosphor layer 55 or transparent resin layer 56. Alternatively, as illustrated in FIG. 32 and FIG. 33, a single LED chip 52 may be coated with a single phosphor layer 55 or single transparent resin layer 56. Besides, as one of applied examples, such a multilayer structure may be adopted that the periphery of a single or plural LED chips are covered with a transparent resin layer, a phosphor layer is formed on the outside of the transparent resin layer, and an additional transparent resin layer is formed on the outside of the phosphor layer.

In the above-described various film structures, the purpose of forming the transparent resin layer is to average light emission intensities. When a plural of LED chips are arranged in a certain pattern, both a location where LED chips exist and a location where no LED chip exists are present on the substrate. If the peripheries of the LED chips of such a pattern are covered with a phosphor layer, the light emission intensity is high in the part where the LED chips exist, and the light emission intensity is low in the part where no LED chip exists. Thus, a uniform light emission over the entire surface of the phosphor layer cannot be obtained. At this time, if a transparent resin layer is formed on the inner surface or outer surface of the phosphor layer, it becomes easier to obtain uniform light over the entire layer. The reason for this is that if the transparent resin layer is formed on the inner surface of the phosphor layer, primary light from the LEDs is scattered in the transparent resin layer. On the other hand, if the transparent resin layer is formed on the outer surface of the phosphor layer, secondary light from the phosphor is scattered in the transparent resin layer. Aside from the case in which the number of LED chips is plural, even in the case in which the number of LED chips is one, the same advantageous effects can be obtained. Although a general shape of the LED chip is rectangular parallelepipedic, the light emission intensities of light emitted from the respective planes of the rectangular parallelepiped are not equal, and a light intensity distribution occurs depending on directions of emission. Accordingly, if the transparent resin layer is formed on the inner surface or outer surface of the phosphor layer which covers the periphery of the LED chip, the light emission intensity can be averaged, like the case in which the number of LED chips is plural.

As described above, the averaging of light emission intensity is obtained by the light scattering effect in the transparent resin layer. A greater scattering effect is exhibited by using, instead of a simple transparent resin layer, a resin layer in which particulate inorganic compound powder is contained. Examples of the inorganic material powder, which is contained in the resin layer, include silica powder such as fumed silica (dry silica) or precipitated silica (wet silica), alumina powder such as fumed alumina or pulverized alumina, and metal oxide powder such as cerium oxide powder, zirconium oxide powder, titanium oxide powder or barium titanate powder. One kind or two or more kinds of inorganic materials can be used. Of these inorganic materials, the silica powder and alumina powder are preferable as an inorganic compound powder to be contained in the transparent resin layer, since the silica powder and alumina powder are inexpensive and can easily be made into fine particles. In particular, fumed silica and fumed alumina are suitable since spherical ultra-fine particles can easily be obtained.

In addition, it is preferable that the maximum particle size of the inorganic material powder is ¼ or less of the wavelength of light passing through the transparent resin layer. If the inorganic compound powder having the maximum particle size of ¼ or less of the wavelength of light is used, the passing light is properly scattered, the intensity of light emitted from the light source is averaged, and the light distribution can be improved. When the maximum particle size exceeds ¼ of the wavelength of light, it is highly probable that the light emitted from the LED or phosphor is reflected by fine particles of the inorganic material, and is returned to the inside of the light source (the LED chip side). The lower limit value of the maximum particle size of the inorganic material powder is not particularly limited from the aspect of the scattering effect. However, it is difficult to obtain extremely fine particles from the industrial aspect. Besides, from the aspect of handling of powder, the lower limit value of the maximum particle size should preferably be greater than several nm, and more preferably be several-ten nm or more.

A concrete maximum particle size of the inorganic material powder is 140 nm or less for yellow light of 560 nm, and is 105 nm or less for violet light of 420 nm. The minimum wavelength of passing light is ultraviolet in a case of using an LED having a light emission peak at 360 nm. If inorganic material powder having the maximum particle size of 90 nm is used, this inorganic material powder is adaptive to transparent resin layers in all cases.

It is preferable that the above-described inorganic compound powder is contained in the transparent resin layer in a range of 0.1 to 5 mass %. If the content of inorganic compound powder in the transparent resin layer is less than 0.1 mass %, there is concern that the light scattering effect by the inorganic compound powder cannot fully be obtained. On the other hand, if the content of inorganic compound powder in the transparent resin layer exceeds 5 mass %, multiple scattering of light, or the like tends to easily occur, and there is concern that the amount of light extracted to the outside of the light source decreases. It is more preferable that the content of inorganic compound powder in the transparent resin layer is 1 mass % or more.

The phosphor layer may contain a transparent resin material. On the other hand, the transparent resin layer may mainly consist of a transparent resin material, but may contain some other component such as a phosphor or inorganic material powder. Any kind of such transparent resin material may be used if the material has sufficient strength, heat resistance and transparency. Concretely, it is preferable to use silicone resin, epoxy resin, etc. In particular, like the present invention, when the transparent resin layer is used in combination with the LED of ultraviolet emission, it is more preferable to use silicone resin which is excellent in characteristic of resistance to degradation due to ultraviolet.

When the silicone resin is used as the transparent resin material, it is preferable to use, for the substrate material, an alumina substrate having a water absorption coefficient in a range of 5 to 60%. By using the alumina substrate having a proper water absorption coefficient, the strength of adhesion to the silicone resin-containing layer (e.g., silicone resin-containing transparent resin layer and silicone resin-containing phosphor layer) is improved. Specifically, the adhesion strength between the alumina substrate and silicone resin-containing layer can be set at 1 N (100 gf) or more. It is assumed that the water absorption coefficient of the alumina substrate indicates a value measured by a water absorption coefficient evaluation method disclosed in EMAS-9101. It is assumed that the adhesion strength between the alumina substrate and the silicone resin-containing layer indicates a pushing force at a time when the silicone resin-containing layer (phosphor layer) was pushed from the side surface thereof by a tension gauge, and the silicone resin-containing layer (phosphor layer) was peeled.

According to the alumina substrate having the water absorption coefficient of 5% or more, since silicone resin is properly permeated therein, the strength of adhesion to the silicone resin-containing layer can be enhanced. When the water absorption coefficient of the alumina substrate is less than 5%, the permeation of silicone resin is weak, and a sufficient adhesion strength cannot be obtained. However, if the water absorption coefficient of the alumina substrate exceeds 60%, the silicone resin is excessively permeated, and it becomes difficult to form the silicone resin-containing layer (phosphor layer) in a predetermined shape. It is more preferable that the water absorption coefficient of the alumina substrate is in a range of 20 to 50%.

The water absorption coefficient of the alumina substrate can be adjusted, for example, by varying the firing temperature at a time of baking the substrate. Concretely, in accordance with the material for forming the alumina substrate, etc., the temperature at a time of baking the substrate is properly adjusted in a range of 1100 to 1500° C. Thereby, the alumina substrate having a proper water absorption coefficient (in a range of 5 to 60%) can be obtained.

By using the above-described alumina substrate, the adhesion strength between the alumina substrate and the silicone resin-containing layer can be set at 1 N or more. The same applies to the case in which a transparent silicone resin-containing layer is interposed between the LED chip and phosphor layer, and the adhesion strength between the alumina substrate and the transparent silicone resin-containing layer can be set at 1 N or more. In this manner, by setting the adhesion strength between the alumina substrate and the silicone resin-containing layer or transparent silicone resin-containing layer at 1 N or more, the handling efficiency of the LED module is enhanced. Specifically, the peeling of the silicone resin-containing layer at a time of handling is suppressed. Therefore, a failure in lighting or damage due to the peeling of the silicone resin-containing layer can be suppressed, while good reproducibility is obtained.

EXAMPLES

Hereinafter, methods of successively reproducing the variations of sunlight and methods of reducing ultraviolet and blue light components, which are included in white light to be reproduced, will be concretely described.

Example 1

To begin with, six kinds of white light sources were formed by combining four kinds of phosphors, namely a blue phosphor, a green phosphor, a yellow phosphor and a red phosphor, and an LED. Specifically, phosphors with compositions described in Table 1-2 were mixed at predetermined ratios described in the Table, and white lights of six kinds of color temperatures were obtained. Powder with an average particle size of 25 to 35 μm was used for each phosphor, and a slurry in which the powder was dispersed in a silicone resin was applied to the periphery of an LED chip. Thereby, an LED module was formed. The thickness of the phosphor layer was adjusted in a range of 500 to 700 μm, and the density of the phosphor powder in the phosphor layer was adjusted in a range of 70 to 80 mass %. In addition, a GaN-based LED having a light emission peak at 410 nm was used as the LED. A reflector, a lens and a cover were attached to this LED module, and electronic circuit was connected to the LED module. Thus, white light sources of this Example were prepared.

TABLE 1-2

| Light source No. | Color temperatures | Blue phosphor Wt % | Green phosphor Wt % | Yellow phosphor Wt % | Red phosphor Wt % |
|---|---|---|---|---|---|
| 1 | 2000K + 0.0075 duv | europium activated alkaline earth phosphate phosphor 82 | europium activated strontium sialon phosphor 4 | europium activated orthosilicate phosphor 4 | europium activated calcium nitridoaluminosilicate phosphor 10 |
| 2 | 3200K + 0.0075 duv | europium activated barium magnesium aluminate phosphor 84 | europium activated β-sialon phosphor 3 | cerium activated rare earth aluminum garnet phosphor 4 | europium activated strontium sialon phosphor 9 |
| 3 | 6500K + 0.0125 duv | europium activated alkaline earth phosphate phosphor 92 | europium activated orthosilicate phosphor 3 | europium activated orthosilicate phosphor 4 | europium activated calcium nitridoaluminosilicate phosphor 1 |
| 4 | 6500K − 0.0050 duv | europium activated alkaline earth phosphate phosphor 95 | europium activated orthosilicate phosphor 2 | cerium activated rare earth aluminum garnet phosphor 1 | europium activated strontium sialon phosphor 2 |
| 5 | 3100K − 0.0050 duv | europium activated barium magnesium aluminate phosphor 85 | europium activated strontium sialon phosphor 3 | europium activated orthosilicate phosphor 2 | europium activated calcium nitridoaluminosilicate phosphor 10 |
| 6 | 2000K − 0.0050 duv | europium activated alkaline earth phosphate phosphor 86 | europium activated β-sialon phosphor 2 | cerium activated rare earth aluminum garnet 2 | manganese activated magnesium fluorogermanate phosphor 10 |

Next, using the above six kinds of white light sources, a one-day variation of sunlight at a specific place was reproduced. The reproduced variation is a one-day variation in Yokohama in spring (May 14, 2015). The data used for reproduction are data obtained by measuring sunlight emission spectra for about every three minutes from sunrise to sunset in the same day. Of these data, FIG. 5 extracts and shows light emission spectra of sunlight at 7:00 a.m., 12:00 p.m. and 6:45 p.m. in the same day. With respect to the sunlight at the three kinds of time instants, the respective correlated color temperatures were calculated based on the light emission spectrum data. The results of calculation were 4236 K+0.004 duv at 7:00 a.m., 5704 K+0.001 duv at 12:00 p.m., and 2990 K−0.004 duv at 6:45 p.m.

To begin with, the sunlight emission spectra at the three time instants were reproduced by using the above six kinds of white light sources (white light sources 1 to 6) of the present invention. The mixture ratios of the respective light source colors are as shown in Table 2. The numerals in the Table indicate intensity ratios (relative values). In addition, light emission spectral distributions of three kinds of white light sources are as shown by curves 6 to 8 in FIG. 6. If these light emission spectrum shapes are compared with light emission spectra of blackbody radiation of the same color temperature, it is understood that the overall shapes of both show good agreement, aside from microscopic irregularities appearing in the light emission spectrum curves. In particular, in the wavelength range of 400 nm to 650 nm to which human eyes have high sensitivity, both showed very similar curves.

TABLE 2

| Time instant | Light source 1 | Light source 2 | Light source 3 | Light source 4 | Light source 5 | Light source 6 |
|---|---|---|---|---|---|---|
| A | 07:00 | 40 | — | — | — | 25 | 35 |
| B | 12:00 | — | 40 | 10 | 20 | 30 | — |
| C | 18:45 | 40 | — | — | — | 5 | 55 |

With respect to the light emission spectra of light sources A to C and the light emission spectra of blackbody radiation of the same color temperatures as the correlated color temperatures of the respective light sources, difference spectra between both were calculated.

Figure 8:
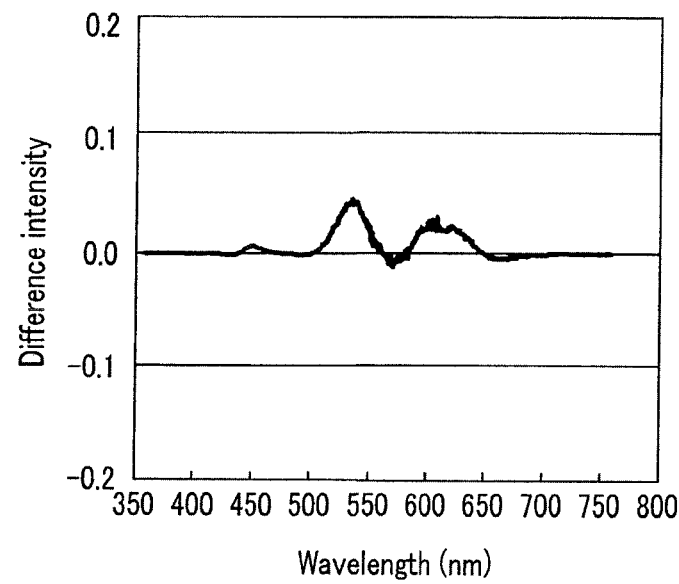
FIG. 8 is a graph showing a difference spectrum between a light emission spectrum of a light source B and a blackbody radiation spectrum having the same color temperature.
Figure 9:
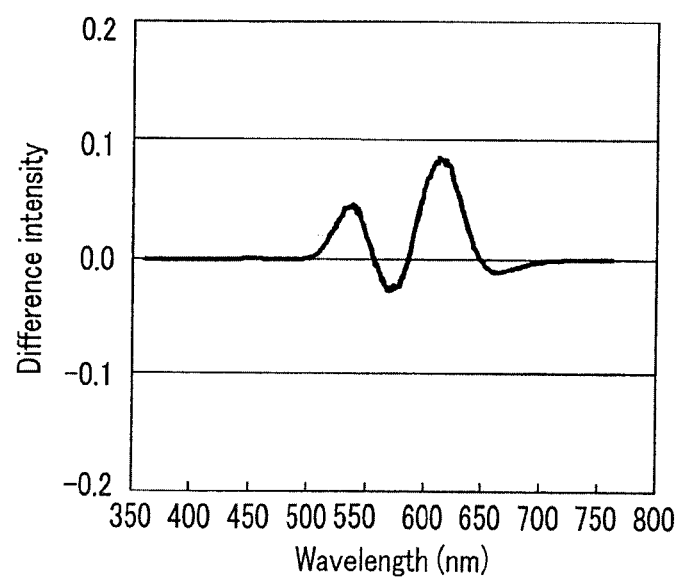
FIG. 9 is a graph showing a difference spectrum between a light emission spectrum of a light source C and a blackbody radiation spectrum having the same color temperature.

The difference spectrum is obtained as follows. When $P(\lambda)$ is the light emission spectrum of each white light source; $B(\lambda)$ is the light emission spectrum of blackbody radiation having the same color temperature as the white light source; $V(\lambda)$ is the spectrum of a spectral luminous efficiency; $\lambda$ max 1 is the wavelength at which $P(\lambda) \times V(\lambda)$ becomes largest; and $\lambda$ max 2 is the wavelength at which $B(\lambda) \times V(\lambda)$ becomes largest, $$[(P(\lambda) \times V(\lambda))/(P(\lambda\ \text{max}\ 1) \times V(\lambda\ \text{max}\ 1)) - (B(\lambda) \times V(\lambda))/(B(\lambda\ \text{max}\ 2) \times V(\lambda\ \text{max}\ 2))]$$

is calculated. The difference spectrum is obtained by plotting the calculated value over the visible light wavelength range of 380 nm to 780 nm. As is understood from FIG. 7 to FIG. 9, with respect to each of the light sources A, B and C, the difference spectrum is in the range of ±0.1 or less, and satisfies the above expression (3). Thus, each of the light sources has characteristics suitable for the white light source of the present invention.

Next, the color rendering indexes of these light sources were calculated. With respect to the three kinds of light sources, the data of each spectrum intensity was calculated at intervals of 5 nm over the wavelength range of 380 nm to 780 nm. Then, calculations were made according to the method described in JIS-8726, and the average color rendering index and special color rendering indexes were calculated. The results are shown in Table 3 below. The white light sources of Example 1 indicate high values in all evaluation indices, and exhibit excellent color rendering properties which are substantially equal to those of sunlight.

TABLE 3

| | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Light source A | 97.3 | 97.6 | 97.7 | 98.0 | 97.3 | 97.6 | 96.0 | 97.0 | 97.1 | 90.5 | 95.1 | 96.0 | 94.7 | 97.2 | 98.9 | 98.8 |
| Light source B | 98.4 | 98.1 | 98.6 | 99.7 | 98.6 | 98.2 | 97.6 | 98.1 | 98.4 | 98.5 | 97.7 | 97.9 | 91.4 | 98.0 | 99.4 | 98.0 |
| Light source C | 97.5 | 97.7 | 98.5 | 99.0 | 96.6 | 97.3 | 96.0 | 98.0 | 96.9 | 87.0 | 97.7 | 93.6 | 94.9 | 97.4 | 98.6 | 99.4 |

Each of the white light sources of Example 1 employs the LED module in which the violet emission LED having the light emission peak at 410 nm and the four kinds of phosphors are combined. In general, the LED has a light emission spectrum having a sharp shape at a light emission peak wavelength, and the phosphor has a broad light emission spectrum. Thus, the whole spectrum shape tends to become unnatural, with a spike of light emission of the LED. However, the light emission peak of the LED used in Example 1 exists not in the blue region but in the violet region. Blue light is not conspicuous, and most of violet light emitted from the LED is absorbed by the phosphor. Thus, the amount of LED light leaking to the outside of the module is small. Therefore, the white light source of the present invention can be configured as a white light source which is kind to human bodies, with no fear of blue light hazards, etc.

As regards the white light sources of the present invention, in order to quantitatively evaluate the above advantageous effects, the value of $P(\lambda)/B(\lambda)$ of each white light source was obtained by calculation. If the light source C is taken as an example, the calculation method of the $P(\lambda)/B(\lambda)$ value is as follows. To begin with, the light emission spectral distribution of the light source C is measured by using a spectral distribution measuring device.

Various kinds of devices have recently been commercially available as the spectral distribution measuring device. If there is no problem with precision, the type of device does not need to be particularly restricted. A concrete shape of the light emission spectrum is as shown by the curve 8 in FIG. 6, as already described, and this emission spectrum is set as $P(\lambda)$. If a light emission color temperature point on the xy chromaticity diagram is calculated by using the light emission spectral distribution data of this $P(\lambda)$, it is understood that the light source C is a white light source of a correlated color temperature of 2990 K−0.004 duv. Accordingly, the light emission spectrum $B(\lambda)$ of the corresponding blackbody has the color temperature of 2990 K. Hence, by substituting 2990 K for the color temperature (T) in the above equation (6), the concrete spectrum shape can be obtained.

By comparing the light emission intensities of the obtained $P(\lambda)$ and $B(\lambda)$, the $P(\lambda)/B(\lambda)$ value can be calculated. However, if the obtained light emission spectral distributions are compared as such, the result will vary in any way, depending on the method of calculation. Thus, by setting a condition under which the total energy of both becomes an identical value, the P(λ) and B(λ) which satisfy this condition were calculated, and then both were compared. The concrete condition is that the following equation (1) is satisfied:

$$\int_{380}^{780} P(\lambda)V(\lambda)d\lambda = \int_{380}^{780} B(\lambda)V(\lambda)d\lambda \quad (1)$$

Figure 10:
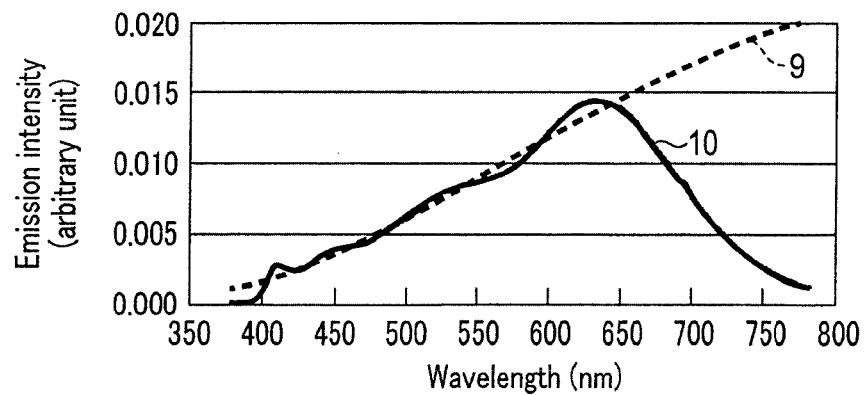
FIG. 10 is a graph comparing spectral intensities of $P(\lambda)V(\lambda)$ of the light source C and $B(\lambda)V(\lambda)$ of blackbody radiation having the same color temperature.

In the equation, V(λ) is the spectral distribution of the spectral luminous efficiency, and each spectral distribution of the P(λ) and B(λ) which satisfy the above equation (1) was obtained by calculation. If the P(λ) and B(λ) after correction are shown together in one graph, spectral distributions shown in FIG. 10 are obtained. A curve 9 is B(λ) after correction, and a curve 10 is P(λ) after correction.

In FIG. 10, if intensities of both spectral distributions are compared in the range of 400 nm to 495 nm, there are approximately three points where the emission intensity of P(λ) exceeds the emission intensity of B(λ). In such wavelength regions, if the maximum value of the P(λ)/B(λ) ratio is calculated, the value of 1.37 was obtained. This means that, in all wavelengths of 400 nm to 495 nm, the emission intensity of P(λ) is 1.37 times or less the emission intensity of B(λ).

In the present invention, as regards the P(λ)/B(λ) of each white light source, the maximum value of the P(λ)/B(λ) ratio as calculated in the above is adopted as a representative value, and is set as an evaluation reference of each white light source. Specifically, if the P(λ)/B(λ) value exceeds 1 and indicates a greater value, this means that an excessive and large amount of visible light of 400 nm to 495 nm included in each white light source, in particular, blue light, is included relative to the visible light of the same wavelength range included in the light emission spectrum of the blackbody. From the above, it is understood that the light source C satisfies the relationship of the following expression (9) in the wavelength range of 400 nm to 495 nm:

$$P(\lambda)/B(\lambda) \leq 1.37 \quad (9)$$

Figure 11:
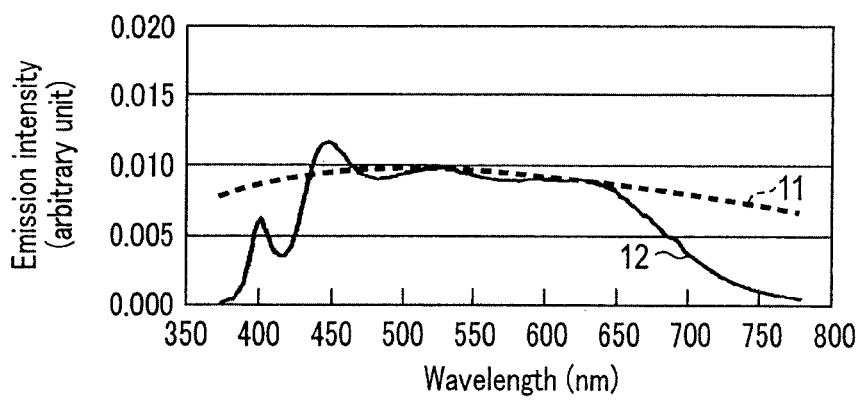
FIG. 11 is a graph comparing spectral intensities of $P(\lambda)V(\lambda)$ of the light source B and $B(\lambda)V(\lambda)$ of blackbody radiation having the same color temperature.
Figure 12:
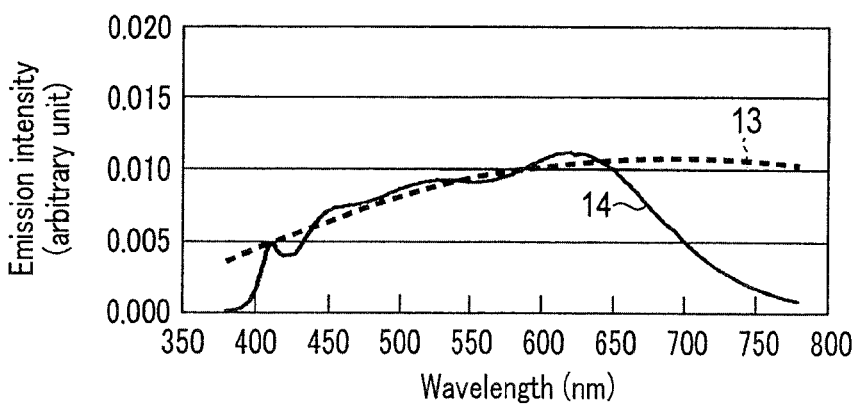
FIG. 12 is a graph comparing spectral intensities of $P(\lambda)V(\lambda)$ of the light source A and $B(\lambda)V(\lambda)$ of blackbody radiation having the same color temperature.

If the same relationship is confirmed with respect to the light sources B and A in Table 3, spectral curves of FIG. 11 and FIG. 12 can be obtained. It was found that the light source B satisfies the following expression (10):

$$P(\lambda)/B(\lambda) \leq 1.26 \quad (10)$$

and that the light source A satisfies the following expression (11):

$$P(\lambda)/B(\lambda) \leq 1.07 \quad (11)$$

Accordingly, the white light sources C, B and A are regarded as light sources which exhibit smooth light emission spectra with less irregularities in the blue wavelength region, and scarcely exert a harmful effect on the circadian rhythms of human bodies.

In addition, in the LED modules of Example 1, the amount of ultraviolet leaking from the module is reduced. When the LED primary lights leaking from the light sources of the Example were calculated by using the above equations (7) and (8), the LED primary lights were all 0.1 mW/lm, and were very weak. Accordingly, when the white light sources of Example 1 were used as illumination for works of art or the like, the pigments or the like used in the works of art were not deteriorated. When the white light sources of Example 1 were used as illumination for human bodies, the skin or eyes of human bodies were not damaged, and suitable illumination for these purposes was successfully obtained.

In the above, the various characteristics of the white light sources of Example 1 were described. However, only typical white lights of the morning, daytime and evening were described. Actually, the white light having the above characteristics can be reproduced as light with one-day continuous variations. FIG. 13 is a graph showing one-day variations in Yokohama in spring (May 14, 2015). Using the light emission spectrum data of sunlight measured every three minutes, the values of respective correlated color temperatures were calculated, and sunlight was reproduced by determining the mixture ratio of the light source 1 to light source 6 such that predetermined correlated color temperatures can be obtained. In addition, based on the actual measurement data, the variation of illuminance was plotted as an illuminance ratio (%), by calculating relative values with reference to a certain value.

In FIG. 13, a curve 15 indicates the variation of the correlated color temperature, and a curve 16 indicates an illuminance variation. The one-day variation in Yokohama in spring was such that the illuminance became brighter with the sunrise, the illuminance took a maximum value at around 11:00 a.m. and then remained high until after 1:00 p.m., and the illuminance gradually decreased toward sunset. On the other hand, as regards the color temperature, the sun in crimson of about 2200 K appeared at sunrise, the color temperature increased in accordance with the increase of illuminance, warm white changed to white and to daylight white, and the color temperature reached about 6000 K at maximum at around 12:00 p.m. Thereafter, with the progress reverse to the morning, the color temperature decreases back to 2300 K at around 7:00 p.m., and then the sun set.

In the white light source system of the present invention, the variations with time of the color temperature and illuminance shown in FIG. 13 were reproduced by controlling the values of electric currents applied to the white light sources. To begin with, in order to obtain white light of a correlated color temperature, the intensity ratio of electric currents applied to the light source 1 to light source 6 was determined. Next, in order to adapt to the variation of illuminance, the intensity of the total electric current was adjusted such that a predetermined illumination can be obtained while the above-described current ratio is maintained. In the white light source of the present invention, the program control of current values is executed such that the data of the variation with time shown in FIG. 13 can be adjusted based on the actual measurement values every three minutes, and the variation with time of the sunlight was reproduced.

This white light source system was applied as illumination for an art museum, a hospital, and a home. In this illumination, instantaneous characteristics of sunlight are not reproduced, but light emission characteristics, which vary from time to time, are reproduced. Good influence on the circadian rhythms which human bodies have can be expected. Moreover, in the characteristic variation of white illumination, gentle variations, which are not perceptible to human eyes, are reproduced. Thus, such variations are perceived by humans as very natural variations like sunlight. Accordingly, even inpatients or the like, who are physically weak, can accept the reproduced light as natural illumination.

Comparative Example 1

A white light source of a specific color temperature, which is located on the locus of blackbody radiation, was created, regardless of the spectrum shape of sunlight. A LED module, which was used, is a combination of a blue LED and a yellow phosphor. An InGaN-based LED having a light emission peak wavelength at 448 nm was used for the LED. A europium activated orthosilicate phosphor having a peak wavelength at 560 nm was used for the phosphor. The average particle size of the phosphor was 7 μm. A phosphor slurry was created by dispersing the phosphor particles in a silicone resin. The slurry was uniformly applied in a manner to cover the LED chip disposed on the substrate. Thereby, the LED module was formed. The film thickness of the phosphor layer was about 65 μm, as a result of adjustment to such a thickness that desired white light is obtained by mixing blue light of the LED and yellow light of the phosphor.

Figure 15:
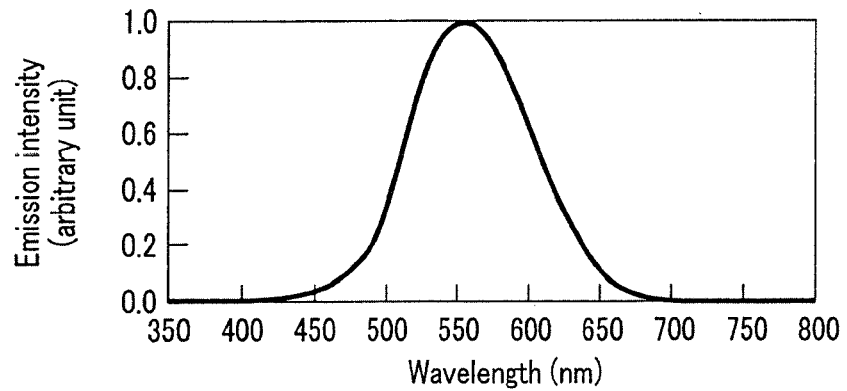
FIG. 15 is a graph relating to a blackbody radiation spectrum of a color temperature corresponding to the white light source of Comparative Example 1, and presents $B(\lambda) \times V(\lambda)/(B(\lambda \text{ max } 2) \times V(\lambda \text{ max } 2))$.
Figure 16:
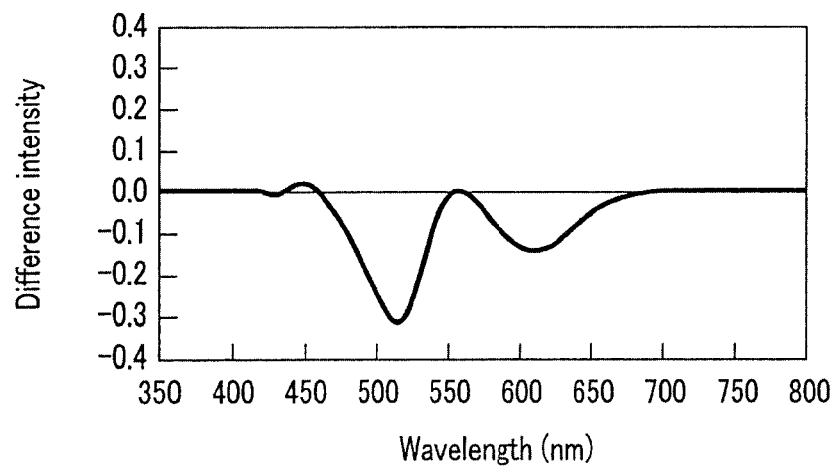
FIG. 16 is a graph showing a difference spectrum between the white light source of Comparative Example 1 and the blackbody radiation spectrum of the corresponding color temperature.

A reflector, a lens and a cover were attached to this LED module, and electronic circuit was connected to the LED module. Thus, a white light source of this Comparative Example was fabricated. The color temperature of the obtained white light source was 6338 K, and the light emission spectrum characteristic, $(P(\lambda) \times V(\lambda)/(P(\lambda \max 1) \times V(\lambda \max 1))$, was as shown in FIG. 14. In addition, as regards the blackbody radiation spectrum of the corresponding color temperature of 6338 K, if $B(\lambda) \times V(\lambda)/(B(\lambda \max 2) \times V(\lambda \max 2))$ is calculated, a curve shown in FIG. 15 was obtained. Furthermore, a difference spectrum between FIG. 14 and FIG. 15, $(P(\lambda) \times V(\lambda)/(P(\lambda \max 1) \times V(\lambda \max 1)) - B(\lambda) \times V(\lambda)/(B(\lambda \max 2) \times V(\lambda \max 2))$, is as shown in FIG. 16. As is understood from FIG. 16, the difference spectrum is distributed in the range of −0.32 to +0.02. The absolute value of the difference spectrum fails to satisfy the condition of 0.2 or less in the entire wavelength range, and the spectrum of sunlight was not reproduced.

The white light source of Comparative Example 1 agreed with the color temperature on the locus of blackbody radiation. However, since the light emission spectrum shape was different, such high color rendering properties as sunlight could not be exhibited. The average color rendering index Ra was as low as about 70, and R1 to R15 were as shown in the Table below, which were very different from the characteristics of sunlight.

Subsequently, with respect to the white light source of Comparative Example 1, the characteristics of the blue wavelength region were confirmed. Assuming that the light emission spectrum of the white light source of Comparative Example 1 is $P(\lambda)$, the light emission spectrum distribution of blackbody radiation having the corresponding correlated color temperature is $B(\lambda)$, and the spectrum of the spectral luminous efficiency is $V(\lambda)$, when these satisfy the following equation (1):

$$\int_{380}^{780} P(\lambda)V(\lambda)d\lambda = \int_{380}^{780} B(\lambda)V(\lambda)d\lambda \tag{1}$$

the light emission spectrum of the white light source of Comparative Example 1 exhibited a relationship of the following expression (12) in a wavelength range of 400 nm to 495 nm:

$$P(\lambda)/B(\lambda) \leq 1.87 \tag{12}$$

and the $P(\lambda)/B(\lambda)$ value exceeded the upper limit value of 1.8 of the white light source of the present invention. Concretely, this is as shown in FIG. 17. As is understood from FIG. 17, the white light source of Comparative Example 1 has a sharp light emission spectrum shape having a peak in the neighborhood of 450 nm. Compared to the light emission spectrum shape of blackbody radiation, this spectrum shape has an excessive projection portion near 450 nm and has an excessive recess portion before 500 nm, and this light emission spectrum had clearly different characteristics from the blackbody radiation (sunlight). In the meantime, the white light source using the blue LED is characterized by such a conspicuous projection portion. As the color temperature of the white light source becomes lower, this projection portion becomes more conspicuous. Accordingly, although the white light source of Comparative Example 1 was the white light source of the color temperature which is as high as 6338 K, there is a tendency that if the color temperature becomes lower, the $P(\lambda)/B(\lambda)$ value becomes greater than 1.87.

In this manner, the white color source of Comparative Example 1 apparently exhibited the same white light emission as the present invention, but exhibited characteristics which are poor in redness and have a low color rendering property. When such a white light source is used as illumination for a hospital, since a strong light emission wavelength component is included in the blue region, there is concern about the problem of blue light hazards, etc., and the harmful effect on circadian rhythms of human bodies. Besides, in the white light source of Comparative Example 1, since the blue light emission LED was used as the LED module, little ultraviolet is included in the white light source of Comparative Example 1. However, if an ultraviolet light emission LED is used, it is clear that a great amount of ultraviolet leaks. If the ultraviolet light emission LED is used as illumination for an art museum, there is concern

TABLE 4

| | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Comparative Example 1 | 69.6 | 68.3 | 73.4 | 72.6 | 70.7 | 61.9 | 61.8 | 79.3 | 61.6 | 24.9 | 32.7 | 65.1 | 38.1 | 68.2 | 84.1 | 65.8 | about harmful effects as a matter of course, such as increased fading of paintings. Incidentally, since the light emission characteristics of the white light source of Comparative Example 1 are too greatly different from those of sunlight in every aspect, it is meaningless to reproduce one-day sunlight variations by using the white light source of Comparative Example 1. Thus, a white light source system, which uses such a white light source, was not created.

Example 2

Evaluation experiments were conducted as to how the blue light emission component included in the white light source of the present invention is perceived by human bodies. In the present invention, as regards the intensity of blue light included in the white light source, the $P(\lambda)/B(\lambda)$ value shown in the above equation (1) is used as a criterion of evaluation. If this numerical value is as close as possible to 1, this value is a most desirable value, judging comprehensively from the aspects of the color rendering property of the illumination light source and the safety to human bodies. On the other hand, from the aspect of safety, it is preferable that this numerical value is as small as possible. Confirmation experiments were conducted as to what values are tolerable as the upper limit value.

In the experiments, white light sources of various $P(\lambda)/B(\lambda)$ values were prepared. The degree of influence on human bodies was examined by determining how much dazzle a person, who views light emitted from the white light source, perceives. Specifically, if the fact that a difference occurs in the degree of perception of dazzle in a human body due to a difference in intensity of blue light can be confirmed, this becomes evidence that the blue light has such influence on human bodies. The problem here is the method used in the experiment. The perception of dazzle by a human, who views the light source, is influenced by the intensity of light from the light source. The light source, which is the object of experiments, is the white light source. Even if dazzle of a certain white light source was specified, it is necessary to make it is possible to first confirm that the cause of dazzle is not the overall intensity of the white light or the intensity of a red light emission component or the like, but the cause of dazzle is the intensity of a blue light emission component. Then, it is necessary that a correlation be recognized between the degree of perceived dazzle and the variation in intensity of the blue light component.

In the present invention, the physical characteristics of blue light are utilized as a method for evaluating the degree of influence of blue light upon eyes, by distinguishing this degree of influence from the degree of influence of other visible light. The light emission component of the wavelength range of 400 to 495 nm including blue light has higher energy than the visible light components of other wavelengths. In general, electromagnetic waves having high energy tend to collide with various obstacles while traveling through space and tend to be easily scattered. In short, it is known that blue light is scattered more easily than other visible light components. Thus, of the emission light emitted from the white light source, a blue light emission component is scattered by the influence of floating matter such as gas molecules and dust in the air, and, at the same time, the blue light reaching the inside of the eye strongly undergoes the influence of scattering while traveling through the crystal lens. On the other hand, vision cells of the retina, which the blue light reaches after passing through the crystal lens, are composed of cones, which are mainly located in a central part of the retina and which normally perceive a bright image, and rods, which are mainly located in a peripheral part of the retina and which perceive a dark image. Thus, scattered blue light reaches rods which normally sense a dark image. If bright scattered light that is not normally sensed by the rods reach the rods, the sphincter muscle of the pupil excessively contracts, and a human strongly senses dazzle.

Due to the above phenomenon, when a human senses dazzle, the sense of dazzle occurs mainly because excessive light reaches the rods in the case of blue light, while the sense of dazzle occurs mainly because excessive light reaches the cones in the case of visible light other than blue light. Thus, the mechanism of sensing dazzle differs between both cases. Accordingly, by utilizing this phenomenon, for example, the overall intensity of the white light source is kept constant, and then the content ratio of the blue light component that is a constituent of the white light is varied. Thereby, the degree of dazzle perceived by humans can correctly be evaluated. Specifically, even when the amount of light reaching the cones is constant or slightly decreases, if the amount of light reaching the rods increases, humans sense dazzle more strongly. To measure this variation is the most effective means for evaluating the influence of blue light upon the human body.

Hereinafter, the contents of concrete experiments and the results thereof are summarized.

For the purpose of examination, in order to obtain light sources of various $P(\lambda)/B(\lambda)$ values, the following five kinds of light sources were additionally experimentally fabricated, and were used as light sources of the Example and Comparative Example.

To begin with, a white light source was fabricated in which the light emission intensity of the blue wavelength region in the light emission spectrum of white light was reduced as much as possible. Concretely, to cope with this, an ultraviolet to blue light absorption film was formed on the LED module of the light source B of Example 1. A three-layer film was formed on the periphery of the phosphor layer which covers the periphery of the LED chip of the light source B of Example 1. A thin film (first layer) of about 3 μm, which is formed by using a zinc oxide pigment with an average particle size of 0.3 μm, was formed on the innermost side. A film (second layer) of about 0.9 μm, which is formed by using zirconium oxide with an average particle size of 0.08 μm, was formed in the middle. A thin film (third layer) of about 6 μm, which is formed by using silicon oxide with an average particle size of 0.5 μm, was formed on the outermost side. Each of the thin films was formed such that fine particle powder was dispersed in a silicone resin, the specific gravity and viscosity were adjusted, and then a predetermined amount of a slurry of the result was applied.

A predetermined electric current was applied to the obtained LED module, and it was confirmed that the LED module emits white light. The light emission spectral distribution of white light emitted from the LED module was measured by using the spectral distribution measuring device. Based on the obtained light emission spectrum data, a chromaticity point on the (x, y) chromaticity diagram was calculated. The calculated chromaticity point was 5110 K−0.002 duv. It turned out that the color temperature shifted to a lower color temperature side by about 600 K, relative to the correlated color temperature of 5704 K+0.001 duv of the light source B before the violet to blue component was cut.

Assuming that the light emission spectrum of the white light source after the cutting of the violet to blue component is $P(\lambda)$, the light emission spectrum distribution of black-body radiation having the corresponding correlated color temperature is B(λ), and the spectrum of the spectral luminous efficiency is V(λ), when these satisfy the following equation (1):

$$\int_{380}^{780} P(\lambda)V(\lambda)d\lambda = \int_{380}^{780} B(\lambda)V(\lambda)d\lambda \quad (1)$$

the ratio of P(λ)/B(λ) is 0.98 at most in the wavelength range of 400 nm to 495 nm, and the following expression (13) was successfully satisfied:

$$P(\lambda)/B(\lambda) \leq 1 \quad (13)$$

Specifically, when the light emission intensity of the obtained white light source was compared with the light emission intensity of blackbody radiation, the light emission intensity of the light source of Example 2 never exceeded the light emission intensity of blackbody radiation in the entire wavelength range of 400 nm to 495 nm.

Next, four kinds of white light sources (4) to (7) of Example 2, which exhibit relatively large values of the above P(λ)/B(λ) value, were fabricated. All the materials and parts used in the fabrication are the same as those in Example 1, and the parts were assembled in the same manner as in Example 1. Specifically, the light source colors of the white light sources 1 to 6 of Example 1 were mixed at mixture ratios shown in Table 5-2. Thereby, the four kinds of white light sources (4) to (7) of Example 2 were obtained. The numerals in Table 5-2 indicate intensity ratios (relative values). The intensity ratios were controlled by controlling the values of electric currents which are applied to the white color sources 1 to 6. In addition, in order to evaluate the P(λ)/B(λ) values of the obtained white light sources, the light emission spectra of the additionally experimentally fabricated white light sources (5) to (7) were compared with the light emission spectra of blackbody radiation corresponding to the white light sources. Then, graphs of FIG. 18, FIG. 19 and FIG. 20 were obtained. As is understood from these Figures, in the respective light sources, the maximum values of the P(λ)/B(λ) value in the wavelength range of 400 nm to 495 nm were 1.47 in the light source of FIG. 18, 1.69 in the light source of FIG. 19, and 1.76 in the light source of FIG. 20.

In addition, the difference spectra of the white light sources (4) to (7) were in the range of ±0.1 or less, and satisfied the above expression (3).

TABLE 5-1

| Light source ★ | Color temperatures | P (λ)/B (λ) ★★ |
|---|---|---|
| (1) | 4236K + 0.004 duv | 1.07 |
| (2) | 5704K + 0.001 duv | 1.26 |
| (3) | 2990K − 0.004 duv | 1.37 |

TABLE 5-1-continued

| Light source ★ | Color temperatures | P (λ)/B (λ) ★★ |
|---|---|---|
| (4) | 5110K − 0.002 duv | 0.98 |
| (5) | 5198K + 0.002 duv | 1.47 |
| (6) | 4322K − 0.002 duv | 1.69 |
| (7) | 5262K + 0.001 duv | 1.76 |
| (8) | 6338K + 0.005 duv | 1.87 |
| (9) | 3886K − 0.001 duv | 2.11 |
| (10) | 2960 − 0.0004 duv | 3.28 |

★ (1), (2) and (3) correspond to the light sources A, B and C of Example 1, respectively.
(4) to (7) correspond to the additionally experimentally fabricated light sources of Example 2.
(8) corresponds to the light source of Comparative Example 1.
(9) and (10) correspond to the light sources of Comparative Example, which were additionally experimentally fabricated in Example 2.
★★ The maximum values of the P(λ)/B(λ) ratio in the wavelength region in which wavelength λ is 400 to 495 nm.

TABLE 5-2

|  | Light source 1 | Light source 2 | Light source 3 | Light source 4 | Light source 5 | Light source 6 |
|---|---|---|---|---|---|---|
| Light source (4) | 0.09 | — | 0.51 | 0.34 | — | 0.06 |
| Light source (5) | 0.09 | — | 0.70 | 0.18 | — | 0.03 |
| Light source (6) | — | 0.23 | 0.19 | 0.23 | 0.35 | — |
| Light source (7) | — | 0.14 | 0.43 | 0.33 | 0.10 | — |

Figure 21:
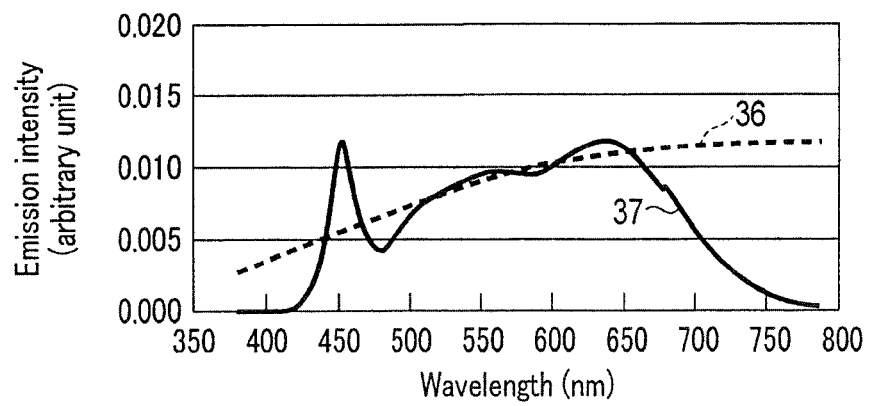
FIG. 21 is a graph comparing spectral intensities of $P(\lambda)V(\lambda)$ of a white light source (9) of a Comparative Example and $B(\lambda)V(\lambda)$ of blackbody radiation having the same color temperature.
Figure 24:
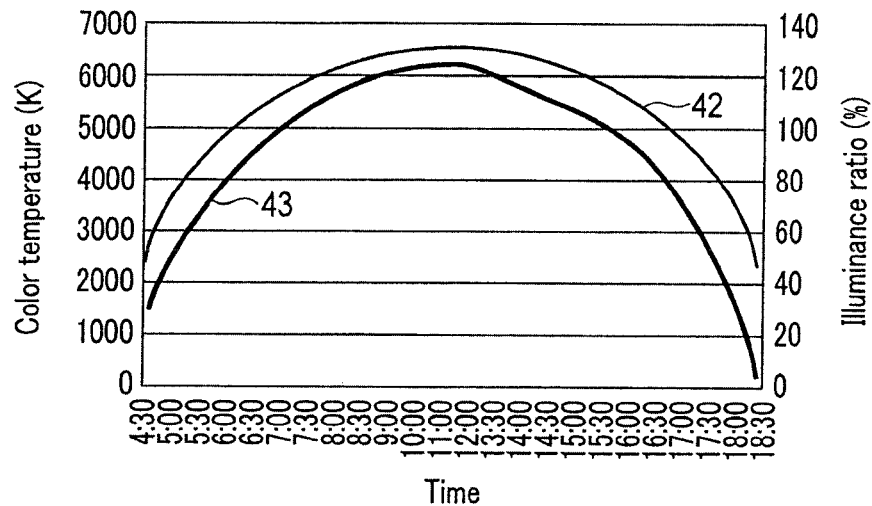
FIG. 24 is a graph showing variations of a color temperature and illuminance of sunlight in a day in summer in Los Angeles, the USA.
Figure 25:
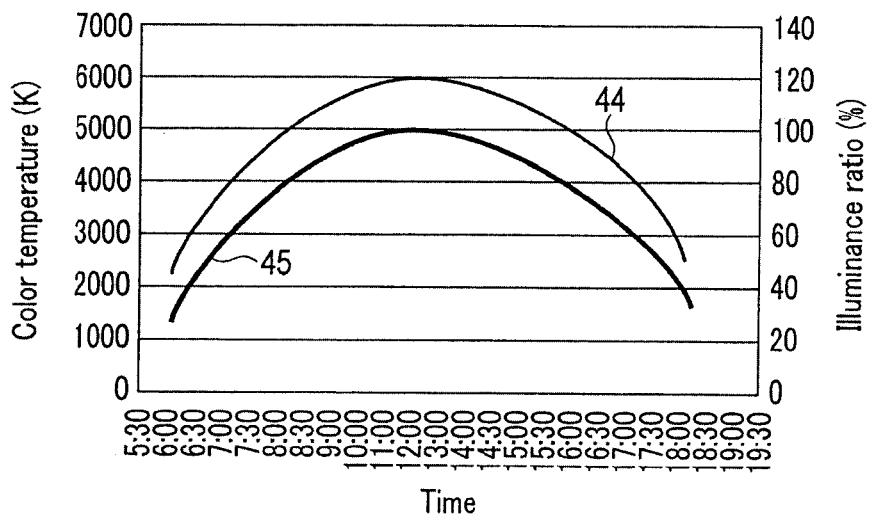
FIG. 25 is a graph showing variations of a color temperature and illuminance of sunlight in a day in autumn in Sakai (Osaka), Japan.
Figure 36:
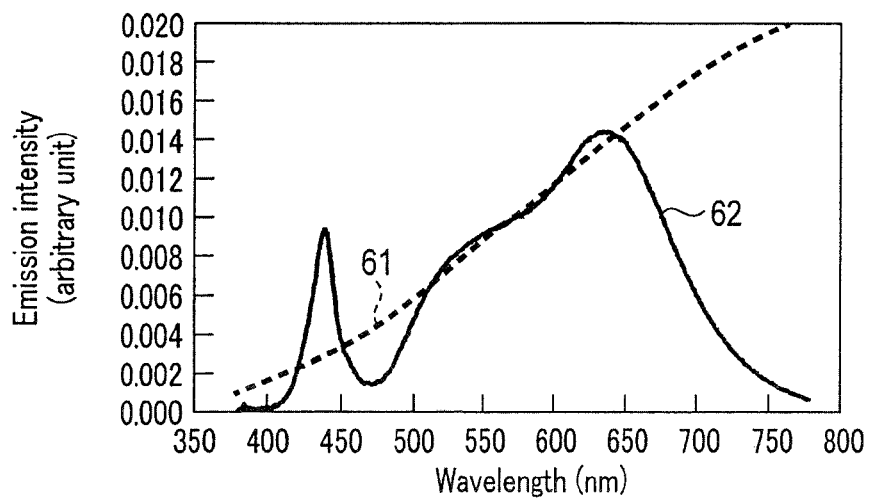
FIG. 36 is a graph comparing spectral intensities of $P(\lambda)V(\lambda)$ of a white light source (10) of a Comparative Example and $B(\lambda)V(\lambda)$ of blackbody radiation having the same color temperature.

In addition, two kinds of white light sources of a Comparative Example were additionally experimentally fabricated. One white light source (9) of the Comparative Example is identical to Comparative Example 1 with respect to the materials and parts which were used. However, the amount of the phosphor combined with the LED was changed by decreasing the thickness of the phosphor layer to 62 μm, and the white light source exhibiting a different P(λ)/B(λ) value was fabricated. A concrete light emission spectrum shape is as shown in FIG. 21, and the maximum value of the P(λ)/B(λ) value in the wavelength range of 400 nm to 495 nm was 2.11. In addition, the other white light source (10) of the Comparative Example is also identical to Comparative Example 1 with respect to the materials and parts which were used. However, the amount of the phosphor combined with the LED was changed by decreasing the thickness of the phosphor layer to 55 μm, and the white light source exhibiting a different P(λ)/B(λ) value was fabricated. A concrete light emission spectrum shape is as shown in FIG. 36, and the maximum value of the P(λ)/B(λ) value in the wavelength range of 400 nm to 495 nm was 3.28.

The various characteristics of the light sources used in this evaluation, in addition to the above experimental products, are summarized as shown in Tables 5-1 and 5-2. As the light sources for the evaluation, the light sources of Example 1 and Comparative Example 1, as well as the light sources which were experimentally fabricated in Example 2, were added for the purpose of comparison. In Table 6, the characteristics of the color rendering indexes of the major light sources, which were experimentally fabricated in Example 2, are summarized in a table form.

TABLE 6

| Light source | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| (5) Example | 97.4 | 99.4 | 98.1 | 93.2 | 97.5 | 99.3 | 96.7 | 97.5 | 97.1 | 95.5 | 93.1 | 97.4 | 89.9 | 99.6 | 95.5 | 98.0 |
| (6) Example | 97.2 | 97.7 | 97.4 | 97.6 | 98.1 | 97.4 | 95.2 | 97.3 | 96.9 | 04.6 | 94.3 | 95.9 | 92.8 | 97.1 | 99.0 | 99.4 |
| (7) Example | 97.0 | 98.8 | 98.0 | 92.5 | 96.3 | 99.6 | 96.9 | 96.6 | 96.1 | 93.4 | 92.8 | 96.8 | 91.9 | 99.2 | 95.0 | 97.1 |
| (9) Comparative Example | 97.6 | 99.0 | 98.1 | 94.8 | 97.8 | 97.9 | 95.4 | 98.6 | 99.1 | 96.8 | 94.0 | 96.4 | 79.5 | 98.9 | 96.6 | 98.5 |
| (10) Comparative Example | 91.2 | 96.3 | 92.9 | 87.3 | 88.7 | 93.4 | 90.4 | 89.4 | 91.0 | 85.1 | 82.4 | 90.3 | 78.4 | 94.9 | 91.8 | 94.1 |

In order to evaluate the white light sources, subjective tests by human sensation were conducted. In experiments, the ten kinds of light sources of the above Table 5-1 were prepared. The ten kinds of light sources were successively lighted under the operational condition under which the luminances of the light sources become equal. During the lighting tests of the light sources, the curtains of windows were closed, and the brightness of ceiling illumination was constantly kept at a fixed value so that the indoor illuminance may not change. In addition, a human stands at a position at a distance of 3 μm from the light sources. The human directly viewed each light source, and the strength of a stimulus received from the light source was comparatively evaluated. In order to simplify the criterion of evaluation, a method was adopted in which one of two kinds of answers, "Yes" and "No", is obtained as to whether dazzle of each light source is sensed or not. The test subjects were 50 male and female adults in total, who have normal color sensation. As regards persons wearing eyeglasses, tests were conducted after confirming that they did not wear blue-cut type glasses.

With respect to the ten kinds of white light source samples, the results of subjective evaluation, as well as major characteristics of the light sources, are summarized in Table 7.

TABLE 7

| While light sources | Color temperatures (K) | $P(\lambda)/B(\lambda)$ | Ratio (%) of persons who sensed dazzle of light sources |
|---|---|---|---|
| (10) | 2960 − 0.0004 duv | 3.28 | 85% |
| (9) | 3886K − 0.001 duv | 2.11 | 68% |
| (8) | 6338K + 0.005 duv | 1.87 | 54% |
| (7) | 5262K + 0.001 duv | 1.76 | 44% |
| (6) | 4322K − 0.002 duv | 1.69 | 40% |
| (5) | 5198K + 0.002 duv | 1.47 | 28% |
| (3) | 2990K − 0.004 duv | 1.37 | 18% |
| (2) | 5704K + 0.001 duv | 1.26 | 22% |
| (1) | 4236K + 0.004 duv | 1.07 | 14% |
| (4) | 5110K − 0.002 duv | 0.98 | 14% |

The ten kinds of white light sources were comparatively evaluated under the condition under which all of the white light sources have the same luminance. Thus, it should be natural that the persons perceive the same degree of dazzle with respect to all light sources. However, as shown in Table 7, the result indicates that the degree of dazzle sensed by persons greatly differs depending on the kinds of white light sources. This result was obtained due to the peculiarity of blue light, and this data supports the correctness of the method of experiments. For example, as is understood from Table 7, there is a tendency that as the $P(\lambda)/B(\lambda)$ value becomes greater, the ratio of persons who sense dazzle generally becomes larger. This means that even if the intensity of light, which is incident on the eyes and is sensed by the eyes, is unchanged, the persons sensed dazzle more strongly as the amount of the blue light component becomes larger, because the amount of scattering light increases in proportion to the amount of the blue light component.

The above phenomenon is more clearly indicated by the result of comparison of the combination of the two kinds of light source (1) and light source (6) in Table 7, or the combination of the two kinds of light source (4) and light (5) in Table 7. In these white light sources, the color temperatures of the paired light sources are substantially identical. Moreover, the luminance is identical in all light sources. Thus, when humans observe these light sources, it should be natural that both of the paired light sources are viewed with the same brightness and color. Despite this, a large difference occurs in the degree of perception of dazzle. Concretely, for example, when the light source (4) and light source (5) in Table 7 are compared, the color temperatures of both are about 5100 K. However, the ratio of persons who sensed dazzle of the light source (4) is 14%, while this ratio is 28% with respect to the light source (5), and a large difference was recognized. If the $P(\lambda)/B(\lambda)$ values of both are confirmed, this value is 0.98 in the light source (4), while the value is 1.47 in the light source (5). In accordance with the magnitude of the $P(\lambda)/B(\lambda)$ value, the ratio of scattering light incident on the eyes increased, thus influencing the degree of perception of dazzle.

On the other hand, as an exception to the above, in the relationship between the light source (2) and light source (3) in Table 7, a phenomenon occurs in which the relationship between the degree of perception of dazzle by persons and the $P(\lambda)/B(\lambda)$ value is reversed. The $P(\lambda)/B(\lambda)$ value of the light source (2) is 1.26 and is smaller than 1.37 of the light source (3). Despite this, the ratio of persons who sensed dazzle of the light source (2) is 22% which is greater than 18% of the light source (3), and the mutual relationship was reversed. At a glance, this data is contradictory. However, such a result occurred due to the difference between the color temperatures of white light sources. The $P(\lambda)/B(\lambda)$ value defines the amount of blue light which is excessively included, compared to the corresponding blackbody radiation. However, the color temperature of blackbody radiation, which is a reference for comparison, is 2990 K in the light source (3), while this color temperature is 5704 K in the light source (2). In general, as the value of the color temperature of white light becomes higher, the relative ratio of the blue light component increases. Accordingly, in the spectrum of blackbody radiation which was a reference for comparison when the $P(\lambda)/B(\lambda)$ value was calculated, the blue light component of the light source (2) was greater than the blue light component of the light source (3). Thus, although the excess blue light relative to the blackbody radiation was greater in the light source (3), the entire amount of blue light was greater in the light source (2). There is no difference in the fact that the degree of perception of dazzle varies in accordance with the content of blue light.

From the above result, it was confirmed that the content of the blue light component in the white light source influences the degree of perception of dazzle by humans, and that as the $P(\lambda)/B(\lambda)$ value becomes greater, more dazzle is perceived by humans. This result is the content that supports the initial assumption, and the influence by the excess blue light emission component is considered to be particularly important as the factor by which the white light source was perceived as dazzling. In addition, in the white light sources (8) to (10) of the Comparative Example, the $P(\lambda)/B(\lambda)$ values are 1.87, 2.11 and 3.28, which exceed 1.8 and are large values. The level of these values is such that more than half the test subjects sensed dazzle of blue light. The light source, with which dazzle is so strongly sensed, is an illumination for which there is concern about problems of blue light hazards or the like, which have attracted attention in recent years. In connection with this light source, the investigation of the truth and the study for improvements are to be expected in the future. On the other hand, in the white light sources of the Example, the $P(\lambda)/B(\lambda)$ values are in the range of 0.98 to 1.76, and an improvement has been made so as to make the blue component smaller than in the conventional light sources of the Comparative Example. Moreover, the ratio of persons sensing dazzle is less than 50%, and it is judged that the light of the white light sources of the Example has been improved with respect to the problems of blue light hazards or the like.

In the meantime, in Table 5-1 and Table 5-2, in the white light sources of the Examples which were shown by way of example, the color temperatures are 2990 K to 5704 K and the $P(\lambda)/B(\lambda)$ values are in the range of 0.98 to 1.76. However, the white light sources of the present invention are characterized in that the color temperatures are in the range of 2000 K to 6500 K, and the $P(\lambda)/B(\lambda)$ values are in the range of 1.8 or less. Accordingly, the content of the blue light component in the white light source of the present invention is less than that in the white light source of Comparative Example 1 which is the conventional light source. This is because the color temperature of the white light source of Comparative Example 1 is 6338 K and is substantially close to the upper limit value. On the other hand, since the color temperature of the white light source of the present invention is substantially equal to or less than the color temperature in Comparative Example 1, the content of the blue light component is equal to or less than that in Comparative Example 1. Besides, since the $P(\lambda)/B(\lambda)$ value is less than in Comparative Example 1, the content of the blue light component in the white light source of the present invention is surely less than that in the white light source of Comparative Example 1. In addition, in the white light source (e.g., white light source V) of this invention in which the $P(\lambda)/B(\lambda)$ value is 1.5 or less, the ratio of persons sensing dazzle is substantially halved, compared to the ratio with respect to the light source of Comparative Example 1, and the influence of the blue light component can be reduced more conspicuously. In this manner, the white light source of the present invention has obvious effects of improvement, compared to the conventional light source that is the Comparative Example.

Example A

Figure 37:
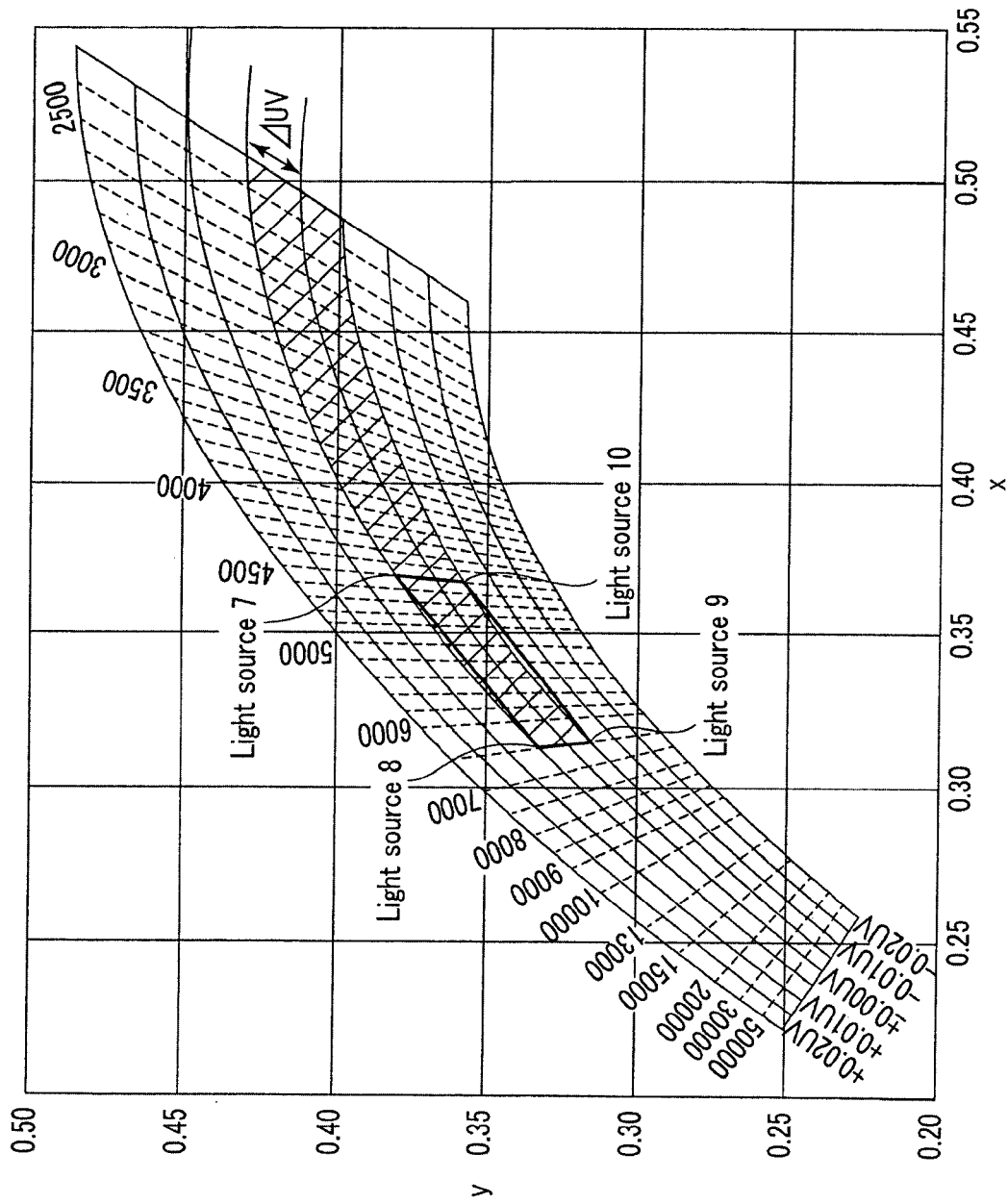
FIG. 37 is a graph showing a reproduction region of color temperatures by a white light source system of Example A.
Figure 40:
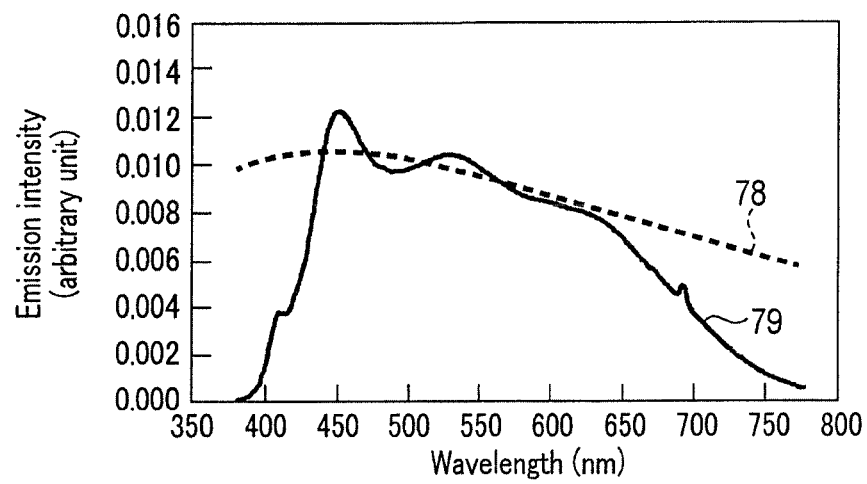
FIG. 40 is a graph comparing spectral intensities of $P(\lambda)V(\lambda)$ of a white light source 8 of Example A and $B(\lambda)V(\lambda)$ of blackbody radiation having the same color temperature.
Figure 41:
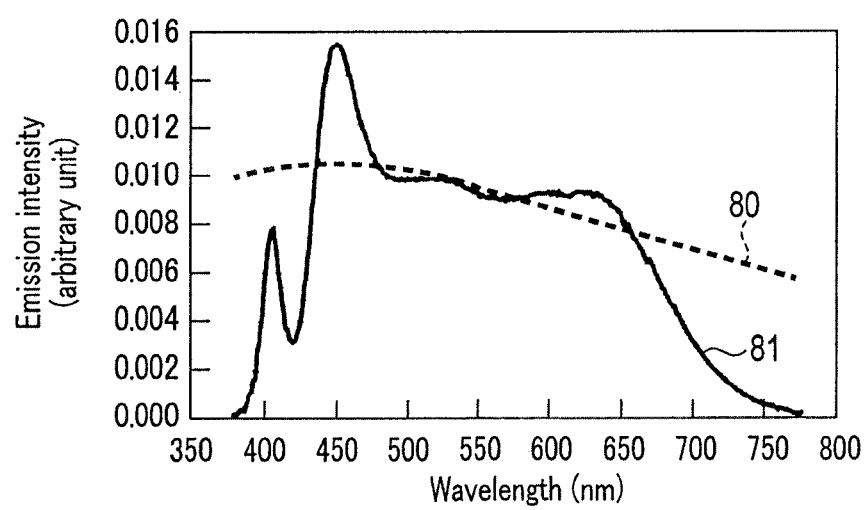
FIG. 41 is a graph comparing spectral intensities of $P(\lambda)V(\lambda)$ of a white light source 9 of Example A and $B(\lambda)V(\lambda)$ of blackbody radiation having the same color temperature.

A white light source system, which is composed of four kinds of white light sources, was fabricated. In this system, the number of white light sources, which constitute the system, is limited to a minimum necessary number. Thus, the range, in which the spectrum of blackbody radiation can be accurately reproduced, becomes narrow. Concretely, this system is a white light source system including light sources 7 to 10 shown in FIG. 37. In a rectangular color temperature region surrounded by the light source 7 to light source 10 in the Figure, that is, in a range of color temperatures of 4500 K to 6500 K, correlated color temperatures within a deviation of ±0.005 duv can be reproduced. In this system, it is difficult to reproduce one-day variations of sunlight. However, since the system covers the range of color temperatures enough to reproduce the brightly shining sun of daytime, the system has sufficient characteristics for utilization as high color rendering illumination in, for example, offices.

The four kinds of white light sources were fabricated in the following procedure. As illustrated in FIG. 38, on an alumina substrate 71 having an outside shape of 30×30 mm, LED chips 72 each having a chip shape of 0.4×0.4 mm were disposed in a 5 (in series)×5 (in parallel) matrix. For the LED, GaN of violet light emission having a light emission peak wavelength at 405 nm was used. In addition, in the LED module 70 shown in FIG. 38 in which the alumina substrate having a water absorption coefficient of 20 to 30% was used, each of chip columns, in which the LED chips 72 are connected in series, is independently covered with a transparent resin layer (not shown), and the entire surface of each of the transparent resin layers of the plural columns is covered with a phosphor layer 73. In the meantime, in the transparent resin layer, fumed silica with an average primary particle size of 7 nm and a maximum particle size of 25 nm was added as fine particle silica powder in an amount of 3 mass % relative to the transparent resin. In addition, as each phosphor powder which is contained in the phosphor layer, phosphor powder with an average particle size of 30 to 40 μm was used. The transparent resin layer was formed by applying a slurry, in which fine particle silica powder is dispersed in silicone resin, to the periphery of the LED chip. Then, the phosphor layer 73 was formed by applying a slurry, in which phosphor powder is dispersed in silicone resin, to the entire surface of the transparent resin layer. The thickness of the phosphor layer 73 was set at 500 to 750 μm, and the density of phosphor powder in the phosphor layer was adjusted to fall within the range of 75 to 85 mass %. In addition, a conductor 75 is formed as an electrode on the substrate 71, and each LED chip 72 is connected to the electrode. As the material of the electrode, Pd metal was used. In order to protect the electrode material, an Au film was formed on the surface of the electrode by a printing method. A dam 74 is disposed in a manner to surround the columns of LED chips 72 on the substrate 71. A reflector, a lens and a cover were attached to this LED module 70, and electronic circuit was connected to the LED module 70. Thus, white light sources included in the white light source system of Example A were fabricated.

Each white light source is a combination of four kinds of phosphors, namely a blue phosphor, a green phosphor, a yellow phosphor and a red phosphor, and an LED. The kinds and mixture ratios of the respective phosphors, and the correlated color temperatures of the obtained light sources are as shown in Table 8 below.

TABLE 8

| Light source No. | Color temperatures | Blue phosphor Wt % | Green phosphor Wt % | Yellow phosphor Wt % | Red phosphor Wt % |
|---|---|---|---|---|---|
| 7 | 4500K + 0.006 duv | europium activated alkaline earth phosphate phosphor 80 | europium activated strontium sialon phosphor 3 | europium activated orthosilicate phosphor 11 | europium activated calcium nitridoaluminosilicate phosphor 6 |
| 8 | 6500K + 0.006 duv | Europium activated alkaline earth phosphate phosphor 89 | europium activated β-sialon phosphor 2 | europium activated orthosilicate phosphor 6 | europium activated strontium sialon phosphor 3 |
| 9 | 6500K − 0.005 duv | Europium activated alkaline earth phosphate phosphor 92 | europium activated orthosilicate phosphor 1 | europium activated orthosilicate phosphor 4 | europium activated calcium nitridoaluminosilicate phosphor 3 |
| 10 | 4500K − 0.005 duv | Europium activated alkaline earth phosphate phosphor 83 | europium activated orthosilicate phosphor 3 | europium activated orthosilicate phosphor 7 | europium activated strontium sialon phosphor 7 |

FIG. 39 to FIG. 42 show graphs in which light emission spectra of the four kinds of white light sources are compared to the spectra of blackbody radiation of the corresponding color temperatures. As is understood from FIG. 39 to FIG. 42, the spectra of the four kinds of light sources agree with the spectra of blackbody radiation to a high extent. Difference spectra between the respective white light sources and the corresponding blackbody radiation spectra were calculated. In all of the four kinds, the difference spectra are in the range of ±0.2 or less, and it was confirmed that the relational expression (3) is satisfied. Accordingly, each of the light sources has characteristics suitable for the white light source of the present invention, and white light obtained by mixing white lights of the four kinds is also suitable for the white light source of the present invention, and can reproduce sunlight.

In addition, as regards the mixed white light obtained by mixing the four kinds of white light sources, the $P(\lambda)/B(\lambda)$ values obtained by the above relational expressions (2) and (5) were confirmed. As an example, the four kinds of light sources were mixed at an intensity ratio of light source 7: light source 8: light source 9: light source 10=0.14:0.41: 0.34:0.11. Thus, a light source 11 was obtained. The correlated color temperature of the mixed white light source was 6000 K+0.001 duv. If the spectrum shape is compared with the spectrum of blackbody radiation of the same color temperature, the comparison result is as shown in FIG. 44. As is understood from FIG. 44, the $P(\lambda)/B(\lambda)$ value is 1.17, and it was confirmed that the light source satisfies each of the relational expression (2) and relational expression (5).

In the meantime, as shown in FIG. 39 to FIG. 42, the light emission spectra of the white light sources of the present invention can exhibit continuous spectra without a break over the wavelength range of 380 nm to 780 nm. Here, the continuous spectrum means a spectrum which does not include, in this wavelength range, a planar wavelength region where the light emission intensity is substantially zero.

Figure 19:
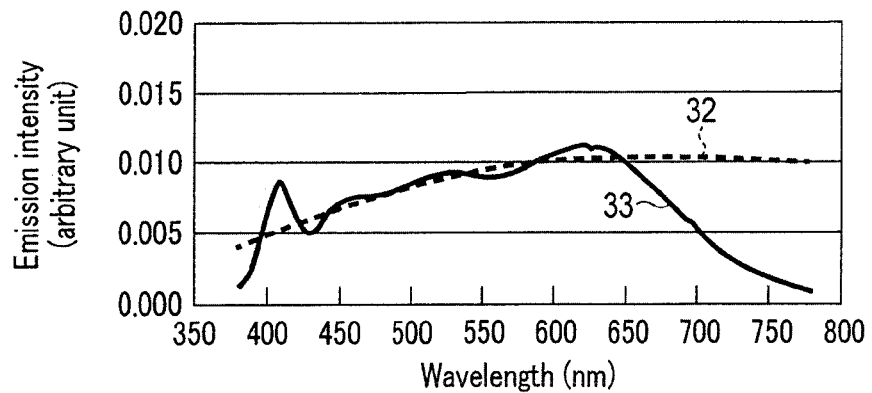
FIG. 19 is a graph comparing spectral intensities of $P(\lambda)V(\lambda)$ of a white light source (6) of Example 2 and $B(\lambda)V(\lambda)$ of blackbody radiation having the same color temperature.
Figure 20:
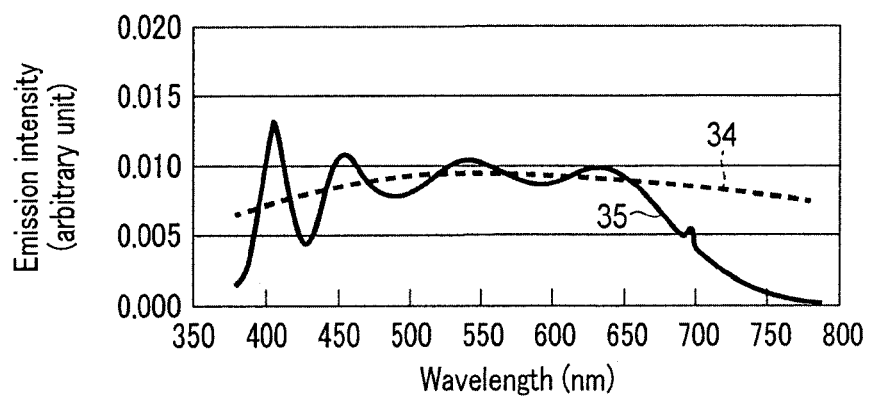
FIG. 20 is a graph comparing spectral intensities of $P(\lambda)V(\lambda)$ of a white light source (7) of Example 2 and $B(\lambda)V(\lambda)$ of blackbody radiation having the same color temperature.

In order to confirm the feature of the light emission spectra of the white light sources of the present invention, for example, the light emission spectrum of FIG. 39 of the light source of the present invention is compared with the light emission spectrum shape of FIG. 17 of the light source of Comparative Example 1, which was fabricated in Example 1. One to three recess portions are observed in the curves of both spectra. Such a recess portion occurred due to a gap between neighboring two kinds of light emission spectra. The reason why the light emission intensity at the bottom of the recess portion does not become zero is that a long wavelength end of a short wavelength-side light emission spectrum and a short wavelength end of a long wavelength-side light emission spectrum overlap. The reason why the degree of irregularity of the spectrum curve is less in the light source of the present invention than in the light source of the Comparative Example is that the area of overlap between light emission spectra is large. This effect occurs by making as close as possible the light emission spectra with large half-value widths. By further selecting the kinds of phosphors in such a combination, re-absorption between phosphors becomes easier to occur, and also double excitation or the like becomes easier to occur. The light emission color variation during continuous lighting of the light source can be suppressed as low as possible. Besides, since the smooth curve with less irregularity can be obtained, it is natural that the light emission spectrum of blackbody radiation can easily be reproduced and the color rendering property or the like can be improved. In particular, the light sources of the present invention are characterized in that the light emission intensity does not become zero even in a near-ultraviolet region of 380 nm or a deep red region of 780 nm. On the other hand, in the light source of FIG. 17 of the Comparative Example, planar curves appear in a region of 400 nm or less and in a region of 750 nm or more, and the level of the intensity thereof can be regarded as substantially zero. Thus, in the white light source of the present invention, over the entire wavelength region of 380 nm to 780 nm which is the object of evaluation of the color rendering evaluation index, there is no planar wavelength region in which the light emission intensity is substantially zero. Accordingly, the white light source of the present invention can exhibit high numerical values, not only with respect to the average index Ra, but also with respect to R1 to R15. Concrete values are as shown in Table 9. FIG. 18 to FIG. 20 show other examples of continuous spectra with no break over the entire wavelength range of 380 nm to 780 nm, that is, light emission spectra including no planar wavelength region in which the emission intensity is substantially zero.

TABLE 9

| Light source | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Light source 7 | 95.1 | 91.7 | 94.2 | 96.2 | 91.7 | 90.8 | 92.0 | 96.9 | 88.6 | 85.1 | 85.7 | 90.4 | 85.9 | 92.0 | 97.6 | 89.0 |
| Light source 8 | 96.9 | 96.4 | 97.7 | 98.8 | 96.3 | 96.1 | 96.7 | 98.2 | 94.6 | 85.0 | 94.5 | 96.4 | 88.7 | 96.7 | 99.3 | 94.8 |
| Light source 9 | 95.2 | 90.5 | 93.4 | 98.9 | 93.1 | 91.7 | 92.1 | 97.6 | 92.0 | 85.2 | 97.9 | 90.7 | 87.2 | 90.6 | 98.4 | 88.4 |
| Light source 10 | 95.4 | 93.1 | 95.3 | 99.1 | 94.8 | 93.8 | 93.7 | 98.4 | 94.8 | 85.0 | 91.2 | 92.6 | 90.0 | 93.1 | 98.8 | 92.2 |
| Light source 11 | 98.1 | 98.8 | 98.8 | 99.9 | 96.8 | 97.8 | 98.1 | 97.0 | 97.5 | 98.5 | 98.5 | 99.2 | 85.8 | 98.2 | 99.4 | 96.6 |

As regards the white light sources 7 to 12, movements on the u'v' chromaticity diagram were measured and evaluated with respect to the light emission color variations during continuous lighting. After measuring the light emission spectra of the white light sources 7 to 12 by using an integrating sphere, chromaticity values of u' and v' were obtained by calculation. One hour after the time of initial lighting, u' and v' were measured. Then, after continuous lighting of 6000 hours thereafter, u' and v' at the time point of the lapse of 6000 hours were measured. Incidentally, the measurement was conducted in an indoor environment at a room temperature of 25° C. and with a humidity of 60%. From the (u', v') after one hour and the (u', v') after the lapse of 6000 hours, differences $\Delta u'$ and $\Delta v'$ therebetween were found, and the magnitude of the chromaticity variation was calculated as $[(\Delta u')^2+(\Delta v')^2]^{1/2}$. The result is shown in Table 10.

TABLE 10

| Light sources | | Magnitude of chromaticity variation: $[(\Delta u')^2 + (\Delta v')^2]^{1/2}$ |
|---|---|---|
| Light source 7 | Example A | 0.006 |
| Light source 8 | Example A | 0.007 |
| Light source 9 | Example A | 0.006 |
| Light source 10 | Example A | 0.008 |
| Light source 11 | Example A | 0.009 |
| Light source 12 | Comparative Example | 0.017 |

In the Table, the white light source 12 is a light source of the Comparative Example, which was experimentally fabricated for the purpose of comparison of characteristics. The basic configuration of the LED module is the same as that of the light sources 7 to 10 of Example A. However, InGaN having a light emission peak at 455 nm was used for the LED, and a cerium activated yttrium aluminum garnet phosphor was used as a phosphor to be combined. Besides, the thickness of the phosphor layer and the amount of phosphor were adjusted such that white light of a color temperature of 5300 K is emitted from the light source 12 of the Comparative Example. Concretely, the film thickness was set at 0.15 mm, and the content of phosphor powder in the phosphor layer was set at 10 mass %.

In the light source 12 of the Comparative Example, the chromaticity variation after continuous lighting exceeded 0.01 and was large. Although the white light of the light source 12 is obtained by the mixing the blue light of the LED and the yellow light of the phosphor, the speed of the decrease in luminance of the LED and the speed of the decrease in luminance of the phosphor during continuous lighting are different, and thus such a large variation was exhibited. On the other hand, in the white light sources 7 to 11 of the present invention, all the constituent components of the white light utilize the emission lights of phosphors, and the phosphors used are doubly excited by the LED and phosphors. Moreover, the combination in which re-absorption between the phosphors occurs is adopted. Thus, the speeds of the decrease of luminance in the respective phosphors are averaged. As a result, the effect of reduction of the color variation was brought about. In the white light sources of the present invention, the magnitude of the chromaticity variation in each light source was 0.01 or less, and was small.

Example B

White light sources were fabricated in order to examine the relationship between the water absorption coefficient of the alumina substrate and the adhesion strength of the silicone resin. Except for the material of the substrate, use was made of the same members for fabricating the light sources as those of the light source 7 of Example A. The basic configuration of the LED module was also the same as that of the light source 7. However, in order to evaluate the strength of the resin film, the configuration was simplified, and a linear arrangement of only one column was adopted as the chip arrangement of LEDs, instead of the matrix-type arrangement.

As a substrate of a light source 13, an alumina substrate (shape: 8×3×0.38 mm) with a water absorption coefficient of 5.8% was prepared. The temperature at a time of baking this alumina substrate was set at 1480° C., and thereby the water absorption coefficient was adjusted to 5.8%. Three LED chips were linearly arranged on this substrate, and were connected in series. A slurry including four kinds of phosphors and silicone resin was applied onto these LED chips such that the three LED chips were covered at the same time, and the silicone resin was cured by a heat treatment at a temperature of 140° C. In this manner, a columnar phosphor layer was formed with a size of 6.5 mm in longitudinal dimension, 2.5 mm in transverse dimension, and 1.9 mm in thickness.

As substrates of light sources 14 and 15, alumina substrates having water absorption coefficients of 38% and 59%, respectively, were prepared, and the same LED modules as in the light source 13 were fabricated.

In addition, as a light source 16, an LED module having a double-layer structure of a transparent silicone resin layer and a phosphor layer was fabricated. Three LED chips were mounted on an alumina substrate having a water absorption coefficient of 11%. Thereafter, a silicone resin including no phosphor was applied. Next, a phosphor slurry prepared for the light source 13 was applied. The resultant was subjected to heat treatment at a temperature of 140° C., and the silicone resin was cured. Thereby, a double-layer film was formed in which the thickness of the transparent silicone resin layer is 3 mm and the thickness of the phosphor layer is 0.5 mm.

As a light source 17, a module to be described below was fabricated. The module was fabricated by the same method as the light source 13, except that an alumina substrate having a water absorption coefficient of 0% was used as the substrate material. An electric current of 20 mA was passed through the above five kinds of white light sources 13 to 17 and the light source 10 of Example A, and the light emission efficiency of each light source was measured. Thereafter, the adhesion strength between the silicone resin and substrate was measured by a predetermined method. The result is shown in Table 11. In the light source 10 of Example A and the light sources 13 to 16 of Example B in which the alumina substrates having the water absorption coefficients in the range of 5% to 60% were used, the adhesion strength between the silicone resin layer and substrate indicated a characteristic of more than 1 N, and light sources with no peeling of the resin layer and with good handling efficiency were successfully obtained.

TABLE 11

| | Water absorption coefficient of substrate | Structure of Resin layer | Adhesion strength (N) | Light emission efficiency (lm/W) |
|---|---|---|---|---|
| Light source 10 (Example A) | 21 | Double-layer film | 5.9 | 65 |
| Light source 13 (Example B) | 5.8 | Single-layer film | 4.1 | 60 |
| Light source 14 (Example B) | 38 | Single-layer film | 7.2 | 59 |
| Light source 15 (Example B) | 59 | Single-layer film | 8.8 | 61 |
| Light source 16 (Example B) | 11 | Double-layer film | 5.1 | 64 |
| Light source 17 (Example B) | 0 | Single-layer film | 0.5 | 59 |

White light sources were fabricated for confirming the characteristic effect of the transparent resin layer that is a constituent member of an LED module, and characteristic effect of inorganic fine particle powder included in the transparent resin layer.

To begin with, the effects of the transparent resin layers were evaluated. The members used for fabricating the light sources were exactly the same as those in the light source 7 of Example A. As regards the arrangement of LEDs, substrate shape and transparent resin layer, unique configurations were adopted for the purpose of evaluation.

In a light source 18, three violet light emission LED chips (GaN) were die-bonded to an alumina substrate (8.0 mm in longitudinal dimension×3.0 mm in transverse dimension) including a wiring pattern electrode, by a solder paste or the like at intervals of 2.0 mm. The bonded LED chips were wire-bonded to the wiring pattern by using gold wires. After confirming the lighting of the LEDs, the LEDs and gold wires were coated with a thermosetting transparent silicone resin. In the method of coating, a necessary amount of the resin was applied by using a dispenser, a mask or the like, such that the center LED chip is set at the center, and the three LEDs are coated with a common continuous transparent resin layer. The resin was heated and cured at temperatures of 100 to 150° C., and thus the transparent resin layer was formed. The size of the transparent resin layer was 5.5 mm in longitudinal dimension×2.5 mm in transverse dimension, and the thickness thereof was 1.2 mm. Next, a silicone resin including a phosphor was applied to the surface of the transparent resin layer, and heated and cured. Thereby, a phosphor layer (7.5 mm in longitudinal dimension×3.0 mm in transverse dimension×1.5 mm in thickness) was formed, and the LED module of Example C was fabricated.

As regards a light source 19, a light source having exactly the same configuration as the light source 18, except for the transparent resin layer, was fabricated. As regards the transparent resin layer, the three LED chips were not coated with the continuous transparent resin layer. Instead, each of the LED chips was coated with an individual independent transparent resin layer. As regards the phosphor layer, the three transparent resin films were coated with an identical continuous phosphor layer, and the same phosphor layer (7.5 mm in longitudinal dimension×3.0 mm in transverse dimension×1.5 mm in thickness) as in the light source 18 was formed.

A light source 20 was fabricated. The light source 20 was formed with the same configuration as the light source 18 and light source 19. However, the transparent resin layer was not formed between the LED and the phosphor layer.

The above three kinds of light sources and the light source 10 of Example A were evaluated in the following procedure. As shown in FIG. 43, nine measurement points A to I on a phosphor layer 84 were determined, and the luminances on the respective measurement points were measured by a two-dimensional color/luminance analyzer CA-2000 (manufactured by KONICA MINOLTA JAPAN, INC.). From the measured values of the luminance at the respective measurement points, the nonuniformity in luminance of each semiconductor light emission device was evaluated. The result is as shown in Table 12. Numerical values in the Table are luminance (Cd/m2), and numerical values in parentheses ( ) are relative values in the case in which the luminance at point E was set as 100. If the luminance at the center point E and the luminances at the surrounding points are compared, it is understood that the difference in luminance between the central part and the surrounding part in each Example is small, and that the light emitting devices of Example A and Example C have substantially uniform luminance characteristics.

TABLE 12

| | Measurement points | | | | | | | | |
|---|---|---|---|---|---|---|---|---|---|
| | A | B | C | D | E | F | G | H | I |
| Light source 10 Example A | 30715 (89) | 31059 (90) | 30369 (88) | 33131 (96) | 34511 (100) | 33476 (97) | 29334 (85) | 31060 (90) | 30025 (87) |
| Light source 18 Example C | 26961 (86) | 28529 (91) | 27275 (87) | 30723 (98) | 31350 (100) | 31037 (99) | 27275 (87) | 28529 (91) | 27275 (87) |
| Light source 19 Example C | 26926 (81) | 27591 (83) | 25596 (77) | 30915 (93) | 33242 (100) | 30583 (92) | 27258 (82) | 27257 (82) | 26594 (80) |
| Light source 20 Example C | 20324 (60) | 21001 (62) | 21340 (63) | 30824 (91) | 38873 (100) | 30819 (91) | 21679 (64) | 21339 (63) | 20662 (61) |

Example D

The kinds of inorganic fine particle powder dispersed in transparent resin layers were evaluated. The evaluation was conducted by fabricating light sources in which various kinds of inorganic fine particle powder were disposed in transparent resin layers, and by measuring the light emission efficiencies of the obtained light sources. The light emission efficiencies were measured by using an integrating sphere manufactured by Labsphere, Inc. Incidentally, in the light sources 21 to 25, the device configuration of the LEDs was identical to that of the light source 18 of Example C, except for the presence/absence of inorganic fine particle powder in the transparent resin layer. The result is shown in Table 13. Table 13 also shows the result relating to the light source 10 of Example A.

As is clear from Table 13, the light emission efficiency is excellent in the light source 10 of Example A and light sources 21 to 23 of Example D which use inorganic fine particle powder with a maximum particle size of ¼ or less of the light emission peak wavelength (405 nm) of the LED chip, compared to the light sources 24 and 25 of Example D which use inorganic fine particle powder with a maximum particle size of more than ¼ of the light emission peak wavelength (405 nm) of the LED chip. In particular, the light source 10 and light source 21, which use fumed silica with a maximum particle size of 25 µm, exhibited excellent characteristics.

TABLE 13

| | Inorganic fine particle powder | | | |
|---|---|---|---|---|
| | kind of material | Average primary particle size (µm) | Maximum particle size (µm) | Content (mass %) | Light emission efficiency (lm/W) |
| Light source 10 (Example A) | Fumed silica | 7 | 25 | 3 | 65.0 |
| Light source 21 (Example D) | Fumed silica | 7 | 25 | 3 | 67.0 |
| Light source 22 (Example D) | Colloidal silica | 48 | 79 | 3 | 64.5 |
| Light source 23 (Example D) | Fumed alumina | 30 | 77 | 3 | 65.1 |
| Light source 24 (Example D) | Colloidal silica | 101 | 125 | 3 | 52.1 |
| Light source 25 (Example D) | Pulverized alumina | 210 | 545 | 3 | 49.3 |

Example E

Finally, as regards the inorganic fine particle powder in the transparent resin layer, the optimal content was confirmed. In the evaluation, use was made of light sources in which the contents of, mainly, fumed silica that exhibits most excellent characteristics were varied. The detailed configuration of the light sources is identical to that of the light sources 21 and 23, except that the content of inorganic fine particle powder was varied. The result is as shown in Table 14. Table 14 also shows the result relating to the light source 10 of Example A. By dispersing the inorganic fine particle powder in the transparent resin layer, the light emission efficiency of the light source can be enhanced. A preferable content of inorganic fine particle powder was 0.1 mass % to 5 mass %, and a more preferable content was 1 mass % to 5 mass %.

TABLE 14

| | Material kind of inorganic fine particle powder | Content (mass %) | Light emission efficiency (lm/W) |
|---|---|---|---|
| Light source 10 (Example A) | Fumed silica | 3.0 | 65.0 |
| Light source 26 (light source 21 of Example E) | Fumed silica | 0.06 | 53.5 |
| Light source 27 (light source 23 of Example E) | Fumed alumina | 0.08 | 52.9 |
| Light source 28 (light source 21 of Example E) | Fumed silica | 1.0 | 63.9 |
| Light source 29 (light source 23 of Example E) | Fumed alumina | 1.0 | 62.7 |
| Light source 30 (light source 21 of Example E) | Fumed silica | 2.0 | 65.5 |
| Light source 31 (light source 21 of Example E) | Fumed silica | 3.5 | 66.8 |
| Light source 32 (light source 21 of Example E) | Fumed silica | 4.8 | 65.8 |
| Light source 33 (light source 21 of Example E) | Fumed silica | 6.0 | 55.9 |
| Light source 34 (light source 21 of Example E) | — | 0 | 52.5 |

Examples 3 to 7

A white light source system of the present invention, which can reproduce various correlated color temperatures, was fabricated by arbitrarily mixing lights from at least two kinds of light sources selected from among the white light sources 1 to 6 described in Table 1-2 of Example 1. This system can reproduce all chromaticity points in a hexagonal inside area formed by six light emission chromaticity points indicated by the respective light sources. Thus, over all color temperatures of 2000 K to 6500 K, the system can reproduce all correlated chromaticity points in the range of ±0.005 duv or less. In addition, the same light source as in Example 1 is used for each light source, and it is natural that the white light reproduced by this white light source system can exhibit the same characteristics as the other Examples, that is, the characteristics such as the color rendering property and light emission spectrum shape.

In Examples 3 to 7, one-day variations of sunlight in various places were reproduced by using this white light source system. The variations of the correlated color temperature and illuminance in the respective places are as shown in FIG. 22 to FIG. 26.

Example 3: one-day variations of sunlight in spring in Wakkanai (Hokkaido), Japan.

Example 4: one-day variations of sunlight in summer in Taipei, Taiwan.

Example 5: one-day variations of sunlight in summer in Los Angeles, the USA.

Example 6: one-day variations of sunlight in autumn in Sakai (Osaka), Japan.

Example 7: one-day variations of sunlight in winter in Naha (Okinawa), Japan.

In the above description, only the variations of sunlight in some places on the earth were reproduced. However, from the data stored in the system, the user may designate data of sunlight of an arbitrary season at an arbitrary place. Thereby, the variations of sunlight in such places can be well reproduced. Specifically, the light emission spectrum of the white light source of the present invention can exhibit good coincidence in the visible light region with the light emission spectrum of blackbody radiation of the same color temperature as sunlight. Moreover, the spectrum shape of the blackbody radiation is not merely reproduced, but the degree of influence, which light emission by blackbody radiation (sun) receives while reaching each place on the earth, is quantized as a deviation from the color temperature of blackbody radiation. Thus, the white light of the color temperature, with this deviation being included, was successfully reproduced. Thereby, the sunlight in an arbitrary place can be reproduced, and the reproduced light contains only ultraviolet which is much weaker than sunlight. Hence, for example, when the reproduced light is used as illumination for articles on exhibition in an art museum or the like, paintings or the like are not damaged, and the real body colors of the articles on exhibition can be reproduced with very high precision, compared to conventional light sources. Furthermore, the white light source of the present invention can serve as a light source that is kind to human bodies. This light source can radiate white light in which the intensity of the blue light emission component that is a concern due to its harmful effect on paintings and human bodies is sufficiently reduced, compared to conventional artificial light sources, and this light source can well maintain the circadian rhythms of human bodies and be good for human bodies, while being able to obtain a high color rendering effect, like sunlight.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device, comprising:
   a substrate;
   a first light emitter disposed on the substrate and configured to emit a first light having a first chromaticity point on an xy chromaticity diagram; and
   a second light emitter disposed on the substrate and configured to emit a second light having a second chromaticity point on the xy chromaticity diagram,
   wherein the first light emitter has a first converter comprising a first plurality of wavelength converters, each wavelength converter of the first converter having different half-value widths,
   wherein the second light emitter has a second converter comprising a second plurality of wavelength converters, each wavelength converter of the second converter having different peak wavelengths,
   wherein at least one of the plurality of wavelength converters of the first converter has a half-value width of 33 nm or more and 110 nm or less,
   wherein a distance between peak wavelengths of at least two wavelength converters of the second converter is 150 nm or less, and
   wherein at least one of the plurality of wavelength converters of the first converter has a particle size in a range of 5 um to 50 um, and
   wherein a thickness of the second converter is in a range of 0.07 mm to 1.5 mm.

2. The light emitting device of claim 1, wherein the first chromaticity point on the xy chromaticity diagram has a color temperature of 2000K to 6500K.

3. The light emitting device of claim 1, wherein a light combined by the first light emitter and the second light emitter is white light of a color temperature of 2000K to 6500K.

4. The light emitting device of claim 3, wherein at least one of color rendering indices R1 to R8 of the white light is 90 or more.

5. The light emitting device of claim 3, wherein at least one of special color rendering indices R9 to R15 of the white light is 90 or more.

6. The light emitting device of claim 1, wherein the first light emitter comprises a first light emitting diode configured to emit first primary light and covered by the first converter, and
   wherein the first plurality of wavelength converters has a light emission peak in a range of 420 nm to 700 nm.

7. The light emitting device of claim 1, wherein a light emission spectrum of the wavelength converters of the first converter includes at least one wavelength region where a portion of each light emission spectrum overlaps another light emission spectrum.

8. A light emitting device, comprising:
   a substrate;
   a light source disposed on the substrate;
   a cover disposed on the light source and covering the substrate; and
   a controller configured to electrically control the light source,
   wherein the light source comprises:
   a first light emitter disposed on the substrate and configured to emit a first light having a first chromaticity point on an xy chromaticity diagram; and
   a second light emitter disposed on the substrate and configured to emit a second light having a second chromaticity point on the xy chromaticity diagram,
   wherein the first light emitter has a first converter comprising a first plurality of wavelength converters, each wavelength converter of the first converter having different half-value widths,
   wherein the second light emitter has a second converter comprising a second plurality of wavelength converters, each wavelength converter of the second converter having different peak wavelengths,
   wherein at least one of the plurality of wavelength converters of the first converter has a half-value width of 33 nm or more and 110 nm or less,
   wherein a distance between peak wavelengths of at least two wavelength converters of the second converter is 150 nm or less, and
   wherein a thickness of the second converter is in a range of 0.07 mm to 1.5 mm.

9. The light emitting device of claim 8, wherein the second chromaticity point on the xy chromaticity diagram has a color temperature of 2000K to 6500K.

10. The light emitting device of claim 8, wherein a light combined by the first light emitter and the second light emitter is white light of a color temperature of 2000K to 6500K.

11. The light emitting device of claim 10, wherein at least one of color rendering indices R1 to R8 of the white light is 90 or more.

12. The light emitting device of claim 10, wherein at least one of special color rendering indices R9 to R15 of the white light is 90 or more.

13. The light emitting device of claim 8, wherein the first light emitter comprises a first light emitting diode configured to emit first primary light and covered by the first converter, and wherein the first plurality of wavelength converters has a light emission peak in a range of 420 nm to 700 nm.

14. The light emitting device of claim 8, wherein a light emission spectrum of the wavelength converters of the first converter includes at least one wavelength region where a portion of each light emission spectrum overlaps another light emission spectrum.

15. A light emitting device, comprising:
a substrate;
a light source disposed on the substrate;
a cover disposed on the light source and covering the substrate; and
a controller configured to electrically control the light source, wherein the light source comprises:
a first light emitter disposed on the substrate and configured to emit a first light having a first chromaticity point on an xy chromaticity diagram; and
a second light emitter disposed on the substrate and configured to emit a second light having a second chromaticity point on the xy chromaticity diagram,
wherein the first light emitter has a first converter comprising a first plurality of wavelength converters, each wavelength converter of the first converter having different half-value widths,
wherein the second light emitter has a second converter comprising a second plurality of wavelength converter, each wavelength converter of the second converter having different peak wavelengths,
wherein at least one of particle of the plurality of wavelength converters of the first converter has a particle size in a range of 5 um to 50 um,
wherein a distance between peak wavelengths of at least two wavelength converters of the second converter is 150 nm or less, and
wherein a thickness of the second converter is in a range of 70 um to 1500 um.

16. The light emitting device of claim 15, wherein the first chromaticity point on the xy chromaticity diagram has a color temperature of 2000K to 6500K.

17. The light emitting device of claim 15, wherein a light combined by the first light emitter and the second light emitter is white light of a color temperature of 2000K to 6500K.

18. The light emitting device of claim 17, wherein at least one of color rendering indices R1 to R8 of the white light is 90 or more.

19. The light emitting device of claim 17, wherein at least one of special color rendering indices R9 to R15 of the white light is 90 or more.

20. The light emitting device of claim 15, wherein the first light emitter comprises a first light emitting diode configured to emit first primary light and covered by the first converter, and wherein the first plurality of wavelength converters has a light emission peak in a range of 420 nm to 700 nm.

* * * * *